United States Patent
Tong et al.

(10) Patent No.: US 12,143,125 B2
(45) Date of Patent: Nov. 12, 2024

(54) POLARIZATION ENCODING METHOD AND APPARATUS

(71) Applicant: HUAWEI TECHNOLOGIES CO., LTD., Shenzhen (CN)

(72) Inventors: Jiajie Tong, Hangzhou (CN); Huazi Zhang, Hangzhou (CN); Xianbin Wang, Hangzhou (CN); Shengchen Dai, Hangzhou (CN); Rong Li, Hangzhou (CN); Jun Wang, Wang (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/170,763

(22) Filed: Feb. 17, 2023

(65) Prior Publication Data

US 2023/0208442 A1 Jun. 29, 2023

Related U.S. Application Data

(63) Continuation of application No. PCT/CN2021/111233, filed on Aug. 6, 2021.

(30) Foreign Application Priority Data

Aug. 19, 2020 (CN) .......................... 202010839880.7

(51) Int. Cl.
*H03M 13/13* (2006.01)
*H03M 13/00* (2006.01)
*H04L 1/00* (2006.01)

(52) U.S. Cl.
CPC ......... *H03M 13/13* (2013.01); *H03M 13/612* (2013.01)

(58) Field of Classification Search
CPC ........................... H03M 13/13; H03M 13/612
See application file for complete search history.

(56) References Cited

U.S. PATENT DOCUMENTS 10,812,107 B2 * 10/2020 Saber .................... H04L 1/0041
11,201,691 B2 * 12/2021 Yang .................... H03M 13/13
(Continued)

FOREIGN PATENT DOCUMENTS

| CN | 107395324 A | 11/2017 |
|----|-------------|---------|
| CN | 108574494 A | 9/2018 |

(Continued)

OTHER PUBLICATIONS

Vangala Harish et al: "A new multiple folded successive cancellation decoderfor polar codes", 2014 IEEE Information Theory Workshop (ITW 2014), Nov. 2, 2014, pp. 381-385, XP032694569.

(Continued)

*Primary Examiner* — Justin R Knapp
(74) *Attorney, Agent, or Firm* — HAUPTMAN HAM, LLP

(57) ABSTRACT

An encoding method includes obtaining to-be-encoded information and a mother code length N. The to-be-encoded information includes K information bits. The method also includes determining, based on K and N, a set I corresponding to subchannels of the information bits and a set F corresponding to subchannels of frozen bits. Information bits corresponding to subchannel sequence numbers in the set I are distributed in X outer component codes, a code length of each outer component code is B, and the X outer component codes includes a first-type outer component code and a second-type outer component code or the X outer component codes include a first-type outer component code, a second-type outer component code, and one third-type outer component code. Different types of component codes have different code rates. The method additionally includes (Continued)

performing polarization encoding based on the set I and the set F.

20 Claims, 13 Drawing Sheets

(56) References Cited

U.S. PATENT DOCUMENTS

| | | | | |
|---|---|---|---|---|
| 11,398,838 | B2* | 7/2022 | Jang | H03M 13/2906 |
| 11,418,220 | B2* | 8/2022 | Hamelin | H04L 1/0047 |

FOREIGN PATENT DOCUMENTS

| | | |
|---|---|---|
| CN | 110890894 A | 3/2020 |
| EP | 3584972 A1 | 12/2019 |

OTHER PUBLICATIONS

H. Zhang et al., "A Flip-Syndrome-List Polar Decoder Architecture for Ultra-Low-Latency Communications," in IEEE Access, vol. 7, pp. 1149-1159, 2019, doi: 10.1109/ACCESS.2018.2886464.
International Search Report issued in corresponding International Application No. PCT/CN2021/111233, Oct. 27, 2021, pp. 1-10.
Extended European Search Report issued in corresponding European Application No. 21857521.5, Jan. 2, 2024, pp. 1-11.

* cited by examiner (1)

POLARIZATION ENCODING METHOD AND APPARATUS

CROSS-REFERENCE TO RELATED APPLICATIONS

This application is a continuation of International Application No. PCT/CN2021/111233, filed on Aug. 6, 2021, which claims priority to Chinese Patent Application No. 202010839880.7, filed on Aug. 19, 2020. The disclosures of the aforementioned applications are hereby incorporated by reference in their entireties.

TECHNICAL FIELD

This application relates to the field of communications technologies, and in particular, to an encoding method and apparatus.

BACKGROUND

Communications systems usually use channel coding to improve reliability of data transmission and ensure quality of communications. Polar (polar) code is a first channel coding method that can be strictly proven to "reach" a channel capacity. Polar code is a type of linear block code, a generation matrix thereof is $G_N$, and an encoding process thereof is $x_1^N = u_1^N G_N \cdot u_1^N = (u_1, u_2, \ldots, u_N)$ is a binary row vector, and a length is N (that is, a code length). In addition, $G_N = B_N F_2^{\otimes(log_2(N))}$, where $$F_2 = \begin{bmatrix} 1 & 0 \\ 1 & 1 \end{bmatrix}$$

herein, $B_N$ is an N×N transposition matrix, for example, a transposition matrix in bit reversal order. $F_2^{\otimes(log_2(N))}$ is defined as a Kronecker (Kronecker) product of $log_2$ N matrices $F_2$, $x_1^N$ is an encoded bit (also referred to as a code word), $u_1^N$ and the generation matrix $G_N$ multiply to obtain the encoded bit, and a process of the multiplying is an encoding process. In the encoding process of the Polar code, a part of bits in $u_1^N$ are used to carry information and are referred to as information bits, and a set of indexes of the information bits is denoted as A. The other bits in $u_1^N$ are set to fixed values pre-agreed by a receiving end and a sending end and are referred to as frozen bits (or fixed bits), and a set of indexes thereof is represented by a complementary set $A^c$ of A. The frozen bit is usually set to 0. A sequence of the frozen bits may be arbitrarily set provided that the receiving end and the sending end pre-agree this. A construction process of the Polar code is a selection process of the set A and determines performance of the Polar code.

An existing Polar code decoding algorithm mainly includes a bit-by-bit successive cancellation (SC) decoding algorithm and a successive cancellation list (SCL) decoding algorithm. The SC decoding algorithm and the SCL decoding algorithm have better decoding performance in the case of a short code. However, in actual application, a quantity of decoded bits is quite large. The SC decoding algorithm and the SCL decoding algorithm can provide only serial decoding, and a decoding delay is relatively large. In an existing simplified SC/SCL decoding algorithm, outer codes are combined into a plurality of outer component codes, and parallel decoding is performed on the plurality of outer component codes, to reduce the decoding delay.

However, when a code rate of the outer component code is close to 1 or 0, parallelization is relatively easy. However, when the code rate of the outer component code is close to ½, decoding complexity is relatively high and parallelization is not easy.

SUMMARY

This application provides an encoding method and apparatus, to reduce a decoding delay and improve a decoding throughput.

According to a first aspect, this application provides an encoding method, including: obtaining to-be-encoded information and a mother code length N, where the to-be-encoded information includes K information bits, determining, based on K and N, a set I corresponding to subchannels of the information bits and a set F corresponding to subchannels of frozen bits, where the information bits corresponding to subchannel sequence numbers in I are distributed in X outer component codes, a code length of each outer component code is B, and the X outer component codes include a first-type outer component code and a second-type outer component code or the X outer component codes include a first-type outer component code, a second-type outer component code, and a third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, where LB is greater than 0 and less than HB, HB is less than or equal to 1, and K, B, N, and X are positive integers; and performing polarization encoding based on I and F.

According to the encoding method provided in the first aspect, the information bits corresponding to the subchannel sequence numbers in I are distributed in the X outer component codes, and the X outer component codes include the first-type outer component code and the second-type outer component code or the X outer component codes include the first-type outer component code, the second-type outer component code, and one third-type outer component code; the code rate of the first-type outer component code is less than or equal to LB, the code rate of the second-type outer component code is greater than or equal to the second threshold HB, and the code rate of the third-type outer component code is greater than LB and less than HB, where LB and HB are used to divide thresholds of a lower-code rate outer component code, an intermediate-code rate outer component code, and a higher-code rate outer component code. Therefore, the X outer component codes include the higher-code rate outer component code and the lower-code rate outer component code, or the X outer component codes include the higher-code rate outer component code, the lower-code rate outer component code, and one intermediate-code rate outer component code. Because there is no intermediate-code rate outer component code or there is only one intermediate-code rate outer component code, parallel decoding may be performed on the higher-code rate outer component code and the lower-code rate outer component code when decoding is performed at a decoder, thereby reducing a decoding delay and improving a decoding throughput.

There are three implementations of how to determine I based on K and N in this application. In a possible design, I is determined based on K, a first reliability sequence Q1, and a second reliability sequence Q2. A sum of lengths of Q1 and Q2 is a maximum mother code length $N_{max}$. Q1 includes sequence numbers of subchannels whose reliability is less than or equal to LB*B in $$\frac{N_{max}}{B}$$

outer component codes and sequence numbers of subchannels whose reliability is greater than or equal to HB*B in the $$\frac{N_{max}}{B}$$

outer component codes. Q2 includes sequence numbers of subchannels whose reliability is greater than LB*B and less than HB*B in the $$\frac{N_{max}}{B}$$

outer component codes. The subchannel sequence numbers in Q1 are arranged in first order according to reliability of subchannels, where the first order is descending order or ascending order. The subchannel sequence numbers in Q2 are arranged in the first order according to reliability of outer component codes, where subchannel sequence numbers belonging to one outer component code are consecutive in Q2 and are arranged in the first order according to reliability.

In a possible design, Q1 and Q2 may be determined based on Q, B, LB, and HB, where Q is a reliability sequence of subchannels corresponding to $N_{max}$, and Q may be obtained through Gaussian approximation, density evolution, a polar weight, or another method.

Alternatively, Q1 and Q2 may be preconfigured.

In a possible design, LB and HB may be predefined, that is, known to a transmit end and a receive end, or B, LB, and HB may be indicated through indication information. The indication information may be signaling.

When I is determined based on K, the first reliability sequence Q1, and the second reliability sequence Q2, in a possible design, the subchannel sequence numbers in I are at least one subchannel sequence number in Q1. Alternatively, the subchannel sequence numbers in I are at least one subchannel sequence number in Q1 and at least one subchannel sequence number in Q2. Alternatively, the subchannel sequence numbers in I are at least one subchannel sequence number in Q1 and at least one group of subchannel sequence numbers in Q2, and a quantity of subchannel sequence numbers included in one group of subchannel sequence numbers is BM, where BM is a quantity of subchannels belonging to an intermediate code rate in one outer component code.

In a possible design, when I is determined based on K, Q1, and Q2, reliability of one subchannel with highest reliability in Q1 is sequentially compared with reliability of one subchannel with highest reliability in Q2, and a sequence number of one subchannel currently with highest reliability in Q1 and Q2 is determined as an element in I, until a quantity of elements in I is K.

Q1 includes the sequence numbers of subchannels whose reliability is less than or equal to LB*B in the $$\frac{N_{max}}{B}$$

outer component codes and the sequence numbers of subchannels whose reliability is greater than or equal to HB*B in the $$\frac{N_{max}}{B}$$

outer component codes, and Q2 includes the sequence numbers of subchannels whose reliability is greater than LB*B and less than HB*B in the $$\frac{N_{max}}{B}$$

outer component codes. Subchannels, in lower-code rate outer component codes corresponding to Q, divided into Q2, are all subchannels of frozen bits, and subchannels, in higher-code rate outer component codes corresponding to Q, divided into Q2, are all subchannels of information bits. One subchannel sequence number with highest reliability in Q1 or Q2 is determined as an element in I at a time. The information bits corresponding to the subchannel sequence numbers in I are distributed in the X outer component codes. In the X outer component codes, subchannel sequence numbers in a same outer component code are either all information bits (that is, with a higher code rate) or all frozen bits (that is, with a lower code rate). Some subchannel sequence numbers in one outer component code are information bits, and other subchannel sequence numbers are frozen bits. This outer component code is an intermediate-code rate outer component code. Therefore, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

Alternatively, reliability W1 of one subchannel with highest reliability in Q1 is sequentially compared with average reliability W2 of BM subchannels with highest reliability in Q2, a sequence number of one subchannel currently with highest reliability in Q1 is determined as an element in I when W1 is greater than W2, or, sequence numbers of BM subchannels currently with highest reliability in Q2 are determined as elements in I when W1 is not greater than W2, and a sequence number of at least one subchannel with highest reliability in Q1 is determined as an element in I when a quantity K' of determined subchannel sequence numbers in I satisfies that K−K' is less than BM, until a quantity of elements in I is K. In this manner, one subchannel sequence number in Q1 is determined as an element in I at a time, and one group of subchannel sequence numbers (of which a quantity is BM) in Q2 are determined as elements in I at a time. In addition, one subchannel sequence number with highest reliability in Q1 or one group of subchannel sequence numbers (of which a quantity is BM) with highest reliability in Q2 are determined at a time.

Therefore, the information bits corresponding to the subchannel sequence numbers in I determined in this manner are distributed in the X outer component codes. In the X outer component codes, subchannel sequence numbers in a same outer component code are either all information bits (that is, with a higher code rate) or all frozen bits (that is, with a lower code rate), and there is no intermediate code rate. Therefore, the X outer component codes include the first-type outer component code (namely, lower-code rate outer component code) and the second-type outer component code (namely, higher-code rate outer component code), and there is no intermediate-code rate outer component code.

In a possible design, I is determined based on K and Q3, and Q3 is determined based on N, Q1, and Q2, or Q3 is preconfigured.

In a possible design, Q3 is constituted by subchannel sequence numbers less than or equal to N or subchannel sequence numbers less than N in Q1 and Q2, and the subchannel sequence numbers in Q1 and Q2 are arranged in descending order or ascending order of reliability in Q3.

In a possible design, Q2 includes P subsequences $Q2_1$, $Q2_2$, ..., and $Q2_p$, P is a positive integer, and I is determined based on K, Q1, $Q2_1$, $Q2_2$, ..., and $Q2_p$.

When I is determined based on K, Q1, $Q2_1$, $Q2_2$, ..., and $Q2_p$, in a possible design, the subchannel sequence numbers in I are at least one subchannel sequence number in Q1; the subchannel sequence numbers in I are at least one subchannel sequence number in Q1 and at least one subchannel sequence number in at least one subsequence of $Q2_1$, $Q2_2$, ..., and $Q2_p$; or the subchannel sequence numbers in I are at least one subchannel sequence number in Q1 and at least one group of subchannel sequence numbers in at least one subsequence of $Q2_1$, $Q2_2$, ..., and $Q2_p$, and a quantity of subchannel sequence numbers included in one group of subchannel sequence numbers is Bi, where Bi=BM/P, and BM is a quantity of subchannels belonging to an intermediate-code rate in one outer component code.

In a possible design, when I is determined based on K, $Q_1$, $Q2_1$, $Q2_2$, ..., and $Q2_p$, reliability of one subchannel with highest reliability in Q1 is sequentially compared with reliability of one subchannel with highest reliability in $Q2_i$ (i=1, 2, ..., P), and a sequence number of one subchannel currently with highest reliability in Q1 and $Q2_i$ (i=1, 2, ..., P) is determined as an element in I, until a quantity of elements in I is K.

Q1 includes the sequence numbers of subchannels whose reliability is less than or equal to LB*B in the $$\frac{N_{max}}{B}$$

outer component codes and the sequence numbers of subchannels whose reliability is greater than or equal to HB*B in the $$\frac{N_{max}}{B}$$

outer component codes, and $Q2_i$ includes the sequence numbers of subchannels whose reliability is greater than LB*B and less than HB*B in the $$\frac{N_{max}}{B}$$

outer component codes. Subchannels, in lower-code rate outer component codes corresponding to Q, divided into $Q2_1$, are all subchannels of frozen bits, and subchannels, in higher-code rate outer component codes corresponding to Q, divided into $Q2_1$, are all subchannels of information bits. One subchannel sequence number with highest reliability in Q1 or $Q2_1$ is determined as an element in I at a time, and the information bits corresponding to the subchannel sequence numbers in I are distributed in the X outer component codes. In the X outer component codes, subchannel sequence numbers in a same outer component code are either all information bits (that is, with a higher code rate) or all frozen bits (that is, with a lower code rate). Some subchannel sequence numbers in one outer component code are information bits, and other subchannel sequence numbers are frozen bits. This outer component code is an intermediate-code rate outer component code. Therefore, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

Alternatively, reliability W1 of one subchannel with highest reliability in Q1 is sequentially compared with average reliability $W2_i$ (i=1, 2, ..., P) of Bi subchannels with highest reliability in $Q2_i$ (i=1, 2, ..., P), a sequence number of one subchannel currently with highest reliability in Q1 is determined as an element in I when W1 is greater than a maximum value of $W2_i$, or, when W1 is not greater than a maximum value of $W2_i$, sequence numbers of Bi subchannels that are currently with highest reliability in $Q2_i$ and that are corresponding to the maximum value of $W2_i$ are determined as elements in I, and a sequence number of at least one subchannel with highest reliability in Q1 is determined as an element in I when a quantity K' of determined subchannel sequence numbers in I satisfies that K−K' is less than Bi, until a quantity of elements in I is K. The information bits corresponding to the subchannel sequence numbers in I determined in this manner are distributed in the X outer component codes. In the X outer component codes, subchannel sequence numbers in a same outer component code are either all information bits (that is, with a higher code rate) or all frozen bits (that is, with a lower code rate), and there is no intermediate code rate. Therefore, the X outer component codes include the first-type outer component code (namely, lower-code rate outer component code) and the second-type outer component code (namely, higher-code rate outer component code), and there is no intermediate-code rate outer component code.

In a possible design, I is determined based on K and Q3, and Q3 is determined based on N, Q1, $Q2_1$, $Q2_2$, ..., and $Q2_p$, or Q3 is preconfigured.

In a possible design, Q3 is constituted by subchannel sequence numbers less than or equal to N or subchannel sequence numbers less than N in Q1, $Q2_1$, $Q2_2$, ..., and $Q2_p$, and the subchannel sequence numbers in Q1, $Q2_1$, $Q2_2$, ..., and $Q2_p$ are arranged in descending order or ascending order of reliability in Q3. It may be understood that, if sorting starts from 0 in the reliability sequence Q, Q3 is constituted by the subchannel sequence numbers less than N in Q1 and Q2; if sorting starts from 1 in the reliability sequence, Q3 is constituted by the subchannel sequence numbers less than or equal to N in Q1 and Q2.

In a possible design, the elements in I are the K subchannel sequence numbers with highest reliability in Q3.

According to the encoding method provided in this implementation, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

In a possible design, the reliability of the outer component code is reliability of a subchannel with lowest reliability or highest reliability in the outer component code; the reliability of the outer component code is reliability of a $j^{th}$ subchannel in the outer component code, 1<j<m, and m is a total quantity of sequence numbers of subchannels included in the outer component code; or the reliability of the outer component code is average reliability of all subchannels or a sum of reliability of all subchannels in the outer component code.

In a possible design, I and F are determined based on N, K, B, LB*B, and HB*B by using a code rate allocation method.

In a possible design, the code rate allocation method includes performing code rate allocation on the outer component codes level by level based on a target code rate R and a code rate allocation condition until a code rate of an outer component code whose code length is 1 is determined, where $$R = \frac{K}{N},$$

the code rate allocation condition is $2*R_x = R_{x-} + R_{x+}$, $R_x$ is a code rate of an outer component code of a current level, $R_{x-}$ is a lower code rate in code rates of two outer component codes of a next level, and $R_{x+}$ is a higher code rate in the code rates of the two outer component codes of the next level; when code rate allocation is performed on two outer component codes from an $(n+1)^{th}$ level to an $n^{th}$ level, $R_x = R$, and $n = \log_2(N)$.

When code rate allocation is performed on outer component codes from a $(\log_2(B)+1)^{th}$ level to a $(\log_2(B))^{th}$ level, $R_x$ and $R_{x-}$ further satisfy a first condition while satisfying the code rate allocation condition, where the first condition is any one of the following:

$0 \leq R_{x-} \leq R_{x+} \leq LB$;
$0 \leq R_{x-} \leq LB < HB \leq R_{x+} \leq 1$; or
$HB \leq R_{x-} \leq R_{x+} \leq 1$.

According to the encoding method provided in this implementation, LB is a threshold of a lower code rate, HB is a threshold of a higher code rate, and a code rate between LB and HB is an intermediate code rate. When code rate allocation is performed on the outer component codes from the $(\log_2(B)+1)^{th}$ level to the $(\log_2(B))^{th}$ level, code rates of the outer component codes of the $(\log_2(B))^{th}$ level include $R_x$ and $R_{x-}$. When $0 \leq R_{x-} \leq R_{x+} \leq LB$, that is, $R_{x-}$ is greater than or equal to 0 and less than or equal to LB, $R_x$ is greater than or equal to 0 and less than or equal to LB, and $R_{x-}$ is less than or equal to $R_{x+}$, when the code rate is 0, $R_{x-}$ may be equal to $R_{x+}$, so that the code rates of the outer component codes of the $(\log_2(B))^{th}$ level may be all lower code rates. When $HB \leq R_{x-} \leq R_{x+} \leq 1$, that is, $R_{x-}$ is greater than or equal to HB and less than or equal to 1, $R_x$ is greater than or equal to HB and less than or equal to 1, and $R_{x-}$ is less than or equal to $R_{x+}$, when the code rate is 1, $R_-$ may be equal to $R_+$, so that the code rates of the outer component codes of the $(\log_2(B))^{th}$ level may be all higher code rates. When $0 \leq R_{x-} \leq LB < HB \leq R_{x+} \leq 1$, that is, $R_{x-}$ is greater than or equal to 0 and less than or equal to LB, $R_x$ is greater than or equal to HB and less than or equal to 1, and LB is less than HB, the code rates of the outer component codes of the $(\log_2(B))^{th}$ level may be enabled to include a higher code rate and a lower code rate, and there is no intermediate code rate. B is a code length of the outer component code. Therefore, the information bits corresponding to the subchannel sequence numbers determined in Manner 3 in I are distributed in the X outer component codes. The X outer component codes include the first-type outer component code (namely, lower-code rate outer component code) and the second-type outer component code (namely, higher-code rate outer component code), that is, there is no intermediate-code rate outer component code.

In a possible design, the performing code rate allocation on the outer component codes level by level based on a target code rate R and a code rate allocation condition may be: performing code rate allocation on the two outer component codes from the $(n+1)^{th}$ level to the $n*h$ level based on R and the code rate allocation condition; and performing code rate allocation on outer component codes from an $s^{th}$ level to an $(s-1)^{th}$ level based on a code rate of the outer component code of the $s^{th}$ level and the code rate allocation condition until a code rate of an outer component code whose code length is 1 is determined, where s is greater than or equal to 2 and less than or equal to n.

In a possible design, I and F are determined based on a code rate of a determined outer component code whose code length is 1.

In this implementation, I and F are determined based on the determined outer component code whose code length is 1. The code rate of the outer component code whose code length is 1 may be only 0 or 1. The code rate of the outer component code whose code length is 1 is determined. If the code rate is 0, a corresponding outer component code is a frozen bit, or if the code rate is 1, a corresponding outer component code is an information bit. In this way, I and F are determined accordingly.

According to a third aspect, this application provides an encoding method, including: obtaining to-be-encoded information and a mother code length N, where the to-be-encoded information includes K information bits, determining, based on K and N, a set I corresponding to subchannels of the information bits and a set F corresponding to subchannels of frozen bits, where the information bits corresponding to subchannel sequence numbers in I are distributed in X outer component codes, and the X outer component codes include a first-type outer component code and a second-type outer component code, or the X outer component codes include a first-type outer component code, a second-type outer component code, and one third-type outer component code; and a quantity m of subchannel sequence numbers of information bits in the first-type outer component code is less than or equal to a first threshold KL, m in the second-type outer component code is greater than or equal to a second threshold KH, and m in the third-type outer component code is greater than KL and less than KH, where KL+1<KH, KH is less than or equal to a length B of the outer component code, and K, N, X, m, KL, KH, and B are positive integers; and performing polarization encoding based on I and F.

According to the encoding method provided in the third aspect, after the to-be-encoded information including the K information bits and the mother code length N are obtained, the set I corresponding to the subchannels of the information bits and the set F corresponding to the subchannels of the frozen bits are determined based on K and N, the information bits corresponding to the subchannel sequence numbers in I are distributed in the X outer component codes, and the X outer component codes include the first-type outer component code and the second-type outer component code or the X outer component codes include the first-type outer component code, the second-type outer component code, and one third-type outer component code; the quantity m of subchannel sequence numbers of information bits in the first-type outer component code is less than or equal to KL, m in the second-type outer component code is greater than or equal to the second threshold KH, and m in the third-type outer component code is greater than KL and less than KH, where KL and KH are used to divide thresholds of a lower-code rate outer component code, an intermediate-code rate outer component code, and a higher-code rate outer component code. Therefore, the X outer component codes include the higher-code rate outer component code and the lower-code rate outer component code, or the X outer component codes include the higher-code rate outer component code, the lower-code rate outer component code, and one intermediate-code rate outer component code. Because there is no intermediate-code rate outer component code or there is only one intermediate-code rate outer component code, parallel decoding may be performed on the higher-code rate outer component code and the lower-code rate outer component code when decoding is performed at a decoder, thereby reducing a decoding delay and improving a decoding throughput.

There are three implementations of how to determine I based on K and N in this application. In a possible design, I is determined based on K, a first reliability sequence Q1, and a second reliability sequence Q2. A sum of lengths of Q1 and Q2 is a maximum mother code length $N_{max}$. Q1 includes sequence numbers of subchannels whose reliability is less than or equal to KL in $$\frac{N_{max}}{B}$$

outer component codes and sequence numbers of subchannels whose reliability is greater than or equal to KH in the $$\frac{N_{max}}{B}$$

outer component codes. Q2 includes sequence numbers of subchannels whose reliability is greater than KL and less than KH in the $$\frac{N_{max}}{B}$$

outer component codes. The subchannel sequence numbers in Q1 are arranged in first order according to reliability of subchannels, where the first order is descending order or ascending order. The subchannel sequence numbers in Q2 are arranged in the first order according to reliability of outer component codes, where subchannel sequence numbers belonging to one outer component code are consecutive in Q2 and are arranged in the first order according to reliability.

In a possible design, Q1 and Q2 may be determined based on Q, B, KL, and KH, where Q is a reliability sequence of subchannels corresponding to $N_{max}$, and Q may be obtained through Gaussian approximation, density evolution, a polar weight, or another method.

Alternatively, Q1 and Q2 may be preconfigured.

In a possible design, B, KL, and KH are predefined, that is, known to a transmit end and a receive end.

Alternatively, B, LB, and HB are indicated through indication information. The indication information may be signaling.

When I is determined based on K, the first reliability sequence Q1, and the second reliability sequence Q2, in a possible design, the subchannel sequence numbers in I are at least one subchannel sequence number in Q1. Alternatively, the subchannel sequence numbers in I are at least one subchannel sequence number in Q1 and at least one subchannel sequence number in Q2. Alternatively, the subchannel sequence numbers in I are at least one subchannel sequence number in Q1 and at least one group of subchannel sequence numbers in Q2, and a quantity of subchannel sequence numbers included in one group of subchannel sequence numbers is BM, where BM is a quantity of subchannels belonging to an intermediate code rate in one outer component code.

In a possible design, when I is determined based on K, Q1, and Q2, reliability of one subchannel with highest reliability in Q1 is sequentially compared with reliability of one subchannel with highest reliability in Q2, and a sequence number of one subchannel currently with highest reliability in Q1 and Q2 is determined as an element in I, until a quantity of elements in I is K.

Q1 includes the sequence numbers of subchannels whose reliability is less than or equal to LB*B in the $$\frac{N_{max}}{B}$$

outer component codes and the sequence numbers of subchannels whose reliability is greater than or equal to HB*B in the $$\frac{N_{max}}{B}$$

outer component codes, and Q2 includes the sequence numbers of subchannels whose reliability is greater than LB*B and less than HB*B in the $$\frac{N_{max}}{B}$$

outer component codes. Subchannels, in lower-code rate outer component codes corresponding to Q, divided into Q2, are all subchannels of frozen bits, and subchannels, in higher-code rate outer component codes corresponding to Q, divided into Q2, are all subchannels of information bits. One subchannel sequence number with highest reliability in Q1 or Q2 is determined as an element in I at a time. The information bits corresponding to the subchannel sequence numbers in I are distributed in the X outer component codes. In the X outer component codes, subchannel sequence numbers in a same outer component code are either all information bits (that is, with a higher code rate) or all frozen bits (that is, with a lower code rate). Some subchannel sequence numbers in one outer component code are information bits, and other subchannel sequence numbers are frozen bits. This outer component code is an intermediate-code rate outer component code. Therefore, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

Alternatively, reliability W1 of one subchannel with highest reliability in Q1 is sequentially compared with average reliability W2 of BM subchannels with highest reliability in Q2, a sequence number of one subchannel currently with highest reliability in Q1 is determined as an element in I when W1 is greater than W2, or, sequence numbers of BM subchannels currently with highest reliability in Q2 are determined as elements in I when W1 is not greater than W2, and a sequence number of at least one subchannel with highest reliability in Q1 is determined as an element in I when a quantity K' of determined subchannel sequence numbers in I satisfies that K-K' is less than BM, until a quantity of elements in I is K. Therefore, the information bits corresponding to the subchannel sequence numbers in I determined in this manner are distributed in the X outer component codes. In the X outer component codes, subchannel sequence numbers in a same outer component code are either all information bits (that is, with a higher code rate) or all frozen bits (that is, with a lower code rate), and there is no intermediate code rate. Therefore, the X outer component codes include the first-type outer component code (namely, lower-code rate outer component code) and the second-type outer component code (namely, higher-code rate outer component code), and there is no intermediate-code rate outer component code.

In a possible design, I is determined based on K and Q3, and Q3 is determined based on N, Q1, and Q2, or Q3 is preconfigured.

In a possible design, Q3 is constituted by subchannel sequence numbers less than or equal to N or subchannel sequence numbers less than N in Q1 and Q2, and the subchannel sequence numbers in Q1 and Q2 are arranged in descending order or ascending order of reliability in Q3.

In a possible design, Q2 includes P subsequences $Q2_1$, $Q2_2$, ..., and $Q2_p$, P is a positive integer, and I is determined based on K, Q1, $Q2_1$, $Q2_2$, ..., and $Q2_p$.

When I is determined based on K, Q1, $Q2_1$, $Q2_2$, ..., and $Q2_p$, in a possible design, the subchannel sequence numbers in I are at least one subchannel sequence number in Q1; the subchannel sequence numbers in I are at least one subchannel sequence number in Q1 and at least one subchannel sequence number in at least one subsequence of $Q2_1$, $Q2_2$, ..., and $Q2_p$; or the subchannel sequence numbers in I are at least one subchannel sequence number in Q1 and at least one group of subchannel sequence numbers in at least one subsequence of $Q2_1$, $Q2_2$, ..., and $Q2_p$, and a quantity of subchannel sequence numbers included in one group of subchannel sequence numbers is Bi, where Bi=BM/P, and BM is a quantity of subchannels belonging to an intermediate-code rate in one outer component code.

In a possible design, when I is determined based on K, $Q_1$, $Q2_1$, $Q2_2$, ..., and $Q2_p$, reliability of one subchannel with highest reliability in Q1 is sequentially compared with reliability of one subchannel with highest reliability in $Q2_i$ (i=1, 2, ..., P), and a sequence number of one subchannel currently with highest reliability in Q1 and $Q2_i$ (i=1, 2, ..., P) is determined as an element in I, until a quantity of elements in I is K.

Q1 includes the sequence numbers of subchannels whose reliability is less than or equal to LB*B in the $$\frac{N_{max}}{B}$$

outer component codes and the sequence numbers of subchannels whose reliability is greater than or equal to HB*B in the $$\frac{N_{max}}{B}$$

outer component codes, and $Q2_i$ includes the sequence numbers of subchannels whose reliability is greater than LB*B and less than HB*B in the $$\frac{N_{max}}{B}$$

outer component codes. Subchannels, in lower-code rate outer component codes corresponding to Q, divided into $Q2_1$, are all subchannels of frozen bits, and subchannels, in higher-code rate outer component codes corresponding to Q, divided into $Q2_1$, are all subchannels of information bits. One subchannel sequence number with highest reliability in Q1 or $Q2_1$ is determined as an element in I at a time, and the information bits corresponding to the subchannel sequence numbers in I are distributed in the X outer component codes. In the X outer component codes, subchannel sequence numbers in a same outer component code are either all information bits (that is, with a higher code rate) or all frozen bits (that is, with a lower code rate). Some subchannel sequence numbers in one outer component code are information bits, and other subchannel sequence numbers are frozen bits. This outer component code is an intermediate-code rate outer component code. Therefore, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

Alternatively, reliability W1 of one subchannel with highest reliability in Q1 is sequentially compared with average reliability $W2_i$ (i=1, 2, ..., P) of Bi subchannels with highest reliability in $Q2_i$ (i=1, 2, ..., P), a sequence number of one subchannel currently with highest reliability in Q1 is determined as an element in I when W1 is greater than a maximum value of $W2_i$, or, when W1 is not greater than a maximum value of $W2_i$, sequence numbers of Bi subchannels that are currently with highest reliability in $Q2_i$ and that are corresponding to the maximum value of W21 are determined as elements in I, and a sequence number of at least one subchannel with highest reliability in Q1 is determined as an element in I when a quantity K' of determined subchannel sequence numbers in I satisfies that K−K' is less than Bi, until a quantity of elements in I is K. The information bits corresponding to the subchannel sequence numbers in I determined in this manner are distributed in the X outer component codes. In the X outer component codes, subchannel sequence numbers in a same outer component code are either all information bits (that is, with a higher code rate) or all frozen bits (that is, with a lower code rate), and there is no intermediate code rate. Therefore, the X outer component codes include the first-type outer component code (namely, lower-code rate outer component code) and the second-type outer component code (namely, higher-code rate outer component code), and there is no intermediate-code rate outer component code.

In a possible design, I is determined based on K and Q3, and Q3 is determined based on N, Q1, $Q2_1$, $Q2_2$, ..., and $Q2_p$, or Q3 is preconfigured.

In a possible design, Q3 is constituted by subchannel sequence numbers less than or equal to N or subchannel sequence numbers less than N in Q1, $Q2_1$, $Q2_2$, ..., and $Q2_p$, and the subchannel sequence numbers in Q1, $Q2_1$, $Q2_2$, ..., and $Q2_p$ are arranged in descending order or ascending order of reliability in Q3. It may be understood that, if sorting starts from 0 in the reliability sequence Q, Q3 is constituted by the subchannel sequence numbers less than N in Q1 and Q2; if sorting starts from 1 in the reliability sequence, Q3 is constituted by the subchannel sequence numbers less than or equal to N in Q1 and Q2.

In a possible design, the elements in I are the K subchannel sequence numbers with highest reliability in Q3.

According to the encoding method provided in this implementation, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

In a possible design, the reliability of the outer component code is reliability of a subchannel with lowest reliability or highest reliability in the outer component code.

Alternatively, the reliability of the outer component code is reliability of a $j^{th}$ subchannel in the outer component code, 1<j<m, and m is a total quantity of sequence numbers of subchannels included in the outer component code.

Alternatively, the reliability of the outer component code is average reliability of all subchannels or a sum of reliability of all subchannels in the outer component code.

In a possible design, I and F are determined based on N, K, B, KL, and KH by using a rate allocation method.

In a possible design, the code rate allocation method includes performing code rate allocation on the outer component codes level by level based on a target code rate R and a code rate allocation condition until a code rate of an outer component code whose code length is 1 is determined, where $$R = \frac{K}{N},$$

the code rate allocation condition is $2*R_x=R_{x-}+R_{x+}$, $R_x$ is a code rate of an outer component code of a current level, $R_{x-}$ is a lower code rate in code rates of two outer component codes of a next level, and $R_{x+}$ is a higher code rate in the code rates of the two outer component codes of the next level; when code rate allocation is performed on two outer component codes from an $(n+1)^{th}$ level to an $n^{th}$ level, $R_x=R$, and $n=\log_2(N)$.

When code rate allocation is performed on outer component codes from a $(\log_2(B)+1)^{th}$ level to a $(\log_2(B))^{th}$ level, $R_x$ and $R_{x-}$ further satisfy a first condition while satisfying the code rate allocation condition, where the first condition is any one of the following:

$$0 \leq R_{x-} \leq R_{x+} \leq \frac{KL}{B};$$

$$0 \leq R_{x-} \leq \frac{KL}{B} < \frac{KH}{B} \leq R_{x+} \leq 1; \text{ or}$$

$$\frac{KH}{B} \leq R_{x-} \leq R_{x+} \leq 1.$$

According to the encoding method provided in this implementation, $$\frac{KL}{B}$$

is a threshold of a lower code rate, $$\frac{KH}{B}$$

is a threshold of a higher code rate, and a code rate between $$\frac{KL}{B} \text{ and } \frac{KH}{B}$$

is an intermediate code rate. When code rate allocation is performed on the outer component codes from the $(\log_2(B)+1)^{th}$ level to the $(\log_2(B))^{th}$ level, code rates of the outer component codes of the $(\log_2(B))^{th}$ level include $R_{x+}$ and $R_{x-}$. When $$0 \le R_{x-} \le R_{x+} \le \frac{KL}{B},$$

that is, $R_{x-}$ is greater than or equal to 0 and less than or equal to $$\frac{KL}{B},$$

$R_{x+}$ is greater than or equal to 0 and less than or equal to $$\frac{KL}{B},$$

and $R_{x-}$ is less than or equal to $R_{x+}$, when the code rate is 0, $R_{x-}$ may be equal to $R_{x+}$, so that the code rates of the outer component codes of the $(\log_2(B))^{th}$ level may be all lower code rates. When $$\frac{KH}{B} \le R_{K-} \le R_{x+} \le 1,$$

that is, $R_{x-}$ is greater than or equal to $$\frac{KH}{B}$$

and less than or equal to 1, $R_{x+}$ is greater than or equal to $$\frac{KH}{B}$$

and less than or equal to 1, and $R_{x-}$ is less than or equal to $R_{x+}$, when the code rate is 1, $R_-$ may be equal to $R_+$, so that the code rates of the outer component codes of the $(\log_2(B))^{th}$ level may be all higher code rates. When $$0 \le R_{x-} \le \frac{KL}{B} < \frac{KH}{B} \le R_{x+} \le 1,$$

that is, $R_{x-}$ is greater than or equal to 0 and less than or equal to $$\frac{KL}{B},$$

$R_{x+}$ is greater than or equal to $$\frac{KH}{B}$$

and less than or equal to 1, and LB is less than $$\frac{KH}{B},$$

the code rates of the outer component codes of the $(\log_2(B))^{th}$ level may be enabled to include a higher code rate and a lower code rate, and there is no intermediate code rate. B is a code length of the outer component code. Therefore, the information bits corresponding to the subchannel sequence numbers in I determined in this manner are distributed in the X outer component codes. The X outer component codes include the first-type outer component code (namely, lower-code rate outer component code) and the second-type outer component code (namely, higher-code rate outer component code), that is, there is no intermediate-code rate outer component code.

In a possible design, the performing code rate allocation on the outer component codes level by level based on a target code rate R and a code rate allocation condition includes: performing code rate allocation on the two outer component codes from the $(n+1)^{th}$ level to the $n^{th}$ level based on R and the code rate allocation condition; and performing code rate allocation on outer component codes from an $s^{th}$ level to an $(s-1)^{th}$ level based on a code rate of the outer component code of the $s^{th}$ level and the code rate allocation condition until a code rate of an outer component code whose code length is 1 is determined, where s is greater than or equal to 2 and less than or equal to n.

In a possible design, I and F are determined based on a code rate of a determined outer component code whose code length is 1.

In this implementation, I and F are determined based on the determined outer component code whose code length is 1. The code rate of the outer component code whose code length is 1 may be only 0 or 1. The code rate of the outer component code whose code length is 1 is determined. If the code rate is 0, a corresponding outer component code is a frozen bit, or if the code rate is 1, a corresponding outer component code is an information bit. In this way, I and F are determined accordingly.

According to a fourth aspect, this application provides an encoding apparatus, including an obtaining module, a determining module, and an encoding module.

The obtaining module is configured to obtain to-be-encoded information and a mother code length N, where the to-be-encoded information includes K information bits. The determining module is configured to determine, based on K and N, a set I corresponding to subchannels of the information bits and a set F corresponding to subchannels of frozen bits, where the information bits corresponding to subchannel sequence numbers in I are distributed in X outer component codes, and the X outer component codes include a first-type outer component code and a second-type outer component code, or the X outer component codes include a first-type outer component code, a second-type outer component code, and one third-type outer component code; and a quantity m of subchannel sequence numbers of information bits in the first-type outer component code is less than or equal to a first threshold KL, m in the second-type outer component code is greater than or equal to a second threshold KH, and m in the third-type outer component code is greater than KL and less than KH, where KL+1<KH, KH is less than or equal to a length B of the outer component code, and K, N, X, m, KL, KH, and B are positive integers. The encoding module is configured to perform polarization encoding based on I and F.

In a possible design, I is determined based on K, a first reliability sequence Q1, and a second reliability sequence Q2.

A sum of lengths of Q1 and Q2 is a maximum mother code length $N_{max}$. Q1 includes sequence numbers of subchannels whose reliability is less than or equal to KL in $$\frac{N_{max}}{B}$$

outer component codes and sequence numbers of subchannels whose reliability is greater than or equal to KH in the $$\frac{N_{max}}{B}$$

outer component codes. Q2 includes sequence numbers of subchannels whose reliability is greater than KL and less than KH in the $$\frac{N_{max}}{B}$$

outer component codes. The subchannel sequence numbers in Q1 are arranged in first order according to reliability of subchannels, where the first order is descending order or ascending order. The subchannel sequence numbers in Q2 are arranged in the first order according to reliability of outer component codes, where subchannel sequence numbers belonging to one outer component code are consecutive in Q2 and are arranged in the first order according to reliability.

In a possible design, Q1 and Q2 are determined based on Q, B, KL, and KH, where Q is a reliability sequence of subchannels corresponding to $N_{max}$.

Alternatively, Q1 and Q2 are preconfigured.

In a possible design, B, KL, and KH are predefined; or B, LB, and HB are indicated through indication information.

In a possible design, the subchannel sequence numbers in I are at least one subchannel sequence number in Q1. Alternatively, the subchannel sequence numbers in I are at least one subchannel sequence number in Q1 and at least one subchannel sequence number in Q2. Alternatively, the subchannel sequence numbers in I are at least one subchannel sequence number in Q1 and at least one group of subchannel sequence numbers in Q2, and a quantity of subchannel sequence numbers included in one group of subchannel sequence numbers is BM, where BM is a quantity of subchannels belonging to an intermediate code rate in one outer component code.

In a possible design, the determining module is configured to: when determining I based on K, Q1, and Q2, sequentially compare reliability of one subchannel with highest reliability in Q1 with reliability of one subchannel with highest reliability in Q2, and determine a sequence number of one subchannel currently with highest reliability in Q1 and Q2 as an element in I, until a quantity of elements in I is K; or sequentially compare reliability W1 of one subchannel with highest reliability in Q1 with average reliability W2 of BM subchannels with highest reliability in Q2, determine a sequence number of one subchannel currently with highest reliability in Q1 as an element in I when W1 is greater than W2, or determine sequence numbers of BM subchannels currently with highest reliability in Q2 as elements in I when W1 is not greater than W2, and determine a sequence number of at least one subchannel with highest reliability in Q1 as an element in I when a quantity K' of determined subchannel sequence numbers in I satisfies that K–K' is less than BM, until a quantity of elements in I is K.

In a possible design, I is determined based on K and Q3, and Q3 is determined based on N, Q1, and Q2, or Q3 is preconfigured.

In a possible design, Q3 is constituted by subchannel sequence numbers less than or equal to N or subchannel sequence numbers less than N in Q1 and Q2, and the subchannel sequence numbers in Q1 and Q2 are arranged in descending order or ascending order of reliability in Q3.

In a possible design, Q2 includes P subsequences $Q2_1$, $Q2_2$, ..., and $Q2_p$, P is a positive integer, and I is determined based on K, Q1, $Q2_1$, $Q2_2$, ..., and $Q2_p$.

In a possible design, the subchannel sequence numbers in I are at least one subchannel sequence number in Q1; the subchannel sequence numbers in I are at least one subchannel sequence number in Q1 and at least one subchannel sequence number in at least one subsequence of $Q2_1$, $Q2_2$, ..., and $Q2_p$; or the subchannel sequence numbers in I are at least one subchannel sequence number in Q1 and at least one group of subchannel sequence numbers in at least one subsequence of $Q2_1$, $Q2_2$, ..., and $Q2_p$, and a quantity of subchannel sequence numbers included in one group of subchannel sequence numbers is Bi, where Bi=BM/P, and BM is a quantity of subchannels belonging to an intermediate-code rate in one outer component code.

In a possible design, the determining module is configured to: when determining I based on K, $Q_1$, $Q2_1$, $Q2_2$, ..., and $Q2_p$, sequentially compare reliability of one subchannel with highest reliability in Q1 with reliability of one subchannel with highest reliability in $Q2_i$ (i=1, 2, ..., P), and determine a sequence number of one subchannel currently with highest reliability in Q1 and $Q2_i$ (i=1, 2, ..., P) as an element in I, until a quantity of elements in I is K.

sequentially compare reliability W1 of one subchannel with highest reliability in Q1 with average reliability $W2_i$ (i=1, 2, ..., P) of Bi subchannels with highest reliability in $Q2_i$ (i=1, 2, ..., P), determine a sequence number of one subchannel currently with highest reliability in Q1 as an element in I when W1 is greater than a maximum value of $W2_i$, or, determine, when W1 is not greater than a maximum value of W21, sequence numbers of Bi subchannels that are currently with highest reliability in $Q2_i$ and that are corresponding to the maximum value of $W2_i$ as elements in I, and determine a sequence number of at least one subchannel with highest reliability in Q1 as an element in I when a quantity K' of determined subchannel sequence numbers in I satisfies that K–K' is less than Bi, until a quantity of elements in I is K.

In a possible design, I is determined based on K and Q3, and Q3 is determined based on N, Q1, $Q2_1$, $Q2_2$, ..., and $Q2_p$, or Q3 is preconfigured.

In a possible design, Q3 is constituted by subchannel sequence numbers less than or equal to N or subchannel sequence numbers less than N in Q1, $Q2_1$, $Q2_2$, ..., and $Q2_p$, and the subchannel sequence numbers in Q1, $Q2_1$, $Q2_2$, ..., and $Q2_p$ are arranged in descending order or ascending order of reliability in Q3.

In a possible design, the elements in I are the K subchannel sequence numbers with highest reliability in Q3.

In a possible design, the reliability of the outer component code is reliability of a subchannel with lowest reliability or highest reliability in the outer component code; the reliability of the outer component code is reliability of a $j^{th}$ subchannel in the outer component code, $1 \leq j \leq m$, and m is a total quantity of sequence numbers of subchannels included in the outer component code; or the reliability of the outer component code is average reliability of all subchannels or a sum of reliability of all subchannels in the outer component code.

In a possible design, I and F are determined based on N, K, B, KL, and KH by using a rate allocation method.

In a possible design, the code rate allocation method includes performing code rate allocation on the outer component codes level by level based on a target code rate R and a code rate allocation condition until a code rate of an outer component code whose code length is 1 is determined, where $$R = \frac{K}{N},$$

the code rate allocation condition is $2*R_x = R_{x-} + R_{x+}$, $R_x$ is a code rate of an outer component code of a current level, $R_{x-}$ is a lower code rate in code rates of two outer component codes of a next level, and $R_{x+}$ is a higher code rate in the code rates of the two outer component codes of the next level; when code rate allocation is performed on two outer component codes from an $(n+1)^{th}$ level to an $n^{th}$ level, $R_x = R$, and $n = \log_2(N)$.

When code rate allocation is performed on outer component codes from a $(\log_2(B)+1)^{th}$ level to a $(\log_2(B))^{th}$ level, $R_x$ and $R_{x-}$ further satisfy a first condition while satisfying the code rate allocation condition, where the first condition is any one of the following:

$$0 \leq R_{x-} \leq R_{x+} \leq \frac{KL}{B};$$

$$0 \leq R_{x-} \leq \frac{KL}{B} < \frac{KH}{B} \leq R_{x+} \leq 1; \text{ or}$$

$$\frac{KH}{B} \leq R_{x-} \leq R_{x+} \leq 1.$$

In a possible design, the performing code rate allocation on the outer component codes level by level based on a target code rate R and a code rate allocation condition includes: performing code rate allocation on the two outer component codes from the $(n+1)^{th}$ level to the $n^{th}$ level based on R and the code rate allocation condition; and performing code rate allocation on outer component codes from an $s^{th}$ level to an $(s-1)^{th}$ level based on a code rate of the outer component code of the $s^{th}$ level and the code rate allocation condition until a code rate of an outer component code whose code length is 1 is determined, where s is greater than or equal to 2 and less than or equal to n.

In a possible design, I and F are determined based on a code rate of a determined outer component code whose code length is 1.

For beneficial effects of the fourth aspect and the possible designs of the fourth aspect, refer to the beneficial effects of the third aspect and the possible designs of the third aspect. Details are not described herein again.

According to a fifth aspect, this application provides a decoding method, including: obtaining to-be-decoded information, a length M of the to-be-decoded information, a mother code length N, and a quantity K of information bits; determining, based on K and N, a set I corresponding to subchannels of the information bits and a set F corresponding to subchannels of frozen bits, where the information bits corresponding to subchannel sequence numbers in I are distributed in X outer component codes, a code length of each outer component code is B, and the X outer component codes include a first-type outer component code and a second-type outer component code or the X outer component codes include a first-type outer component code, a second-type outer component code, and a third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, where LB is greater than 0 and less than HB, HB is less than or equal to 1, and K, B, N, and X are positive integers; and performing polarization encoding on the to-be-decoded information based on the code rate of the outer component code, where parallel decoding is performed on outer component codes whose code rates are less than or equal to LB, and parallel decoding is performed on outer component codes whose code rates are greater than or equal to HB.

According to the decoding method provided in the fifth aspect, the to-be-decoded information, the length M of the to-be-decoded information, the mother code length N, and the quantity K of information bits are obtained; the set I corresponding to the subchannels of the information bits and the set F corresponding to the subchannels of the frozen bits are determined based on K and N; and finally, polarization decoding is performed on the to-be-decoded information based on the code rate of the outer component code, where parallel decoding is performed on the outer component codes whose code rates are less than or equal to LB, and parallel decoding is performed on the outer component codes whose code rates are greater than or equal to HB. The information bits corresponding to the subchannel sequence numbers in I are distributed in the X outer component codes, and the X outer component codes include the first-type outer component code and the second-type outer component code or the X outer component codes include the first-type outer component code, the second-type outer component code, and one third-type outer component code; the code rate of the first-type outer component code is less than or equal to LB, the code rate of the second-type outer component code is greater than or equal to the second threshold HB, and the code rate of the third-type outer component code is greater than LB and less than HB, where LB and HB are used to divide thresholds of a lower-code rate outer component code, an intermediate-code rate outer component code, and a higher-code rate outer component code. Therefore, the X outer component codes include the higher-code rate outer component code and the lower-code rate outer component code, or the X outer component codes include the higher-code rate outer component code, the lower-code rate outer component code, and one intermediate-code rate outer component code. Because there is no intermediate-code rate outer component code or there is only one intermediate-code rate outer component code, parallel decoding may be performed on the higher-code rate outer component code and the lower-code rate outer component code when decoding is performed, thereby reducing a decoding delay and improving a decoding throughput.

In a possible design, I is determined based on K, a first reliability sequence Q1, and a second reliability sequence Q2. A sum of lengths of Q1 and Q2 is a maximum mother code length $N_{max}$. Q1 includes sequence numbers of subchannels whose reliability is less than or equal to $$LB*B \text{ in } \frac{N_{max}}{B}$$

outer component codes and sequence numbers of subchannels whose reliability is greater than or equal to HB*B in the $$\frac{N_{max}}{B}$$

outer component codes. Q2 includes sequence numbers of subchannels whose reliability is greater than LB*B and less than HB*B in the $$\frac{N_{max}}{B}$$

outer component codes. The subchannel sequence numbers in Q1 are arranged in first order according to reliability of subchannels, where the first order is descending order or ascending order. The subchannel sequence numbers in Q2 are arranged in the first order according to reliability of outer component codes, where subchannel sequence numbers belonging to one outer component code are consecutive in Q2 and are arranged in the first order according to reliability.

In a possible design, Q1 and Q2 may be determined based on Q, B, LB, and HB, where Q is a reliability sequence of subchannels corresponding to $N_{max}$, and Q may be obtained through Gaussian approximation, density evolution, a polar weight, or another method.

Alternatively, Q1 and Q2 may be preconfigured.

In a possible design, LB and HB may be predefined, that is, known to a transmit end and a receive end.

Alternatively, B, LB, and HB may be indicated through indication information. The indication information may be signaling.

When I is determined based on K, the first reliability sequence Q1, and the second reliability sequence Q2, in a possible design, the subchannel sequence numbers in I are at least one subchannel sequence number in Q1. Alternatively, the subchannel sequence numbers in I are at least one subchannel sequence number in Q1 and at least one subchannel sequence number in Q2. Alternatively, the subchannel sequence numbers in I are at least one subchannel sequence number in Q1 and at least one group of subchannel sequence numbers in Q2, and a quantity of subchannel sequence numbers included in one group of subchannel sequence numbers is BM, where BM is a quantity of subchannels belonging to an intermediate code rate in one outer component code.

In a possible design, when I is determined based on K, Q1, and Q2, reliability of one subchannel with highest reliability in Q1 is sequentially compared with reliability of one subchannel with highest reliability in Q2, and a sequence number of one subchannel currently with highest reliability in Q1 and Q2 is determined as an element in I, until a quantity of elements in I is K.

Q1 includes the sequence numbers of subchannels whose reliability is less than or equal to LB*B in the $$\frac{N_{max}}{B}$$

outer component codes and the sequence numbers of subchannels whose reliability is greater than or equal to HB*B in the $$\frac{N_{max}}{B}$$

outer component codes, and Q2 includes the sequence numbers of subchannels whose reliability is greater than LB*B and less than HB*B in the $$\frac{N_{max}}{B}$$

outer component codes. Subchannels, in lower-code rate outer component codes corresponding to Q, divided into Q2, are all subchannels of frozen bits, and subchannels, in higher-code rate outer component codes corresponding to Q, divided into Q2, are all subchannels of information bits. One subchannel sequence number with highest reliability in Q1 or Q2 is determined as an element in I at a time. The information bits corresponding to the subchannel sequence numbers in I are distributed in the X outer component codes. In the X outer component codes, subchannel sequence numbers in a same outer component code are either all information bits (that is, with a higher code rate) or all frozen bits (that is, with a lower code rate). Some subchannel sequence numbers in one outer component code are information bits, and other subchannel sequence numbers are frozen bits. This outer component code is an intermediate-code rate outer component code. Therefore, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

Alternatively, reliability W1 of one subchannel with highest reliability in Q1 is sequentially compared with average reliability W2 of BM subchannels with highest reliability in Q2, a sequence number of one subchannel currently with highest reliability in Q1 is determined as an element in I when W1 is greater than W2, or, sequence numbers of BM subchannels currently with highest reliability in Q2 are determined as elements in I when W1 is not greater than W2, and a sequence number of at least one subchannel with highest reliability in Q1 is determined as an element in I when a quantity K' of determined subchannel sequence numbers in I satisfies that K−K' is less than BM, until a quantity of elements in I is K. In this manner, one subchannel sequence number in Q1 is determined as an element in I at a time, and one group of subchannel sequence numbers (of which a quantity is BM) in Q2 are determined as elements in I at a time. In addition, one subchannel sequence number with highest reliability in Q1 or one group of subchannel sequence numbers (of which a quantity is BM) with highest reliability in Q2 are determined at a time. Therefore, the information bits corresponding to the subchannel sequence numbers in I determined in this manner are distributed in the X outer component codes. In the X outer component codes, subchannel sequence numbers in a same outer component code are either all information bits (that is, with a higher code rate) or all frozen bits (that is, with a lower code rate), and there is no intermediate code rate. Therefore, the X outer component codes include the first-type outer component code (namely, lower-code rate outer component code) and the second-type outer component code (namely, higher-code rate outer component code), and there is no intermediate-code rate outer component code.

In a possible design, I is determined based on K and Q3, and Q3 is determined based on N, Q1, and Q2, or Q3 is preconfigured.

In a possible design, Q3 is constituted by subchannel sequence numbers less than or equal to N or subchannel sequence numbers less than N in Q1 and Q2, and the subchannel sequence numbers in Q1 and Q2 are arranged in descending order or ascending order of reliability in Q3.

In a possible design, Q2 includes P subsequences $Q2_1$, $Q2_2$, ..., and $Q2_p$, P is a positive integer, and I is determined based on K, Q1, $Q2_1$, $Q2_2$, ..., and $Q2_p$.

When I is determined based on K, Q1, $Q2_1$, $Q2_2$, ..., and $Q2_p$, in a possible design, the subchannel sequence numbers in I are at least one subchannel sequence number in Q1; the subchannel sequence numbers in I are at least one subchannel sequence number in Q1 and at least one subchannel sequence number in at least one subsequence of $Q2_1$, $Q2_2$, ..., and $Q2_p$; or the subchannel sequence numbers in I are at least one subchannel sequence number in Q1 and at least one group of subchannel sequence numbers in at least one subsequence of $Q2_1$, $Q2_2$, ..., and $Q2_p$, and a quantity of subchannel sequence numbers included in one group of subchannel sequence numbers is Bi, where Bi=BM/P, and BM is a quantity of subchannels belonging to an intermediate-code rate in one outer component code.

In a possible design, when I is determined based on K, $Q_1$, $Q2_1$, $Q2_2$, ..., and $Q2_p$, reliability of one subchannel with highest reliability in Q1 is sequentially compared with reliability of one subchannel with highest reliability in $Q2_i$ (i=1, 2, ..., P), and a sequence number of one subchannel currently with highest reliability in Q1 and $Q2_i$ (i=1, 2, ..., P) is determined as an element in I, until a quantity of elements in I is K.

Q1 includes the sequence numbers of subchannels whose reliability is less than or equal to LB*B in the $$\frac{N_{max}}{B}$$

outer component codes and the sequence numbers of subchannels whose reliability is greater than or equal to HB*B in the $$\frac{N_{max}}{B}$$

outer component codes, and $Q2_i$ includes the sequence numbers of subchannels whose reliability is greater than LB*B and less than HB*B B in the $$\frac{N_{max}}{B}$$

outer component codes. Subchannels, in lower-code rate outer component codes corresponding to Q, divided into $Q2_1$, are all subchannels of frozen bits, and subchannels, in higher-code rate outer component codes corresponding to Q, divided into $Q2_1$, are all subchannels of information bits. One subchannel sequence number with highest reliability in Q1 or $Q2_1$ is determined as an element in I at a time, and the information bits corresponding to the subchannel sequence numbers in I are distributed in the X outer component codes. In the X outer component codes, subchannel sequence numbers in a same outer component code are either all information bits (that is, with a higher code rate) or all frozen bits (that is, with a lower code rate). Some subchannel sequence numbers in one outer component code are information bits, and other subchannel sequence numbers are frozen bits. This outer component code is an intermediate-code rate outer component code. Therefore, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

Alternatively, reliability W1 of one subchannel with highest reliability in Q1 is sequentially compared with average reliability $W2_i$ (i=1, 2, ..., P) of Bi subchannels with highest reliability in $Q2_i$ (i=1, 2, ..., P), a sequence number of one subchannel currently with highest reliability in Q1 is determined as an element in I when W1 is greater than a maximum value of $W2_i$, or, when W1 is not greater than a maximum value of $W2_i$, sequence numbers of Bi subchannels that are currently with highest reliability in $Q2_i$ and that are corresponding to the maximum value of $W2_i$ are determined as elements in I, and a sequence number of at least one subchannel with highest reliability in Q1 is determined as an element in I when a quantity K' of determined subchannel sequence numbers in I satisfies that K−K' is less than Bi, until a quantity of elements in I is K. The information bits corresponding to the subchannel sequence numbers in I determined in this manner are distributed in the X outer component codes. In the X outer component codes, subchannel sequence numbers in a same outer component code are either all information bits (that is, with a higher code rate) or all frozen bits (that is, with a lower code rate), and there is no intermediate code rate. Therefore, the X outer component codes include the first-type outer component code (namely, lower-code rate outer component code) and the second-type outer component code (namely, higher-code rate outer component code), and there is no intermediate-code rate outer component code.

In a possible design, I is determined based on K and Q3, and Q3 is determined based on N, Q1, $Q2_1$, $Q2_2$, ..., and $Q2_p$, or Q3 is preconfigured.

In a possible design, Q3 is constituted by subchannel sequence numbers less than or equal to N or subchannel sequence numbers less than N in Q1, Q2$_1$, Q2$_2$, ..., and Q2$_p$, and the subchannel sequence numbers in Q1, Q2$_1$, Q2$_2$, ..., and Q2$_p$ are arranged in descending order or ascending order of reliability in Q3. It may be understood that, if sorting starts from 0 in the reliability sequence Q, Q3 is constituted by the subchannel sequence numbers less than N in Q1 and Q2; if sorting starts from 1 in the reliability sequence, Q3 is constituted by the subchannel sequence numbers less than or equal to N in Q1 and Q2.

In a possible design, the elements in I are the K subchannel sequence numbers with highest reliability in Q3.

According to the encoding method provided in this implementation, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

In a possible design, the reliability of the outer component code is reliability of a subchannel with lowest reliability or highest reliability in the outer component code; the reliability of the outer component code is reliability of a j$^{th}$ subchannel in the outer component code, 1<j<m, and m is a total quantity of sequence numbers of subchannels included in the outer component code; or the reliability of the outer component code is average reliability of all subchannels or a sum of reliability of all subchannels in the outer component code.

In a possible design, I and F are determined based on N, K, B, LB*B, and HB*B by using a code rate allocation method.

In a possible design, the code rate allocation method includes performing code rate allocation on the outer component codes level by level based on a target code rate R and a code rate allocation condition until a code rate of an outer component code whose code length is 1 is determined, where $$R = \frac{K}{N},$$

the code rate allocation condition is 2*R$_x$=R$_{x-}$+R$_{x+}$, R$_x$ is a code rate of an outer component code of a current level, R$_{x-}$ is a lower code rate in code rates of two outer component codes of a next level, and R$_{x+}$ is a higher code rate in the code rates of the two outer component codes of the next level; when code rate allocation is performed on two outer component codes from an (n+1)$^{th}$ level to an n$^{th}$ level, R$_x$=R, and n=log$_2$(N).

When code rate allocation is performed on outer component codes from a (log$_2$(B)+1)$^{th}$ level to a (log$_2$(B))$^{th}$ level, R$_x$ and R$_{x-}$ further satisfy a first condition while satisfying the code rate allocation condition, where the first condition is any one of the following:

0≤R$_{x-}$≤R$_{x+}$≤LB;
0≤R$_{x-}$≤LB<HB≤R$_{x+}$≤1; or
HB≤R$_{x-}$≤R$_{x+}$≤1.

According to the decoding method provided in this implementation, LB is a threshold of a lower code rate, HB is a threshold of a higher code rate, and a code rate between LB and HB is an intermediate code rate. When code rate allocation is performed on the outer component codes from the (log$_2$(B)+1)$^{th}$ level to the (log$_2$(B))$^{th}$ level, code rates of the outer component codes of the (log$_2$(B))$^{th}$ level include R$_x$ and R$_{x-}$. When 0≤R$_{x-}$≤R$_{x+}$<LB, that is, R$_{x-}$ is greater than or equal to 0 and less than or equal to LB, R$_{x+}$ is greater than or equal to 0 and less than or equal to LB, and R$_{x-}$ is less than or equal to R$_{x+}$, when the code rate is 0, R$_{x-}$ may be equal to R$_{x+}$, so that the code rates of the outer component codes of the (log$_2$(B))$^{th}$ level may be all lower code rates. When HB≤R$_{x-}$≤R$_{x+}$≤1, that is, R$_{x-}$ is greater than or equal to HB and less than or equal to 1, R$_{x+}$ is greater than or equal to HB and less than or equal to 1, and R$_{x-}$ is less than or equal to R$_{x+}$, when the code rate is 1, R$_-$ may be equal to R$_+$, so that the code rates of the outer component codes of the (log$_2$(B))$^{th}$ level may be all higher code rates. When 0≤R$_{x-}$≤LB<HB≤R$_{x+}$≤1, that is, R$_{x-}$ is greater than or equal to 0 and less than or equal to LB, R$_{x+}$ is greater than or equal to HB and less than or equal to 1, and LB is less than HB, the code rates of the outer component codes of the (log$_2$(B))$^{th}$ level may be enabled to include a higher code rate and a lower code rate, and there is no intermediate code rate, where B is a code length of the outer component code. Therefore, the information bits corresponding to the subchannel sequence numbers in I determined in Manner 3 are distributed in the X outer component codes. The X outer component codes include the first-type outer component code (namely, lower-code rate outer component code) and the second-type outer component code (namely, higher-code rate outer component code), that is, there is no intermediate-code rate outer component code.

In a possible design, the performing code rate allocation on the outer component codes level by level based on a target code rate R and a code rate allocation condition may be: performing code rate allocation on the two outer component codes from the (n+1)$^{th}$ level to the n$^{th}$ level based on R and the code rate allocation condition; and performing code rate allocation on outer component codes from an s$^{th}$ level to an (s−1)$^{th}$ level based on a code rate of the outer component code of the s$^{th}$ level and the code rate allocation condition until a code rate of an outer component code whose code length is 1 is determined, where s is greater than or equal to 2 and less than or equal to n.

In a possible design, I and F are determined based on a code rate of a determined outer component code whose code length is 1.

In this implementation, I and F are determined based on the determined outer component code whose code length is 1. The code rate of the outer component code whose code length is 1 may be only 0 or 1. The code rate of the outer component code whose code length is 1 is determined. If the code rate is 0, a corresponding outer component code is a frozen bit, or if the code rate is 1, a corresponding outer component code is an information bit. In this way, I and F are determined accordingly.

According to a seventh aspect, this application provides an encoding apparatus, including: a processor, configured to execute a program stored in a memory. When the program is executed, the encoding apparatus is enabled to perform the encoding method in any one of the first aspect and the possible designs of the first aspect or any one of the third aspect and the possible designs of the third aspect.

According to an eighth aspect, this application provides a decoding apparatus, including: a processor, configured to execute a program stored in a memory. When the program is executed, the encoding apparatus is enabled to perform the decoding method in any one of the fifth aspect and the possible designs of the fifth aspect.

According to a ninth aspect, this application provides a computer-readable storage medium. The computer-readable storage medium stores executable instructions. When the executable instructions run on a computer, the encoding method in any one of the first aspect and the possible designs of the first aspect or any one of the third aspect and the possible designs of the third aspect is enabled to be performed.

According to a tenth aspect, this application provides a computer-readable storage medium. The computer-readable storage medium stores executable instructions. When the executable instructions run on a computer, the decoding method in any one of the fifth aspect and the possible designs of the fifth aspect is enabled to be performed.

According to an eleventh aspect, this application provides a program product. The program product includes executable instructions. The executable instructions are stored in a readable storage medium. At least one processor of an encoding apparatus may read the executable instructions from the readable storage medium, and the at least one processor executes the executable instructions, to enable the encoding apparatus to perform the method in any one of the first aspect and the possible designs of the first aspect or any one of the third aspect and the possible designs of the third aspect.

According to a twelfth aspect, this application provides a program product. The program product includes executable instructions. The executable instructions are stored in a readable storage medium. At least one processor of a decoding apparatus may read the executable instructions from the readable storage medium, and the at least one processor executes the executable instructions, to enable the decoding apparatus to perform the decoding method in any one of the fifth aspect or the possible designs of the fifth aspect.

According to a thirteenth aspect, this application provides a communications apparatus, including an input/output interface and a logic circuit.

The input/output interface is configured to obtain to-be-encoded information.

The logic circuit is configured to perform polarization encoding based on the to-be-encoded information according to the method in any one of the first aspect and the possible designs of the first aspect or the third aspect and the possible designs of the third aspect.

According to a fourteenth aspect, this application provides a communications apparatus, including an input/output interface and a logic circuit.

The input/output interface is configured to obtain to-be-decoded information.

The logic circuit is configured to perform polarization decoding based on the to-be-decoded information according to the method in any one of the fifth aspect or the possible designs of the fifth aspect.

DESCRIPTION OF EMBODIMENTS

In the embodiments of this application, words such as "example" or "for example" are used to represent an example, an illustration, or a description. Any embodiment or solution described as "exemplary" or "for example" in the embodiments of this application should not be construed as being more preferred or advantageous than other embodiments or solutions. The use of the words "exemplary" or "for example" is intended to present a relevant concept in a specific manner. Exactly, use of the word "example", "for example", or the like is intended to present a related concept in a specific manner.

In this application, "at least one" means one or more, and "a plurality of" means two or more than two. "And/or" describes an association relationship between associated objects, and indicates that three relationships may exist. For example, A and/or B may indicate the following three cases: A exists alone, both A and B exist, and B exists alone, where A and B may be singular or plural. The character "/" usually indicates an "or" relationship between the associated objects.

Figure 2:
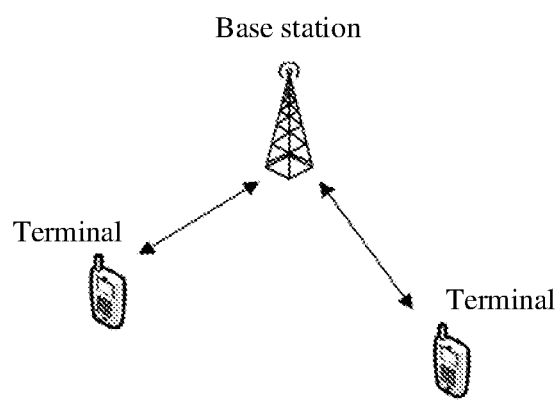
FIG. 2 is a schematic diagram of a communications system according to this application.

The embodiments of this application may be applied to a wireless communications system such as a 5G mobile communications system or a satellite communications system. FIG. 2 is a schematic diagram of a communications system according to this application. As shown in FIG. 2, the wireless communications system usually includes cells, where each cell includes one network device, and a base station provides a communications service to a plurality of terminals.

It should be noted that, the wireless communications system mentioned in the embodiments of this application includes but is not limited to: a narrowband internet of things (NB-IoT) system, a long term evolution (LTE) system, and three major application scenarios of the 5G mobile communications system, namely, enhanced mobile broadband (eMBB), ultra-reliable and low-latency communications (URLLC), and massive machine type communications (mMTC).

In the embodiments of this application, the base station is an apparatus deployed in a radio access network to provide a wireless communications function for a terminal. The base station may include various forms of evolved NodeBs (eNBs, or eNodeBs) in LTE, or abase station in a 5G network or a future evolved public land mobile network (PLMN), a broadband network gateway (BNG), an aggregation switch or a non-third generation partnership project (3GPP) access device, or the like. Optionally, the network device in the embodiments of this application may include base stations in various forms, for example, a macro base station, a micro base station (also referred to as a small cell), a relay station, an access point, a 5G base station or a future base station, a transmitting and receiving point (TRP), a transmitting point (TP), a mobile switching center, a device that functions as a base station in device-to-device (D2D), vehicle-to-everything (V2X), machine-to-machine (M2M) communications, or the like. For ease of description, in all the embodiments of this application, all the foregoing apparatuses that provide a wireless communication function for the terminal are referred to as a network device or a base station or a BS.

Terminals included in embodiments of this application may include various handheld devices, vehicle-mounted devices, wearable devices, or computing devices that have a wireless communication function, or other processing devices connected to a wireless modem. The terminal may be a mobile phone (mobile phone), a tablet (Pad), a computer with a wireless transceiver function, user equipment (UE), an access terminal, a subscriber unit (subscriber unit), a subscriber station, a mobile station, a mobile station (mobile station), a handheld device having a wireless communications function, a computing device or another processing device connected to a wireless modem, a vehicle-mounted device or a wearable device, a virtual reality (VR) terminal device, an augmented reality (AR) terminal device, a wireless device in industrial control (industrial control), a wireless device in self driving (self driving), a wireless device in remote medical (remote medical), a wireless device in a smart grid (smart grid), a wireless device in transportation safety (transportation safety), a wireless device in a smart city (smart city), a wireless device in a smart home (smart home), and the like. This is not limited herein.

In the wireless communications system shown in FIG. 2, the base station and the terminal may be a sending device or a receiving device. The sending device is an encoding side, and may be configured to encode and output encoded information, where the encoded information is transmitted to a decoding side on a channel. The receiving device is a decoding side, and may be configured to receive the encoded information sent by the sending device, and decode the encoded information.

Figure 3:
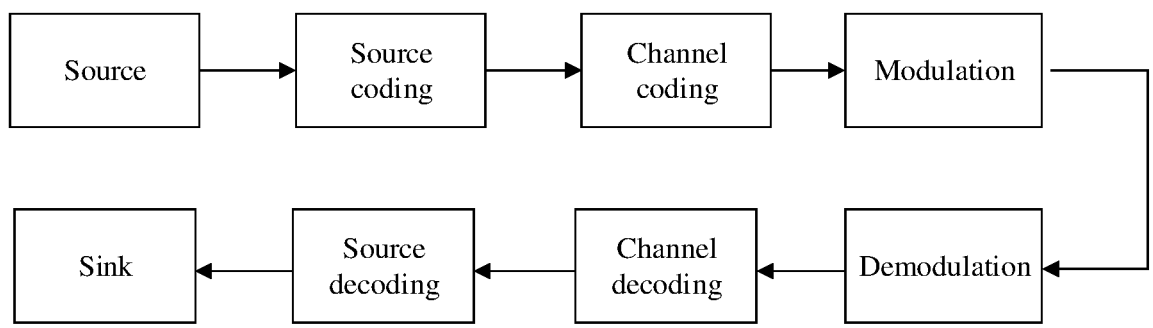
FIG. 3 is a schematic flowchart of a communications system.

FIG. 3 is a schematic flowchart of a communications system. As shown in FIG. 3, on a sending device side, a signal source is sent after source coding, channel coding, and digital modulation are sequentially performed. On a receiving device side, received to-be-decoded information is digitally demodulated to obtain an LLR sequence, and then channel decoding and source decoding are performed on the LLR sequence to obtain information after the decoding. Channel coding plays a critical role in reliability of information transmission in an entire communications system. A Polar code may be used for the channel coding. The encoding method provided in this application may be used.

Figure 1:
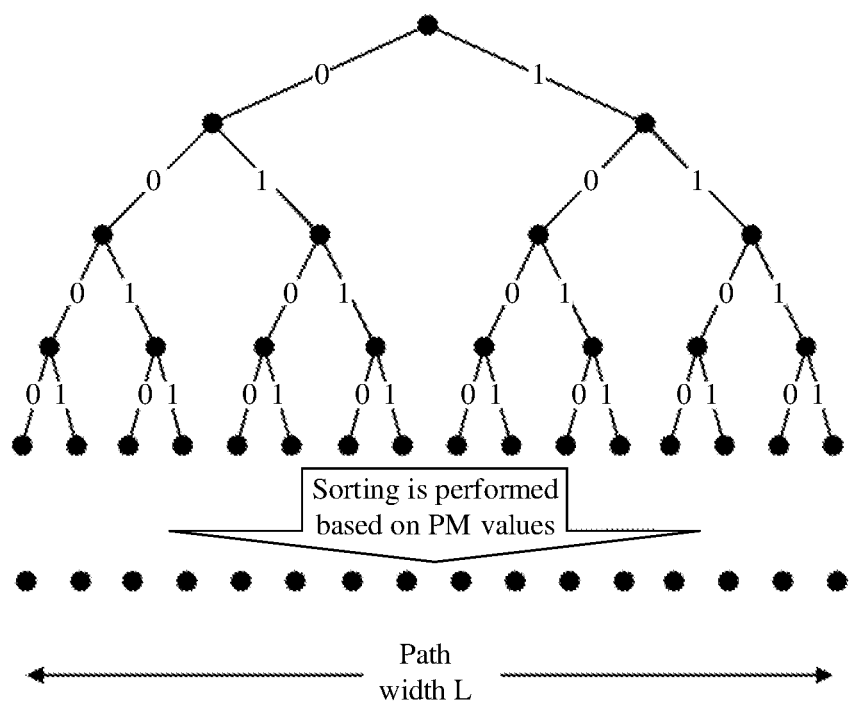
FIG. 1 is a schematic diagram of a decoding path.

A decoding algorithm usually used in an existing Polar code is an SC decoding algorithm and an SCL decoding algorithm. A decoding process of the SC decoding algorithm is as follows: After a signal is received, log likelihood ratios (LLRs) of information bits are calculated one by one. If the LLR of the information bit is greater than 0, a decoding result is 0. If the LLR of the information bit is less than 0, a decoding result is 1. A decoding result of a fixed bit is set to 0 regardless of an LLR value. The SC decoding is actually a process of decoding polarized channels one by one. The SCL decoding algorithm is a decoding algorithm based on the SC decoding algorithm. In the SCL, decoding results corresponding to 0 and 1 are both stored, as two branch decoding paths. FIG. 1 is a schematic diagram of a decoding path. As shown in FIG. 1, each layer represents one decoding bit. If the decoding result is 0, a path is developed along a left subtree. If the decoding result is 1, a path is developed along a right subtree. When a total quantity of decoding paths exceeds a preset path width L (where usually, $L=2^n$), L paths with optimal path metric (Path Metric, PM) values are selected and stored, and the paths are further developed to decode a subsequent decoding bit. For each level of decoding bits, the PM values of the L paths are sorted in ascending order, and the PM values and cyclic redundancy check (Cyclic Redundancy Check, CRC) are used for filtering to obtain a correct path. This is repeated until the last bit is decoded. The PM is used to determine path quality and the PM is obtained through calculation by using the LLR.

In the related technology, to reduce a decoding delay, a simplified SC/SCL decoding algorithm is used. Outer codes are combined into a plurality of outer component codes, and parallel decoding is performed on the plurality of outer component codes, to reduce the decoding delay. However, when a code rate of the outer component code is close to 1/2, decoding complexity is relatively high and parallelization is not easy. To resolve this problem, this application provides an encoding method and apparatus. After to-be-encoded information and a mother code length N are obtained, a set I corresponding to subchannels of the information bits and a set F corresponding to subchannels of frozen bits are determined based on K and N, where information bits corresponding to subchannel sequence numbers in the determined I are distributed in X outer component codes, and the X outer component codes include a higher-code rate outer component code and a lower-code rate outer component code or the X outer component codes include a higher-code rate outer component code, a lower-code rate outer component code, and one intermediate-code rate outer component code. Because there is no intermediate-code rate outer component code or there is only one intermediate-code rate outer component code, parallel decoding may be performed on the higher-code rate outer component code and the lower-code rate outer component code when decoding is performed at a decoder, thereby reducing the decoding delay and improving a decoding throughput. The following describes in detail the encoding method and apparatus provided in this application with reference to the accompanying drawings.

For convenience, definitions of parameters that may be used in this application are first provided as follows.

K: quantity of information bits

N: mother code length

Figure 4:
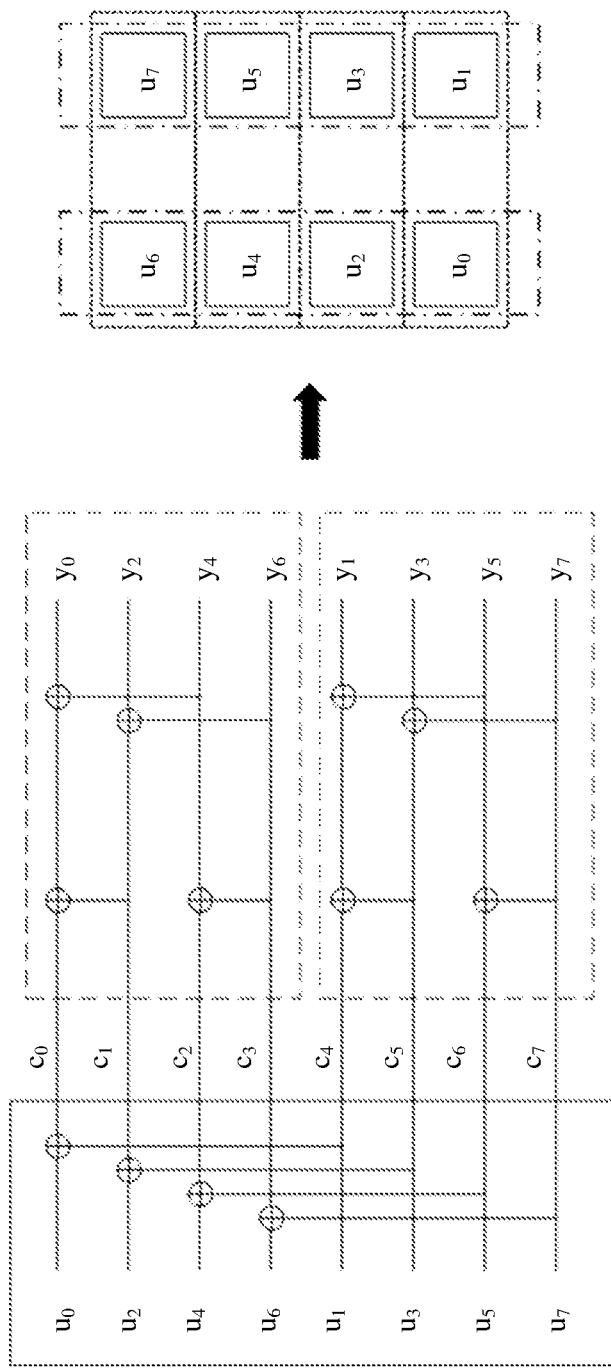
FIG. 4 is a schematic diagram of composition of an outer code and an inner code.

M: length of a bit sequence after the encoding $N_{max}$: maximum mother code length supported by a system, which is referred to as a maximum mother code length in the following I: set corresponding to the subchannels of the information bits Q: subchannel sequence sorted according to reliability F: set corresponding to the subchannels of the frozen bits The Polar code may be considered as generalized concatenated codes (generalized concatenated codes, GCC), and includes an outer code and an inner code. Concepts of the outer code and the inner code of the Polar code are explained below with reference to FIG. 4. FIG. 4 is a schematic diagram of composition of an outer code and an inner code. In FIG. 4, an example in which a mother code length N is 8 and a quantity of inner codes is 2 is used, where a length of the inner code is 4, a quantity of outer codes is 4, and a length of the outer code is 2. In a right block shown in FIG. 4, $[u_0\ u_1]$ are to-be-encoded bits of one outer code, $[u_2\ u_3]$ are to-be-encoded bits of one outer code, $[u_4\ u_5]$ are to-be-encoded bits of one outer code, and $[u_6\ u_7]$ are to-be-encoded bits of one outer code. As shown in FIG. 4, to-be-encoded bits of one inner code are $[c_0\ c_1\ c_2\ c_3]$, and to-be-encoded bits of the other inner code are $[c_4\ c_5\ c_6\ c_7]$. An encoding process is as follows. First, outer code encoding is performed on a bit sequence to be encoded, that is, outer code encoding is performed on $u_0$ and $u_1$ with a code length of 2, to obtain a code word $c_0$ and a code word $c_4$ after the outer code encoding; outer code encoding is performed on $u_2$ and $u_3$ with a code length of 2, to obtain a code word $c_1$ and a code word $c_5$ after the outer code encoding; outer code encoding is performed on $u_4$ and $u_5$ with a code length of 2, to obtain a code word $c_2$ and a code word $c_6$ after the outer code encoding; and outer code encoding is performed on $u_6$ and $u_7$ with a code length of 2, to obtain a code word $c_3$ and a code word $c_7$ after the outer code encoding. Then, encoded bits at identical positions of the outer codes are extracted to perform inner code encoding, that is, $1^{st}$ encoded bits of the outer codes are extracted to obtain the to-be-encoded bits $[c_0\ c_1\ c_2\ c_3]$ of the $1^{st}$ inner code for performing inner code encoding, to obtain a bit sequence $[y_0\ y_2\ y_4\ y_6]$ after the encoding; and $2^{nd}$ encoded bits of the outer codes are extracted to obtain the to-be-encoded bits $[c_4\ c_5\ c_6\ c_7]$ of the $2^{nd}$ inner code for performing inner code encoding, to obtain a bit sequence $[y_1\ y_3\ y_5\ y_7]$ after the encoding. Finally, the bit sequences after the inner code encoding are spliced in sequence, to obtain a final bit sequence after the encoding.

It should be noted that, in this embodiment of this application, the outer code may be referred to as an outer component code or an outer code subblock. In this embodiment of this application, the outer component code is always used as an example for description, that is, an example in which the code length of the outer component code is 2 is used. In a right block shown in FIG. 3, $[u_0\ u_1]$ are to-be-encoded bits of one outer component code, $[u_2\ u_3]$ are to-be-encoded bits of one outer component code, $[u_4\ u_5]$ are to-be-encoded bits of one outer component code, and $[u_6\ u_7]$ are to-be-encoded bits of one outer component code.

Figure 5:
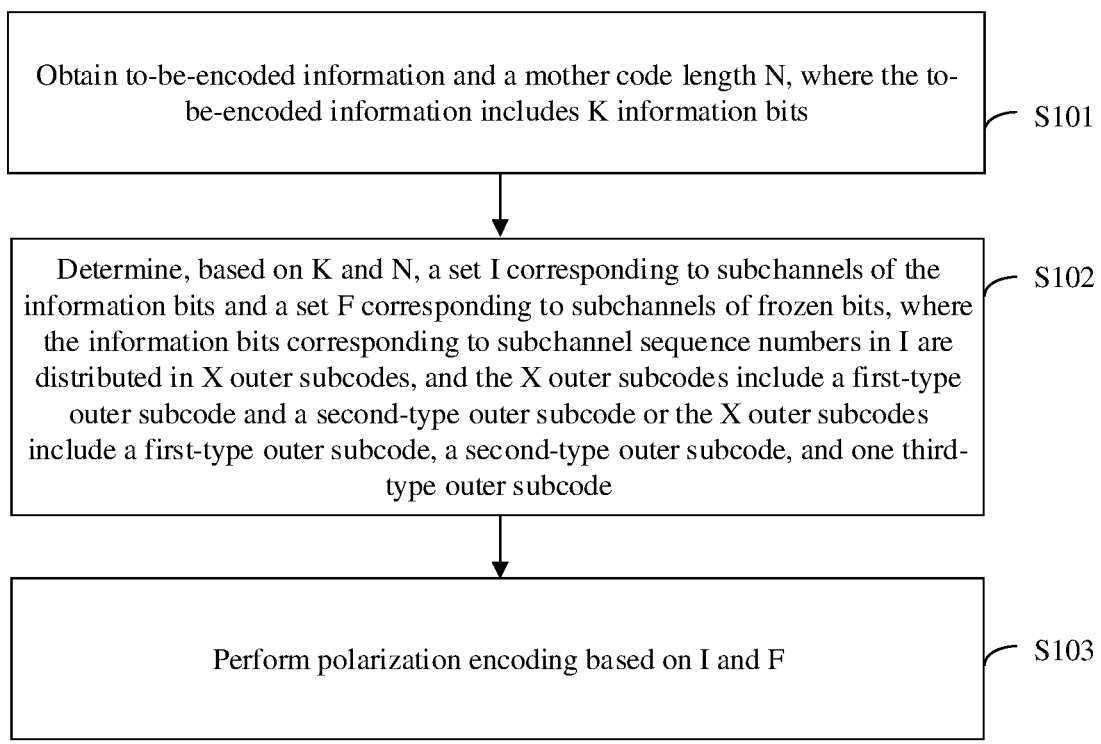
FIG. 5 is a flowchart of an embodiment of an encoding method according to this application.

FIG. 5 is a flowchart of an embodiment of an encoding method according to this application. An execution body of this embodiment may be a sending device such as a base station or a terminal. As shown in FIG. 5, the method in this embodiment may include the following steps.

S101: Obtain to-be-encoded information and a mother code length N, where the to-be-encoded information includes K information bits.

The mother code length (that is, a length of the to-be-encoded information) N is equal to $2^{\lceil log_2(M) \rceil}$, where $\lceil\ \rceil$ is an up rounding function. A value of K may be determined based on a target code rate R and a length M of the bit sequence after the encoding, K=M*R, and K and M may be input values.

S102: Determine, based on K and N, a set I corresponding to subchannels of the information bits and a set F corresponding to subchannels of frozen bits, where the information bits corresponding to subchannel sequence numbers in I are distributed in X outer component codes, and the X outer component codes include a first-type outer component code and a second-type outer component code or the X outer component codes include a first-type outer component code, a second-type outer component code, and one third-type outer component code.

The information bits corresponding to the subchannel sequence numbers in I are distributed in the X outer component codes, where X is greater than or equal to 1, that is, the subchannel sequence numbers in I may also be distributed in one outer component code. In this embodiment, the X outer component codes may be constructed in two possible manners. One is that the X outer component codes include the first-type outer component code and the second-type outer component code. The other is that the X outer component codes include the first-type outer component code, the second-type outer component code, and one third-type outer component code, that is, there is one third-type outer component code in the X outer component codes, and the remaining outer component codes are the second-type outer component code or the first-type outer component code.

In an implementation, a code rate of the first-type outer component code is less than or equal to a first threshold LB, a code rate of the second-type outer component code is greater than or equal to a second threshold HB, and a code rate of the third-type outer component code is greater than LB and less than HB, where LB is greater than 0 and less than HB, HB is less than or equal to 1, and K, B, N, and X are positive integers. In another implementation, there may be alternatively another case: A code rate of the first-type outer component code may be less than a first threshold LB, a code rate of the second-type outer component code is greater than a second threshold HB, and a code rate of the third-type outer component code is greater than or equal to LB and less than or equal to HB. The two implementations depend on values of LB and HB. LB and HB are thresholds for dividing a lower-code rate outer component code, an intermediate-code rate outer component code, and a higher-code rate outer component code. A code rate of one outer component code is a ratio of a quantity of information bits in the outer component code to a code length of the outer component code. For example, a quantity of information bits of an outer component code whose code length is B is m∈[0,B], and a code rate of the outer component code is any value in $$\left[0, \frac{1}{B}, \frac{2}{B}, \ldots, 1\right].$$

For example, when B is equal to 16, LB may be 3/16, 4/16, or 5/16, and KH may be 13/16, 12/16, 11/16, or the like. LB and HB may be alternatively other values, or may not be the ratio of the quantity of information bits to the code length B of the outer component code. When B is equal to 32, LB may be 3/16, 4/16, 5/16 or 6/16, and HB may be 29/32, 28/32 or 27/32, or the like. LB and HB may be alternatively other values, or may not be the ratio of the quantity of information bits to the code length B of the outer component code.

In this embodiment, when LB and HB are set, optionally, an intermediate code rate is a code rate with a value between LB and HB, a higher code rate is a code rate greater than or equal to HB, and a lower code rate is a code rate less than or equal to LB. For example, an intermediate code rate $$\frac{m}{B}$$

may be $$LB < \frac{m}{B} < HB,$$

that is, $$\frac{m}{B}$$

is greater than LB and less than HB. In this case, the higher code rate is a code rate greater than or equal to HB, and the lower code rate is a code rate less than or equal to LB. For another example, an intermediate code rate $$\frac{m}{B}$$

may be $$LB \leq \frac{m}{B} \leq HB,$$

that is, $$\frac{m}{B}$$

is greater than or equal to LB and less than or equal to HB. In this case, the higher code rate is a code rate greater than HB, and the lower code rate is less than LB.

It may be understood that, the code rate of the first-type outer component code is less than or equal to LB, and correspondingly, the first-type outer component code may be referred to as the lower-code rate outer component code; the code rate of the second-type outer component code is greater than or equal to HB, and correspondingly, the second-type outer component code may be referred to as the higher-code rate outer component code; and the code rate of the third-type outer component code is greater than LB and less than HB, and correspondingly, the third-type outer component code may be referred to as the intermediate-code rate outer component code.

S103: Perform polarization encoding based on I and F.

After I and F are determined, values of bits on the subchannels are determined. For example, information bits are placed according to I, frozen bits are placed according to F, and polarization encoding is performed on all the determined bits, to obtain a bit sequence after the encoding.

In an implementation, I may further include a cyclic redundancy check (CRC) bit, and F may further include a parity-check (PC) bit. A location of the CRC bit and a location of the PC bit may be determined in an existing determining manner. This is not limited in this embodiment. In this implementation, after I and F are determined, a set C corresponding to subchannels of the CRC bits in I and a set PF corresponding to subchannels of the PC bits in F are determined, and then values of bits on the subchannels are respectively determined, for example, the information bits are placed according to I, the frozen bits are placed according to F, the CRC bits are placed according to C, and the PC bits are placed according to PF. Polarization encoding is performed on all the determined bits to obtain the bit sequence after the encoding.

In this embodiment, the information bits corresponding to the subchannel sequence numbers in I determined based on K and N are distributed in the X outer component codes, and the X outer component codes include the higher-code rate outer component code and the lower-code rate outer component code or the X outer component codes include the higher-code rate outer component code, the lower-code rate outer component code, and one intermediate-code rate outer component code. Because there is no intermediate-code rate outer component code or there is only one intermediate-code rate outer component code, parallel decoding may be performed on the higher-code rate outer component code and the lower-code rate outer component code when decoding is performed at a decoder, thereby reducing the decoding delay and improving a decoding throughput.

Further, in S102, there are the following three implementations for determining I based on K and N.

Manner 1: I is determined based on K, a first reliability sequence Q1, and a second reliability sequence Q2.

A sum of lengths of Q1 and Q2 is a maximum mother code length $N_{max}$. Q1 includes sequence numbers of subchannels whose reliability is less than or equal to LB*B in $$\frac{N_{max}}{B}$$

outer component codes and sequence numbers of subchannels whose reliability is greater than or equal to HB*B in the $$\frac{N_{max}}{B}$$

outer component codes. Q2 includes sequence numbers of subchannels whose reliability is greater than LB*B and less than HB*B in the $$\frac{N_{max}}{B}$$

outer component codes. That is, there is a total of $$\frac{N_{max}}{B}$$

outer component codes. Q1 includes sequence numbers of subchannels whose reliability is less than or equal to LB*B and sequence numbers of subchannels whose reliability is greater than or equal to HB*B in each outer component code. That is, Q1 includes sequence numbers of subchannels whose reliability is located on two ends of each outer component code. Q2 includes sequence numbers of subchannels whose reliability is greater than LB*B and less than HB*B in each outer component code. That is, Q2 includes a subchannel sequence number whose reliability is located in the middle of each outer component code.

The subchannel sequence numbers in Q1 are arranged in first order according to reliability of subchannels, where the first order is descending order or ascending order. The subchannel sequence numbers in Q2 are arranged in the first order according to reliability of outer component codes, where subchannel sequence numbers belonging to one outer component code are consecutive in Q2 and are arranged in the first order according to reliability. That is, the subchannel sequence numbers in Q1 and Q2 are both sorted according to reliability, and may be in descending order or may be in ascending order, but orders of Q1 and Q2 are the same. For Q2, the subchannel sequence numbers in Q2 are first arranged in the first order according to the reliability of the outer component codes. The reliability of the outer component code is determined by reliability of subchannels in the outer component code, and may be reliability of a subchannel with lowest reliability or highest reliability in the outer component code. Alternatively, the reliability of the outer component code may be reliability of a $j^{th}$ subchannel in the outer component code, 1<j<m, and m is a total quantity of sequence numbers of subchannels included in the outer component code. Alternatively, the reliability of the outer component code may be an average reliability of all subchannels in the outer component code or a sum of reliability of all subchannels. It should be noted that, when the reliability of the outer component code is the average reliability of all the subchannels in the outer component code or the sum of the reliability of all the subchannels, Q2 includes a subchannel sequence number whose reliability is located in the middle of each outer component code. Therefore, when the average reliability of all the subchannels or the sum of the reliability of all the subchannels in the outer component code is calculated, "all the subchannels" herein may be all subchannels in the outer component code or may be all subchannels belonging to Q2 in the outer component code.

In Manner 1, Q1 and Q2 may be determined based on Q, B, LB, and HB. Q is a reliability sequence of subchannels corresponding to $N_{max}$. Q may be arranged in ascending or descending order of reliability. Alternatively, Q may be arranged in any sorting manner agreed by a transmit end and a receive end.

The reliability sequence Q of the subchannels may be obtained through Gaussian approximation (GA), density evolution (DE), a polar weight (PW), or another method.

An example in which a mother code length N is equal to 16 is used. For example, a reliability sequence Q being equal to [0 21 4 8 3 5 6 10 912 7 11 13 14 15] of the subchannels is obtained by using a polar weight. It can be learned that Q stores a sequence number of the subchannel, and the foregoing sets I and F also include a sequence number of the subchannel.

Optionally, LB and HB may be predefined, that is, known to the transmit end and the receive end. Optionally, B, LB*B, and HB*B may be alternatively indicated through indication information. In this case, the method in this embodiment may further include: sending the indication information to a receiving device, where the indication information carries B, LB*B, and HB*B. A sending device may send the indication information to the receiving device before encoding is performed based on selected B, LB*B, and HB*B. Alternatively, B, LB*B, and, HB*B may be determined by a receiving device and sent to a sending device through the indication information. In this case, the method in this embodiment may further include: receiving the indication information from the receiving device, where the indication information carries B, LB*B, and HB*B. Optionally, the indication information may be signaling.

In Manner 1, Q1 and Q2 may be preconfigured.

In Manner 1, when I is determined based on K, the first reliability sequence Q1, and the second reliability sequence Q2, in an implementation, the subchannel sequence number in I may be at least one subchannel sequence number in Q1. Alternatively, the subchannel sequence number in I may be at least one subchannel sequence number in Q1 and at least one subchannel sequence number in Q2. Alternatively, the subchannel sequence number in I may be at least one subchannel sequence number in Q1 and at least one group of subchannel sequence numbers in Q2, and a quantity of subchannel sequence numbers included in one group of subchannel sequence numbers is BM, where BM is a quantity of subchannels belonging to an intermediate code rate in one outer component code, that is, a total quantity, of information bit subchannel sequence numbers, greater than LB*B and less than HB*B in one outer component code. For example, when a code length of the outer component code is 16, LB*B is 3, and HB*B is 13, an intermediate code rate $$\frac{m}{B}$$

may be $$LB < \frac{m}{B} < HB,$$

and m is a number between 3 and 13. m may be 4, 5, 6, 7, 8, 9, 10, 11, and 12. There is a total of nine subchannels with the intermediate code rate, that is, BM is 9.

Further, in an implementation, when I is determined based on K, Q1, and Q2, reliability of one subchannel with highest reliability in Q1 is sequentially compared with reliability of one subchannel with highest reliability in Q2, and a sequence number of one subchannel currently with highest reliability in Q1 and Q2 is determined as an element in I, until a quantity of elements in I is K. In this manner, one subchannel sequence number in Q1 and Q2 is determined as an element in I at a time, and one subchannel sequence number with highest reliability in Q1 and Q2 is determined at a time, until a quantity of determined elements in I is K. Q1 includes the sequence numbers of subchannels whose reliability is less than or equal to LB*B in the $$\frac{N_{max}}{B}$$

outer component codes and the sequence numbers of subchannels whose reliability is greater than or equal to HB*B in the $$\frac{N_{max}}{B}$$

outer component codes, and Q2 includes the sequence numbers of subchannels whose reliability is greater than LB*B and less than HB*B in the $$\frac{N_{max}}{B}$$

outer component codes. Subchannels, in lower-code rate outer component codes corresponding to Q, divided into Q2, are all subchannels of frozen bits, and subchannels, in higher-code rate outer component codes corresponding to Q, divided into Q2, are all subchannels of information bits. One subchannel sequence number with highest reliability in Q1 or Q2 is determined as an element in I at a time. The information bits corresponding to the subchannel sequence numbers in I are distributed in the X outer component codes. In the X outer component codes, subchannel sequence numbers in a same outer component code are either all information bits (that is, with a higher code rate) or all frozen bits (that is, with a lower code rate). Some subchannel sequence numbers in one outer component code are information bits, and other subchannel sequence numbers are frozen bits. This outer component code is an intermediate-code rate outer component code. Therefore, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

In another implementation, when I is determined based on K, Q1, and Q2, reliability W1 of one subchannel with highest reliability in Q1 is sequentially compared with average reliability W2 of BM subchannels with highest reliability in Q2, and a sequence number of one subchannel currently with highest reliability in Q1 is determined as an element in I when W1 is greater than W2, or sequence numbers of BM subchannels currently with highest reliability in Q2 are determined as elements in I when W1 is not greater than W2. It should be noted that, when W1 is equal to W2, the BM subchannel sequence numbers currently with the highest reliability in Q2 may be determined as elements in I. Optionally, one subchannel sequence number currently with the highest reliability in Q1 may be alternatively determined as an element in I. A sequence number of at least one subchannel with highest reliability in Q1 is determined as an element in I when a quantity K' of determined subchannel sequence numbers in I satisfies that K–K' is less than BM, until a quantity of elements in I is K. That is, when the quantity K' of determined subchannel sequence numbers in I satisfies that K–K' is less than BM, the subchannel sequence numbers in Q2 are not determined as elements in I. Instead, the at least one subchannel sequence number with the highest reliability in Q1 is directly determined as an element in I, until the quantity of elements in I is K. In this manner, one subchannel sequence number in Q1 is determined as an element in I at a time, and one group of subchannel sequence numbers (of which a quantity is BM) in Q2 are determined as elements in I at a time. In addition, one subchannel sequence number with highest reliability in Q1 or one group of subchannel sequence numbers (of which a quantity is BM) with highest reliability in Q2 are determined at a time. Therefore, the information bits corresponding to the subchannel sequence numbers in I determined in this manner are distributed in the X outer component codes. In the X outer component codes, subchannel sequence numbers in a same outer component code are either all information bits (that is, with a higher code rate) or all frozen bits (that is, with a lower code rate), and there is no intermediate code rate. Therefore, the X outer component codes include the first-type outer component code (namely, lower-code rate outer component code) and the second-type outer component code (namely, higher-code rate outer component code), and there is no intermediate-code rate outer component code.

Further, Q2 may be a reliability sequence. When a length of Q2 is relatively long, Q2 may further include a plurality of subsequences, that is, Q2 may be divided into the plurality of subsequences. In an implementation, Q2 includes P subsequences $Q2_1, Q2_2, \ldots,$ and $Q2_P$, where P is a positive integer. Correspondingly, I is determined based on K, Q1, $Q2_1, Q2_2, \ldots,$ and $Q2_P$.

When I is determined based on K, Q1, $Q2_1, Q2_2, \ldots,$ and $Q2_P$, in an implementation, the subchannel sequence number in I may be at least one subchannel sequence number in Q1. Alternatively, the subchannel sequence number in I may be at least one subchannel sequence number in Q1 and at least one subchannel sequence number in at least one subsequence of $Q2_1, Q2_2, \ldots,$ and $Q2_P$. Alternatively, the subchannel sequence numbers in I are at least one subchannel sequence number in Q1 and at least one group of subchannel sequence numbers in at least one subsequence of $Q2_1, Q2_2, \ldots,$ and $Q2_P$, and a quantity of subchannel sequence numbers included in one group of subchannel sequence numbers is Bi, where Bi=BM/P, and BM is a quantity of subchannels belonging to an intermediate code rate in one outer component code, that is, a total quantity, of information bit subchannel sequence numbers, greater than LB and less than HB*B in one outer component code. For example, when a code length of the outer component code is 16, LB*B is 3, and HB*B is 13, an intermediate code rate $$\frac{m}{B}$$

may be $$LB < \frac{m}{B} < HB,$$

and m is a number between 3 and 13. m may be 4, 5, 6, 7, 8, 9, 10, 11, and 12. There is a total of nine subchannels with the intermediate code rate, that is, BM is 9. P is a quantity of subsequences included in Q2, and Q2 is divided into the P subsequences. For example, P is 3. Correspondingly, Bi=BM/P=9/3=3. It should be noted that Bi is a positive integer and may be equally divided according to BM and P or may not be equally divided according to BM and P.

Further, when I is determined based on K, Q1, $Q2_1$, $Q2_2$, ..., and $Q2_P$, in an implementation, reliability of one subchannel with highest reliability in Q1 is sequentially compared with reliability of one subchannel with highest reliability in $Q2_i$ (i=1, 2, ..., P), and a sequence number of one subchannel currently with highest reliability in Q1 and $Q2_i$ (i=1, 2, ..., P) is determined as an element in I, until a quantity of elements in I is K. In this manner, one subchannel sequence number in Q1, $Q2_1$, $Q2_2$, ..., and $Q2_P$ is determined as an element in I at a time, and one subchannel sequence number with highest reliability in Q1, $Q2_1$, $Q2_2$, ..., and $Q2_P$ is determined at a time, until a quantity of determined elements in I is K. Q1 includes the sequence numbers of subchannels whose reliability is less than or equal to LB*B in the $$\frac{N_{max}}{B}$$

outer component codes and the sequence numbers of subchannels whose reliability is greater than or equal to HB*B in the $$\frac{N_{max}}{B}$$

outer component codes, and $Q2_i$ includes the sequence numbers of subchannels whose reliability is greater than LB*B and less than HB*B in the $$\frac{N_{max}}{B}$$

outer component codes. Subchannels, in lower-code rate outer component codes corresponding to Q, divided into $Q2_1$, are all subchannels of frozen bits, and subchannels, in higher-code rate outer component codes corresponding to Q, divided into $Q2_1$, are all subchannels of information bits. One subchannel sequence number with highest reliability in Q1 or $Q2_1$ is determined as an element in I at a time. The information bits corresponding to the subchannel sequence numbers in I are distributed in the X outer component codes. In the X outer component codes, subchannel sequence numbers in a same outer component code are either all information bits (that is, with a higher code rate) or all frozen bits (that is, with a lower code rate). Some subchannel sequence numbers in one outer component code are information bits, and other subchannel sequence numbers are frozen bits. This outer component code is an intermediate-code rate outer component code. Therefore, the information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

In another implementation, reliability W1 of one subchannel with highest reliability in Q1 is sequentially compared with average reliability $W2_i$ (i=1, 2, ..., P) of Bi subchannels with highest reliability in $Q2_i$ (i=1, 2, ..., P), and a sequence number of one subchannel currently with highest reliability in Q1 is determined as an element in I when W1 is greater than a maximum value of $W2_i$, or, when W1 is not greater than a maximum value of $W2_i$, sequence numbers of Bi subchannels that are currently with highest reliability in $Q2_i$ and that are corresponding to the maximum value of $W2_i$ are determined as elements in I. For example, P=4 is used as an example. When a 1V element in I is determined, reliability W1 of one subchannel with highest reliability in Q1 is compared with average reliability $W2_1$ of Bi subchannels with highest reliability in $Q2_1$, average reliability $W2_2$ of Bi subchannels with highest reliability in $Q2_2$, average reliability $W2_3$ of Bi subchannels with highest reliability in $Q2_3$, and average reliability $W2_4$ of Bi subchannels with highest reliability in $Q2_4$. For example, a maximum value of $W2_1$, $W2_2$, $W2_3$, and $W2_4$ is $W2_2$. When W1 is greater than $W2_2$, a sequence number of one subchannel currently with highest reliability in Q1 is determined as an element in I. Then, a $2^{nd}$ element in I is determined, and the foregoing method is still used. Reliability W1 of one subchannel with highest reliability in Q1 (in this case, elements in Q1 are reduced by one) is compared with average reliability $W2_1$ of Bi subchannels with highest reliability in $Q2_1$, average reliability $W2_2$ of Bi subchannels with highest reliability in $Q2_2$, average reliability $W2_3$ of Bi subchannels with highest reliability in $Q2_3$, and average reliability $W2_4$ of Bi subchannels with highest reliability in $Q2_4$. For example, a maximum value of $W2_1$, $W2_2$, $W2_3$, and $W2_4$ is $W2_2$. When W1 is less than or equal to $W2_2$, Bi subchannel sequence numbers currently with highest reliability in $Q2_2$ are determined as elements in I. It should be noted that when W1 is equal to $W2_2$, the Bi subchannel sequence numbers currently with the highest reliability in $Q2_2$ may be determined as elements in I, or optionally, a sequence number of one subchannel currently with highest reliability in Q1 may be alternatively determined as an element in I. The foregoing method is still used. A sequence number of at least one subchannel with highest reliability in Q1 is determined as an element in I when a quantity K' of determined subchannel sequence numbers in I satisfies that K−K' is less than Bi, until the quantity of elements in I is K. That is, when the quantity K' of determined subchannel sequence numbers in I satisfies that K−K' is less than Bi, subchannel sequence numbers in $Q2_1$ are not determined as elements in I. Instead, the at least one subchannel sequence number with the highest reliability in Q1 is directly determined as an element in I, until the quantity of elements in I is K. In this manner, one subchannel sequence number in Q1 is determined as an element in I at a time, and one group of subchannel sequence numbers (of which a quantity is Bi) in $Q2_1$ are determined as elements in I at a time. The information bits corresponding to the subchannel sequence numbers in I determined in this manner are distributed in the X outer component codes. In the X outer component codes, subchannel sequence numbers in a same outer component code are either all information bits (that is, with a higher code rate) or all frozen bits (that is, with a lower code rate), and there is no intermediate code rate. Therefore, the X outer component codes include the first-type outer component code (namely, lower-code rate outer component code) and the second-type outer component code (namely, higher-code rate outer component code), and there is no intermediate-code rate outer component code.

Manner 2: I is determined based on K and Q3.

In an implementation, Q3 may be determined based on N, Q1, and Q2, or Q3 may be preconfigured. Optionally, Q3 may be configured after Q3 is determined based on N, Q1, and Q2.

When Q3 is determined based on N, Q1, and Q2, Q3 is constituted by subchannel sequence numbers less than or equal to N or subchannel sequence numbers less than N in Q1 and Q2. The subchannel sequence numbers in Q1 and Q2 are arranged in descending order or ascending order of reliability in Q3. It may be understood that, if sorting starts from 0 in the reliability sequence Q, Q3 is constituted by the subchannel sequence numbers less than N in Q1 and Q2; if sorting starts from 1 in the reliability sequence, Q3 is constituted by the subchannel sequence numbers less than or equal to N in Q1 and Q2.

When Q3 is determined based on N, Q1, and Q2, subchannel sequence numbers may be sequentially extracted from Q1 and Q2 to form Q3. In an implementation, current first subchannel sequence numbers of Q1 and Q2 may be compared, and a subchannel sequence number with lower (or higher) reliability is extracted and placed at a current tail of the Q3 sequence, until all elements in Q1 and Q2 are extracted. If the mother code length N is less than the maximum mother code length $N_{max}$, when subchannel sequence numbers are extracted from Q1 and Q2, only a subchannel sequence number less than or equal to N is extracted (where if the Q sequence starts from 0, only a subchannel sequence number smaller than N is extracted), and a subchannel sequence number greater than N is discarded (where if the Q sequence starts from 0, a subchannel sequence number greater than or equal to N is discarded). It may be understood that, current first subchannel sequence numbers of Q1 and Q2 may be compared, and a subchannel sequence number with lower (or higher) reliability is extracted and placed at a current head of the Q3 sequence, until all elements in Q1 and Q2 are extracted.

In another implementation, Q3 may be determined based on N, Q1, $Q2_1$, $Q2_2$, ..., and $Q2_p$, or Q3 is preconfigured, and optionally, Q3 may be configured after Q3 is determined based on N, Q1, $Q2_1$, $Q2_2$, ..., and $Q2_p$.

When Q3 is determined based on N, Q1, $Q2_1$, $Q2_2$, ..., and $Q2_p$, Q3 is constituted by subchannel sequence numbers less than or equal to N or subchannel sequence numbers less than N in Q1, $Q2_1$, $Q2_2$, ..., and $Q2_p$, the subchannel sequence numbers in Q1, $Q2_1$, $Q2_2$, ..., and $Q2_p$ are arranged in descending order or ascending order of reliability in Q3. It may be understood that, if sorting starts from 0 in the reliability sequence Q, Q3 is constituted by the subchannel sequence numbers less than N in Q1 and Q2; if sorting starts from 1 in the reliability sequence, Q3 is constituted by the subchannel sequence numbers less than or equal to N in Q1 and Q2.

When Q3 is determined based on N, Q1, $Q2_1$, $Q2_2$, ..., and $Q2_p$, subchannel sequence numbers may be sequentially extracted from Q1, $Q2_1$, $Q2_2$, ..., and $Q2_p$ to form Q3. In an implementation, current first subchannel sequence numbers of Q1, $Q2_1$, $Q2_2$, ..., and $Q2_p$ may be compared, and a subchannel sequence number with lower (or higher) reliability is extracted and placed at a current tail of the Q3 sequence, until all elements in Q1, $Q2_1$, $Q2_2$, ..., and $Q2_p$ are extracted. If the mother code length N is less than the maximum mother code length $N_{max}$, when subchannel sequence numbers are extracted from Q1, $Q2_1$, $Q2_2$, ..., and $Q2_p$, only a subchannel sequence number less than or equal to N is extracted (where if the Q sequence starts from 0, only a subchannel sequence number smaller than N is extracted), and a subchannel sequence number greater than N is discarded (where if the Q sequence starts from 0, a subchannel sequence number greater than or equal to N is discarded).

In Manner 2, when I is determined based on K and Q3, elements in I are K subchannel sequence numbers with highest reliability in Q3.

It should be noted that, when I is determined based on K and Q3, the K subchannel sequence numbers with the highest reliability are extracted from Q3 to form I. The information bits corresponding to the subchannel sequence numbers in I determined in this manner are distributed in the X outer component codes. The X outer component codes include the first-type outer component code (namely, lower-code rate outer component code), the second-type outer component code (namely, higher-code rate outer component code), and one third-type outer component code (namely, intermediate-code rate outer component code). That is, there is only one intermediate-code rate outer component code.

Manner 3: I and F are determined based on N, K, B, LB*B, and HB*B by using a code rate allocation method.

In an implementation, the code rate allocation method includes: performing code rate allocation on the outer component codes level by level based on a target code rate R and a code rate allocation condition until a code rate of an outer component code whose code length is 1 is determined, where $$R = \frac{K}{N},$$

the code rate allocation condition is $2*R_x = R_{x-} + R_{x+}$, $R_x$ is a code rate of an outer component code of a current level, $R_{x-}$ is a lower code rate in code rates of two outer component codes of a next level, and $R_{x+}$ is a higher code rate in the code rates of the two outer component codes of the next level; when code rate allocation is performed on two outer component codes from an $(n+1)^{th}$ level to an $n^{th}$ level, $R_x = R$, that is, $R_x$ is a code rate of one outer component code of the $(n+1)^{th}$ level, where $n = \log_2(N)$.

One Polar code with a length of N may include two outer codes (also referred to as outer component codes) with a length of N/2 and an inner code on which one level of polarization encoding is performed. A code rate of one of the two outer component codes is smaller than a code rate of the other outer component code, that is, the two outer component codes include a lower-code rate outer code and a higher-code rate outer code. A code rate of the lower-code rate outer code is $R_-$, and a code rate of the higher-code rate outer code is $R_+$. It should be noted that, when the code rate is 0 or 1, $R_{x-}$ may be equal to $R_{x+}$, that is, $R_x = R_{x-} = R_{x+} = 0$, or $R_x = R_{x-} = R_{x+} = 1$. The outer component code with a length of N/2 may be further decomposed into outer component codes with a length of N/4. Other processes are performed by analogy, until an outermost layer of outer component code, namely, the outer component code whose code length is 1, is obtained through decomposition. The code rate of the outer component code whose code length is 1 may be only 0 or 1. The code rate of the outer component code whose code length is 1 is determined. If the code rate is 0, a corresponding outer component code is a frozen bit, or if the code rate is 1, a corresponding outer component code is an information bit. In this way, I and F are determined accordingly.

The code length N of the polar code is equal to $2^n$. n+1 is a quantity of encoding/decoding levels. The performing code rate allocation on the outer component codes level by level based on a target code rate R and a code rate allocation condition may start from the $(n+1)^{th}$ level, and code rates of outer component codes of an $n^{th}$ level, an $(n-1)^{th}$ level, and a $1^{st}$ level are sequentially allocated. The code rate allocation condition needs to be satisfied when code rate allocation of each level is performed.

The code rate allocation condition is $2*R_x=R_{x-}+R_{x+}$. $2*R_x$ is decomposed to obtain $R_{x-}+R_{x+}$. A manner such as formula calculation or table lookup may be used. This is not limited in this embodiment.

When the code rate allocation is performed on outer component codes from a $(\log_2(B)+1)^{th}$ level to a $(\log_2(B))^{th}$ level, $R_x$, $R_{x-}$, and $R_{x+}$ further satisfy a first condition while satisfying the code rate allocation condition. The first condition is any one of the following:

$0 \leq R_{x-} \leq R_{x+} \leq LB$;
$0 \leq R_{x-} \leq LB < HB \leq R_{x+} \leq 1$; or
$HB \leq R_{x-} \leq R_{x+} \leq 1$.

It may be understood that, LB is a threshold of a lower code rate, HB is a threshold of a higher code rate, and a code rate between LB and HB is an intermediate code rate. When code rate allocation is performed on the outer component codes from the $(\log_2(B)+1)^{th}$ level to the $(\log_2(B))^{th}$ level, code rates of the outer component codes of the $(\log_2(B))^{th}$ level include $R_x$ and $R_{x-}$. When $0 \leq R_{x-} \leq R_{x+} < LB$, that is, $R_{x-}$ is greater than or equal to 0 and less than or equal to LB, $R_{x+}$ is greater than or equal to 0 and less than or equal to LB, and $R_{x-}$ is less than or equal to $R_{x+}$, when the code rate is 0, $R_{x-}$ may be equal to $R_{x+}$, so that the code rates of the outer component codes of the $(\log_2(B))^{th}$ level may be all lower code rates. When $HB \leq R_{x-} \leq R_{x+} \leq 1$, that is, $R_{x-}$ is greater than or equal to HB and less than or equal to 1, $R_x$ is greater than or equal to HB and less than or equal to 1, and $R_{x-}$ is less than or equal to $R_{x+}$, when the code rate is 1, $R_-$ may be equal to $R_+$, so that the code rates of the outer component codes of the $(\log_2(B))^{th}$ level may be all higher code rates. When $0 \leq R_{x-} \leq LB < HB \leq R_{x+} \leq 1$, that is, $R_{x-}$ is greater than or equal to 0 and less than or equal to LB, $R_x$ is greater than or equal to HB and less than or equal to 1, and LB is less than HB, the code rates of the outer component codes of the $(\log_2(B))^{th}$ level may be enabled to include a higher code rate and a lower code rate, and there is no intermediate code rate, where B is a code length of the outer component code. Therefore, the information bits corresponding to the subchannel sequence numbers in I determined in Manner 3 are distributed in the X outer component codes. The X outer component codes include the first-type outer component code (namely, lower-code rate outer component code) and the second-type outer component code (namely, higher-code rate outer component code), that is, there is no intermediate-code rate outer component code.

It may be understood that when code rate allocation is performed on outer component codes from the $(\log_2(B))^{th}$ level to a $(\log_2(B)-1)^{th}$ level, and when code rate allocation is performed on an outer component code after the $(\log_2(B)-1)^{th}$ level, allocation is performed level by level based on the code rate allocation condition until a code rate of an outer component code whose code length is 1 is determined.

The performing code rate allocation on the outer component codes level by level based on a target code rate R and a code rate allocation condition may be as follows.

First, code rate allocation is performed on the two outer component codes from the $(n+1)^{th}$ level to the $n^{th}$ level based on R and the code rate allocation condition.

Then, code rate allocation is performed on outer component codes from an $s^{th}$ level to an $(s-1)^{th}$ level based on a code rate of the outer component code of the $s^{th}$ level and the code rate allocation condition until a code rate of an outer component code whose code length is 1 is determined, where s is greater than or equal to 2 and less than or equal to n.

In Manner 3, I and F are determined based on the determined outer component code whose code length is 1. The code rate of the outer component code whose code length is 1 may be only 0 or 1. The code rate of the outer component code whose code length is 1 is determined. If the code rate is 0, a corresponding outer component code is a frozen bit, or if the code rate is 1, a corresponding outer component code is an information bit. In this way, I and F are determined accordingly.

According to the encoding method provided in this embodiment, after the to-be-encoded information including the K information bits and the mother code length N are obtained, the set I corresponding to the subchannels of the information bits and the set F corresponding to the subchannels of the frozen bits are determined based on K and N, the information bits corresponding to the subchannel sequence numbers in I are distributed in the X outer component codes, and the X outer component codes include the first-type outer component code and the second-type outer component code or the X outer component codes include the first-type outer component code, the second-type outer component code, and one third-type outer component code; the code rate of the first-type outer component code is less than or equal to LB, the code rate of the second-type outer component code is greater than or equal to the second threshold HB, and the code rate of the third-type outer component code is greater than LB and less than HB, where LB and HB are used to divide thresholds of a lower-code rate outer component code, an intermediate-code rate outer component code, and a higher-code rate outer component code. Therefore, the X outer component codes include the higher-code rate outer component code and the lower-code rate outer component code, or the X outer component codes include the higher-code rate outer component code, the lower-code rate outer component code, and one intermediate-code rate outer component code. Because there is no intermediate-code rate outer component code or there is only one intermediate-code rate outer component code, parallel decoding may be performed on the higher-code rate outer component code and the lower-code rate outer component code when decoding is performed at a decoder, thereby reducing a decoding delay and improving a decoding throughput.

The following describes the technical solution shown in FIG. 3 in detail by using several specific embodiments.

Figure 6:
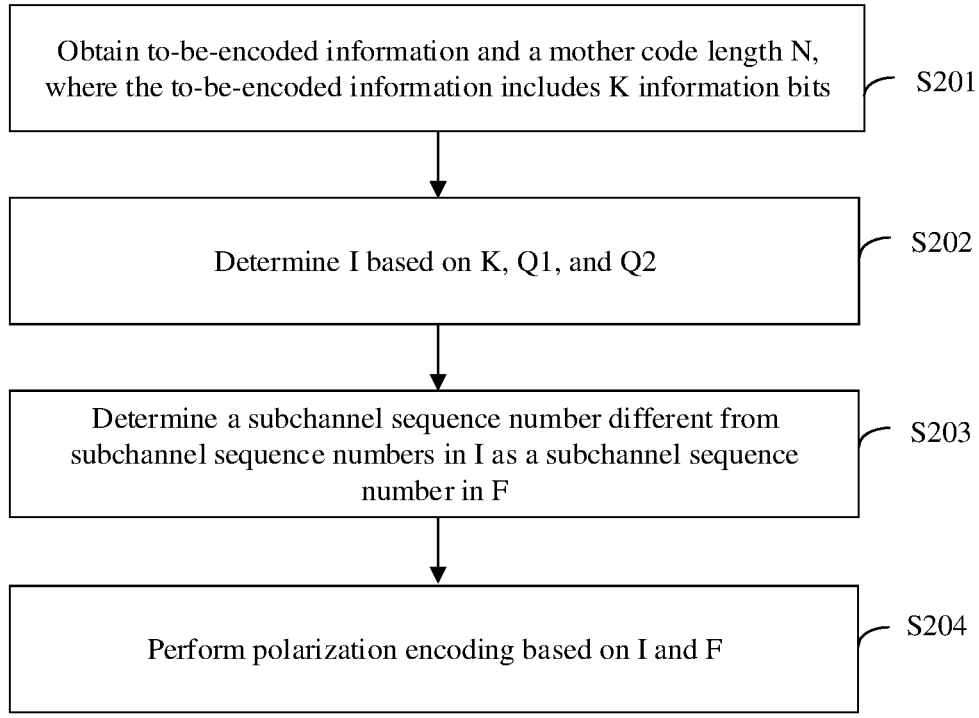
FIG. 6 is a flowchart of an embodiment of an encoding method according to this application.

FIG. 6 is a flowchart of an embodiment of an encoding method according to this application. An execution body of this embodiment may be a sending device such as a base station or a terminal. In this embodiment, description is provided by using an example in which I is determined based on K, a first reliability sequence Q1, and a second reliability sequence Q2. As shown in FIG. 6, the method in this embodiment may include the following steps.

S201: Obtain to-be-encoded information and a mother code length N, where the to-be-encoded information includes K information bits.

S202: Determine I based on K, Q1, and Q2.

S203: Determine a subchannel sequence number different from subchannel sequence numbers in I as a subchannel sequence number in F.

S204: Perform polarization encoding based on I and F.

After I and F are determined, values of bits on the subchannels are determined. For example, information bits are placed according to I, frozen bits are placed according to F, and polarization encoding is performed on all the determined bits, to obtain a bit sequence after the encoding.

In an implementation, Q1 and Q2 in S202 may be determined based on Q, B, LB, and HB. Correspondingly, before S202, the method may further include the following step.

S205: Determine Q1 and Q2 based on Q, B, LB*B, and HB*B.

Alternatively, after Q1 and Q2 are determined based on Q, B, LB*B, and HB*B, Q1 and Q2 may be stored, and may be directly used in subsequent encoding.

The determining Q1 and Q2 based on Q, B, LB*B, and HB*B in S205 may be as follows.

S2051: Obtain a reliability sequence of subchannels corresponding to $N_{max}$.

Q may be obtained through Gaussian approximation (Gaussian Approximation, GA), density evolution (Density Evolution, DE), a polar weight (Polar Weight, PW), or another method. Q may be arranged in ascending or descending order of reliability. Alternatively, Q may be arranged in any sorting manner agreed by a transmit end and a receive end.

S2052: Determine Q1 and Q2 based on Q, B, LB*B, and HB*B.

A sum of lengths of Q1 and Q2 is a maximum mother code length $N_{max}$, Q1 includes sequence numbers of subchannels whose reliability is less than or equal to LB*B in $$\frac{N_{max}}{B}$$

outer component codes and sequence numbers of subchannels whose reliability is greater than or equal to HB*B in the $$\frac{N_{max}}{B}$$

outer component codes, and Q2 includes sequence numbers of subchannels whose reliability is greater LB*B and less than HB*B in the $$\frac{N_{max}}{B}$$

outer component codes.

In another implementation, Q1 and Q2 may be preconfigured. Q1 and Q2 are preconfigured for both a sending device and a receiving device.

Optionally, S202 may be: sequentially comparing reliability of one subchannel with highest reliability in Q1 with reliability of one subchannel with highest reliability in Q2, and determining a sequence number of one subchannel currently with highest reliability in Q1 and Q2 as an element in I, until a quantity of elements in I is K.

For a detailed process of this manner, refer to the description in Manner 1 in the foregoing embodiment. Details are not described herein again. The information bits corresponding to subchannel sequence numbers in I determined in this manner are distributed in X outer component codes. The X outer component codes include a first-type outer component code (namely, lower-code rate outer component code), a second-type outer component code (namely, higher-code rate outer component code), and one third-type outer component code (namely, intermediate-code rate outer component code). That is, there is only one intermediate-code rate outer component code.

Optionally, S202 may be: sequentially comparing reliability W1 of one subchannel with highest reliability in Q1 with average reliability W2 of BM subchannels with highest reliability in Q2, determining a sequence number of one subchannel currently with highest reliability in Q1 as an element in I when W1 is greater than W2, or, determining, when W1 is not greater than W2, sequence numbers of BM subchannels currently with highest reliability in Q2 as elements in I, and determining a sequence number of at least one subchannel with highest reliability in Q1 as an element in I when a quantity K' of determined subchannel sequence numbers in I satisfies that K–K' is less than BM, until a quantity of elements in I is K. For a detailed process of this manner, refer to the description in Manner 1 in the foregoing embodiment. Details are not described herein again. The information bits corresponding to subchannel sequence numbers in I determined in this manner are distributed in X outer component codes. The X outer component codes include a first-type outer component code (namely, lower-code rate outer component code) and a second-type outer component code (namely, higher-code rate outer component code). That is, there is no intermediate-code rate outer component code.

Further, Q2 may be a reliability sequence. When a length of Q2 is relatively long, Q2 may further include a plurality of subsequences, that is, Q2 may be divided into the plurality of subsequences. In an implementation, Q2 includes P subsequences $Q2_1, Q2_2, \ldots,$ and $Q2_p$, where P is a positive integer. Correspondingly, S202 may be: determining I based on K, Q1, $Q2_1, Q2_2, \ldots,$ and $Q2_p$.

In an implementation, when I is determined based on K, Q1, $Q2_1, Q2_2, \ldots,$ and $Q2_p$, reliability of one subchannel with highest reliability in Q1 may be sequentially compared with reliability of one subchannel with highest reliability in $Q2_i$ (i=1, 2, . . . , P), and a sequence number of one subchannel currently with highest reliability in Q1 and $Q2_i$ (i=1, 2, . . . , P) is determined as an element in I, until a quantity of elements in I is K. For a detailed process of this manner, refer to the description in Manner 1 in the foregoing embodiment. Details are not described herein again. The information bits corresponding to subchannel sequence numbers in I determined in this manner are distributed in X outer component codes. The X outer component codes include a first-type outer component code (namely, lower-code rate outer component code), a second-type outer component code (namely, higher-code rate outer component code), and one third-type outer component code (namely, intermediate-code rate outer component code). That is, there is only one intermediate-code rate outer component code.

In another implementation, when I is determined based on K, Q1, $Q2_1, Q2_2, \ldots,$ and $Q2_p$, reliability W1 of subchannel with highest reliability in Q1 may be sequentially compared with average reliability $W2_i$ (i=1, 2, . . . , P)

of Bi subchannels with highest reliability in $Q2_i$ (i=1, 2, ..., P), and a sequence number of one subchannel currently with highest reliability in Q1 is determined as an element in I when W1 is greater than a maximum value of $W2_i$, or, when W1 is not greater than a maximum value of W21 sequence numbers of Bi subchannels that are currently with highest reliability in $Q2_i$ and that are corresponding to the maximum value of $W2_i$ are determined as elements in I. For a detailed process of this manner, refer to the description in Manner 1 in the foregoing embodiment. Details are not described herein again. The information bits corresponding to subchannel sequence numbers in I determined in this manner are distributed in X outer component codes. The X outer component codes include a first-type outer component code (namely, lower-code rate outer component code) and a second-type outer component code (namely, higher-code rate outer component code). That is, there is no intermediate-code rate outer component code.

According to the encoding method provided in this embodiment, after the to-be-encoded information including the K information bits and the mother code length N are obtained, I is determined based on K, Q1, and Q2, and Q1 and Q2 may be determined based on Q, B, LB, and HB or may be preconfigured. Because Q1 includes sequence numbers of subchannels whose reliability is less than or equal to LB*B in $$\frac{N_{max}}{B}$$

outer component codes and sequence numbers of subchannels whose reliability is greater than or equal to HB*B in the $$\frac{N_{max}}{B}$$

outer component codes, and Q2 includes sequence numbers of subchannels whose reliability is greater than LB*B and less than HB*B in the $$\frac{N_{max}}{B}$$

outer component codes, when I is determined based on K, Q1, and Q2, one subchannel sequence number in Q1 and Q2 may be determined as an element in I at a time, and one subchannel sequence number with highest reliability in Q1 and Q2 is determined at a time, until a quantity of determined elements in I is K. Alternatively, one subchannel sequence number in Q1 may be determined as an element in I at a time, and one group of subchannel sequence numbers (of which a quantity is BM) in Q2 may be determined as elements in I at a time. In addition, one subchannel sequence number with highest reliability in Q1 or one group of subchannel sequence numbers with highest reliability in Q2 is/are determined at a time. The information bits corresponding to the subchannel sequence numbers in I determined in the two manners are distributed in the X outer component codes, and there is only one intermediate-code rate outer component code or no intermediate-code rate outer component code in the X outer component codes. Therefore, parallel decoding may be performed on the higher-code rate outer component code and the lower-code rate outer component code when decoding is performed at a decoder, thereby reducing a decoding delay and improving a decoding throughput.

Figure 7:
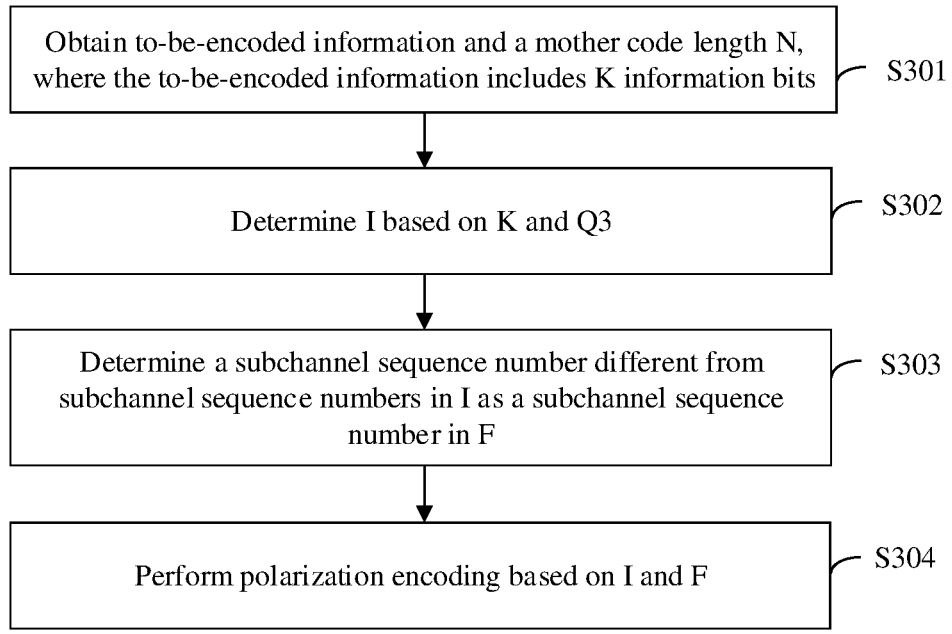
FIG. 7 is a flowchart of an embodiment of an encoding method according to this application.

FIG. 7 is a flowchart of an embodiment of an encoding method according to this application. An execution body of this embodiment may be a sending device such as a base station or a terminal. In this embodiment, description is provided by using an example in which I is determined based on K and Q3. As shown in FIG. 7, the method in this embodiment may include the following steps.

S301: Obtain to-be-encoded information and a mother code length N, where the to-be-encoded information includes K information bits.

S302: Determine I based on K and Q3.

S303: Determine a subchannel sequence number different from subchannel sequence numbers in I as a subchannel sequence number in F.

S304: Perform polarization encoding based on I and F.

After I and F are determined, values of bits on the subchannels are determined. For example, information bits are placed according to I, frozen bits are placed according to F, and polarization encoding is performed on all the determined bits, to obtain a bit sequence after the encoding.

In an implementation, Q3 in S302 may be determined based on Q1 and Q2, and correspondingly, before S302, the method may further include the following steps.

S305: Determine Q1 and Q2 based on Q, B, LB*B, and HB*B.

For the determining Q1 and Q2 based on Q, B, LB*B, and HB*B, refer to the description of S202 in the embodiment shown in FIG. 6. Details are not described herein again.

S306: Determine Q3 based on Q1 and Q2.

In an implementation, in S304, current first subchannel sequence numbers of Q1 and Q2 may be compared, and a subchannel sequence number with lower (or higher) reliability is extracted and placed at a current tail of the Q3 sequence, until all elements in Q1 and Q2 are extracted. If the mother code length N is less than the maximum mother code length $N_{max}$, when subchannel sequence numbers are extracted from Q1 and Q2, only a subchannel sequence number less than or equal to N is extracted (where if the Q sequence starts from 0, only a subchannel sequence number smaller than N is extracted), and a subchannel sequence number greater than N is discarded (where if the Q sequence starts from 0, a subchannel sequence number greater than or equal to N is discarded).

Further, Q2 may be a reliability sequence. When a length of Q2 is relatively long, Q2 may further include a plurality of subsequences, that is, Q2 may be divided into the plurality of subsequences. In an implementation, Q2 includes P subsequences $Q2_1, Q2_2, \ldots,$ and $Q2_p$, where P is a positive integer. In this case, S304 may be correspondingly: determining Q3 based on N, Q1, $Q2_1, Q2_2, \ldots,$ and $Q2_p$. When Q3 is determined based on N, Q1, $Q2_1, Q2_2, \ldots,$ and $Q2_p$, subchannel sequence numbers may be sequentially extracted from Q1, $Q2_1, Q2_2, \ldots,$ and $Q2_p$ to form Q3. In an implementation, current first subchannel sequence numbers of Q1, $Q2_1, Q2_2, \ldots,$ and $Q2_p$ may be compared, and a subchannel sequence number with lower (or higher) reliability is extracted and placed at a current tail of the Q3 sequence, until all elements in Q1, $Q2_1, Q2_2, \ldots,$ and $Q2_p$ are extracted. If the mother code length N is less than the maximum mother code length $N_{max}$, when subchannel sequence numbers are extracted from Q1, $Q2_1, Q2_2, \ldots,$ and $Q2_p$, only a subchannel sequence number less than or equal to N is extracted (where if the Q sequence starts from 0, only a subchannel sequence number smaller than N is extracted), and a subchannel sequence number greater than N is discarded (where if the Q sequence starts from 0, a subchannel sequence number greater than or equal to N is discarded).

Figure 8:
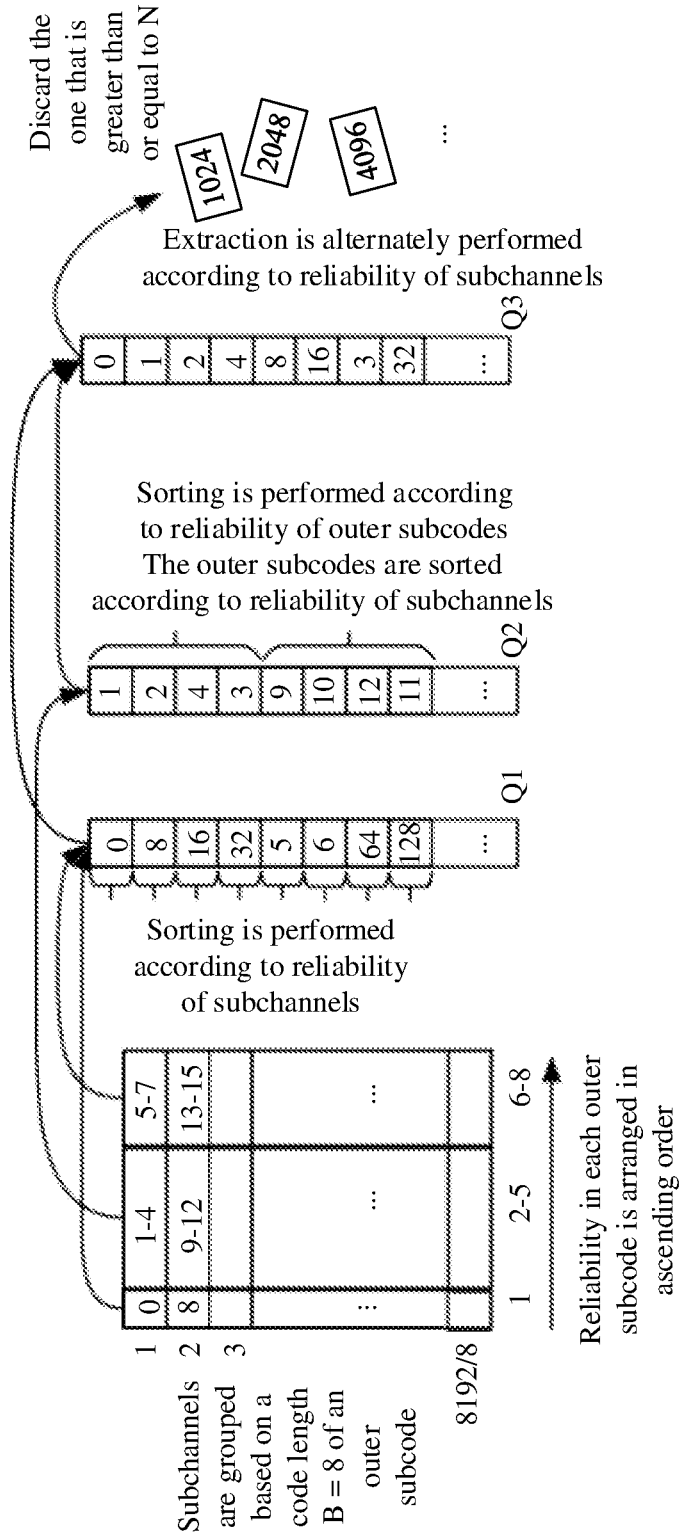
FIG. 8 is a schematic diagram of determining processes of Q1, Q2, and Q3 when $N_{max}=8192$, $N=1024$, $B=8$, $LB*B=1$, and $HB*B=6$.
Figure 9:
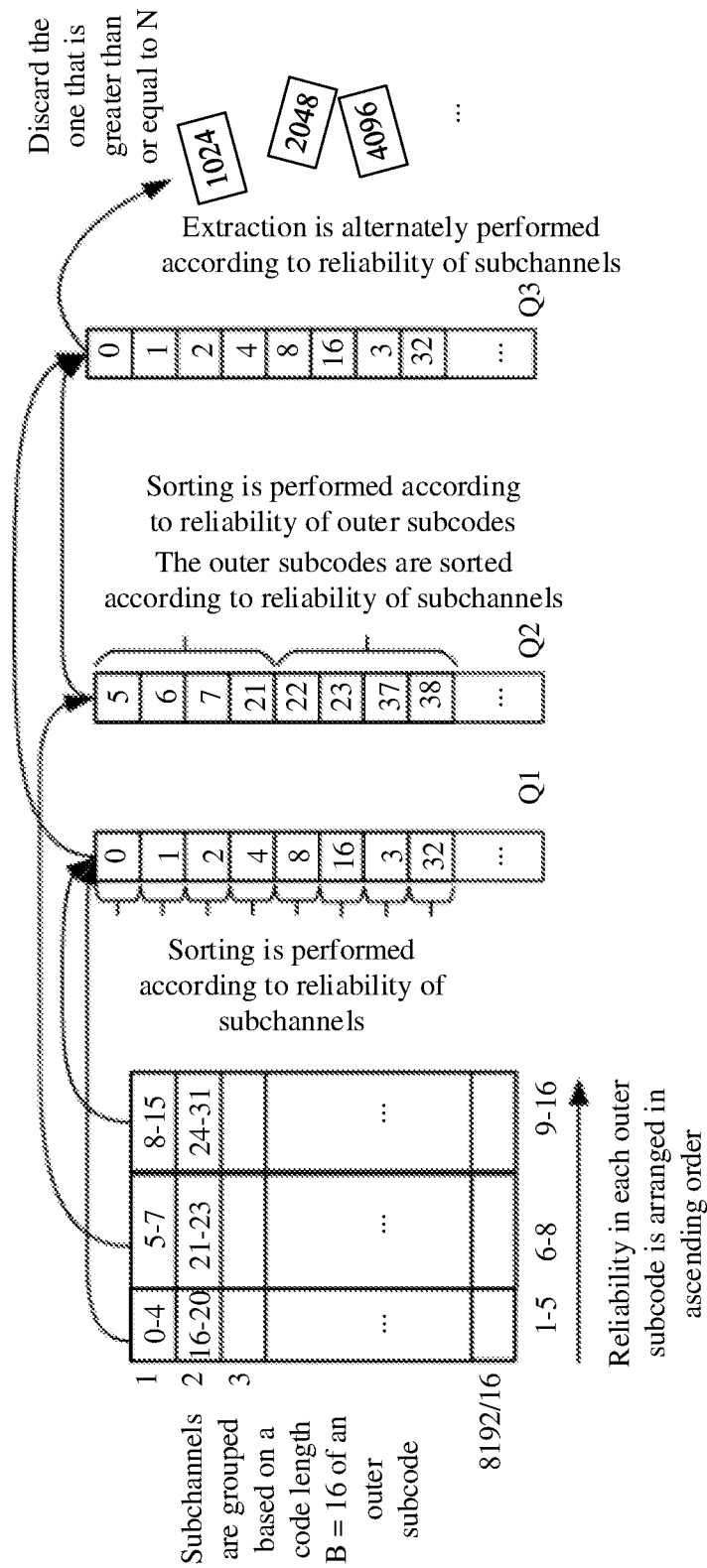
FIG. 9 is a schematic diagram of determining processes of Q1, Q2, and Q3 when $N_{max}=8192$, $N=1024$, $B=16$, $LB*B=5$, and $HB*B=9$.
Figure 10:
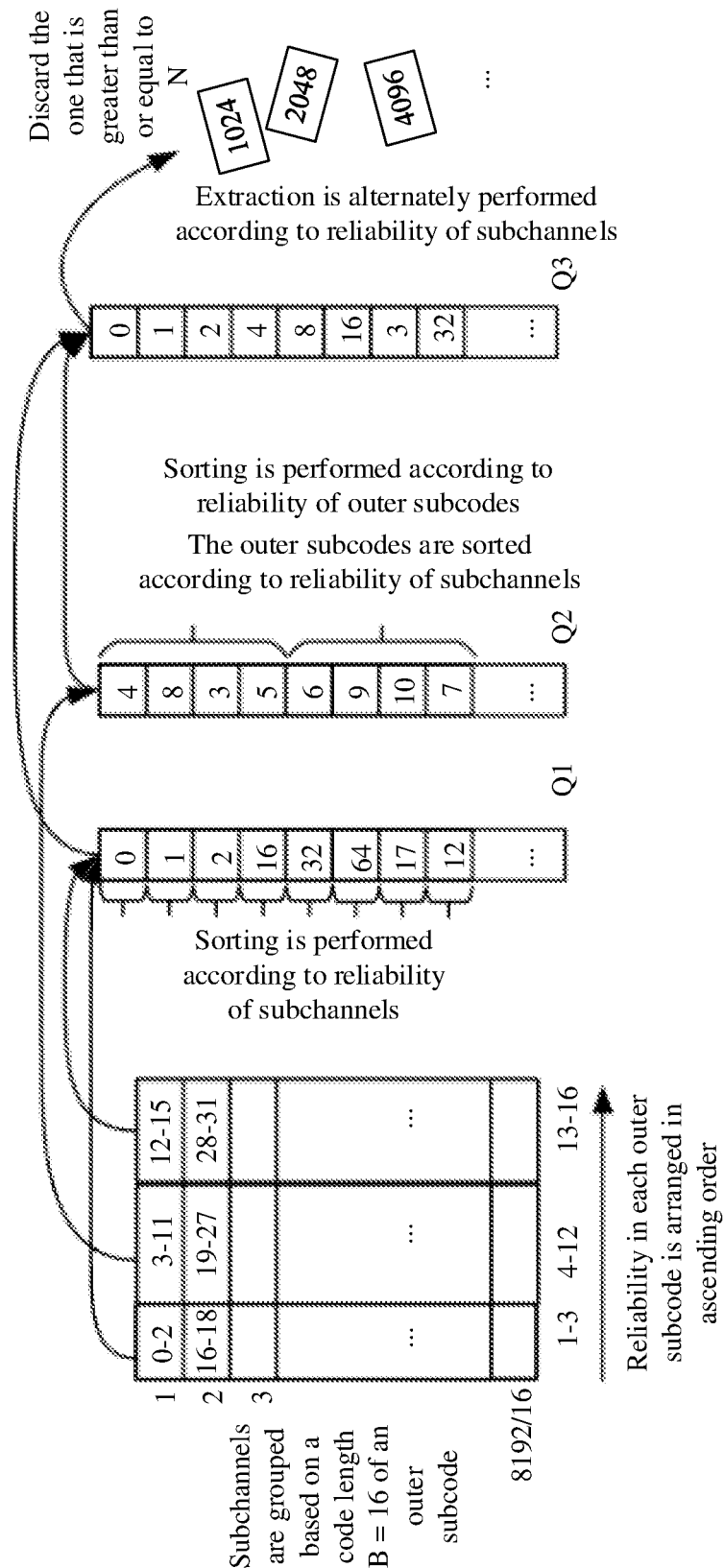
FIG. 10 is a schematic diagram of determining processes of Q1, Q2, and Q3 when $N_{max}=8192$, $N=1024$, $B=16$, $LB*B=3$, and $HB*B=13$.

The following describes determining processes of Q1, Q2, and Q3 in cases of different parameters (including $N_{max}$, N, B=8, LB*B, and HB*B) with reference to FIG. 8 to FIG. 10. FIG. 8 is a schematic diagram of a determining process of Q1, Q2, and Q3 when $N_{max}$=8192, N=1024, B=8, LB*B=1, and HB*B=6. As shown in FIG. 8, in this embodiment, an example in which $N_{max}$=8192, N=1024, B=8, LB*B=1, and HB*B=6 is used.

$$\frac{N_{max}}{B} = 1024.\ 8192$$

subchannels in Q are grouped based on a code length B=8 of an outer component code, to obtain $$\frac{N_{max}}{B} = 1024$$

outer component codes. Reliability in each outer component code is arranged in ascending order, LB*B=1, there is one subchannel sequence number with reliability less than or equal to LB*B in the outer component code, HB*B=6, there are three subchannel sequence numbers with reliability (where the reliability is sorted from 6 to 8) greater than or equal to HB*B in the outer component code, and there are four subchannel sequence numbers with reliability (where the reliability is sorted from 2 to 5) greater than 1 and less than 6 in the outer component code. A sum of lengths of Q1 and Q2 is 8192. Q1 includes sequence numbers of subchannels whose reliability is less than or equal to 1 in the 1024 outer component codes and sequence numbers of subchannels whose reliability is greater than or equal to 6 in the 1024 outer component codes. Q2 includes sequence numbers of subchannels whose reliability (that is, the reliability is sorted from 2 to 5) is greater than 1 and less than 6 in the 1024 outer component codes. The subchannel sequence numbers in Q1 are sorted according to reliability of subchannels, and a sequence is descending order or ascending order. The subchannel sequence numbers in Q2 are sorted according to reliability of the outer component codes, where subchannel sequence numbers belonging to one outer component code are consecutive in Q2 and are arranged according to reliability, that is, sorting is performed according to reliability of the subchannels in the outer component codes. For determining of the reliability of the outer component codes, refer to the description in Manner 1 in the foregoing embodiment. Details are not described herein again.

Then, Q3 is determined based on Q1 and Q2. Current first subchannel sequence numbers of Q1 and Q2 may be compared, and a subchannel sequence number with lower (or higher) reliability is extracted and placed at a current tail of the Q3 sequence, until all elements in Q1 and Q2 are extracted. If a mother code length 1024 is less than the maximum mother code length 8192, when subchannel sequence numbers are extracted from Q1 and Q2, only a subchannel sequence number less than or equal to 1024 is extracted (where if the Q sequence starts from 0, only a subchannel sequence number smaller than 1024 is extracted), and a subchannel sequence number greater than 1024 is discarded (where if the Q sequence starts from 0, a subchannel sequence number greater than or equal to 1024 is discarded). In this way, Q3 is obtained.

FIG. 9 is a schematic diagram of determining processes of Q1, Q2, and Q3 when $N_{max}$=8192, N=1024, B=16, LB*B=5, and HB*B=9. As shown in FIG. 9, an example in which $N_{max}$=8192, N=1024, B=16, LB*B=5, and HB*B=9 is used.

$$\frac{N_{max}}{B} = 512.\ 8192$$

subchannels in Q are grouped based on a code length B=16 of an outer component code, to obtain $$\frac{N_{max}}{B} = 512$$

outer component codes. Reliability in each outer component code is arranged in ascending order, LB*B=5, there are five subchannel sequence number with reliability less than or equal to LB*B in the outer component code, HB*B=9, there are eight subchannel sequence numbers with reliability (where the reliability is sorted from 9 to 16) greater than or equal to HB*B in the outer component code, and there are three subchannel sequence numbers with reliability (where the reliability is sorted from 6 to 8) greater than 5 and less than 9 in the outer component code. A sum of lengths of Q1 and Q2 is 8192. Q1 includes sequence numbers of subchannels whose reliability is less than or equal to 5 in the 1024 outer component codes and sequence numbers of subchannels whose reliability is greater than or equal to 9 in the 1024 outer component codes. Q2 includes sequence numbers of subchannels whose reliability (that is, the reliability is sorted from 6 to 8) is greater than 5 and less than 9 in the 1024 outer component codes. The subchannel sequence numbers in Q1 are sorted according to reliability of subchannels, and a sequence is descending order or ascending order. The subchannel sequence numbers in Q2 are sorted according to reliability of the outer component codes, where subchannel sequence numbers belonging to one outer component code are consecutive in Q2 and are sorted according to reliability, that is, sorting is performed according to reliability of the subchannels in the outer component codes. For determining of the reliability of the outer component codes, refer to the description in Manner 1 in the foregoing embodiment. Details are not described herein again.

Then, Q3 is determined based on Q1 and Q2. Current first subchannel sequence numbers of Q1 and Q2 may be compared, and a subchannel sequence number with lower (or higher) reliability is extracted and placed at a current tail of the Q3 sequence, until all elements in Q1 and Q2 are extracted. If a mother code length 1024 is less than the maximum mother code length 8192, when subchannel sequence numbers are extracted from Q1 and Q2, only a subchannel sequence number less than or equal to 1024 is extracted (where if the Q sequence starts from 0, only a subchannel sequence number smaller than 1024 is extracted), and a subchannel sequence number greater than 1024 is discarded (where if the Q sequence starts from 0, a subchannel sequence number greater than or equal to 1024 is discarded). In this way, Q3 is obtained.

FIG. 10 is a schematic diagram of determining processes of Q1, Q2, and Q3 when $N_{max}$=8192, N=1024, B=16, LB*B=3, and HB*B=13. As shown in FIG. 10, an example in which $N_{max}$=8192, N=1024, B=16, LB*B=3, and HB*B=13 is used.

$$\frac{N_{max}}{B} = 512.\ 8192$$

subchannels in Q are grouped based on a code length B=16 of an outer component code, to obtain $$\frac{N_{max}}{B} = 512$$

outer component codes. Reliability in each outer component code is arranged in ascending order, LB*B=3, there are three subchannel sequence number with reliability less than or equal to LB*B in the outer component code, HB*B=13, there are four subchannel sequence numbers with reliability (where the reliability is sorted from 13 to 16) greater than or equal to HB*B in the outer component code, and there are nine subchannel sequence numbers with reliability (where the reliability is sorted from 4 to 12) greater than 3 and less than 13 in the outer component code. A sum of lengths of Q1 and Q2 is 8192. Q1 includes sequence numbers of subchannels whose reliability is less than or equal to 3 in the 1024 outer component codes and sequence numbers of subchannels whose reliability is greater than or equal to 13 in the 1024 outer component codes. Q2 includes sequence numbers of subchannels whose reliability (that is, the reliability is sorted from 4 to 12) is greater than 3 and less than 13 in the 1024 outer component codes. The subchannel sequence numbers in Q1 are sorted according to reliability of subchannels, and a sequence is descending order or ascending order. The subchannel sequence numbers in Q2 are sorted according to reliability of the outer component codes, where subchannel sequence numbers belonging to one outer component code are consecutive in Q2 and are sorted according to reliability, that is, sorting is performed according to reliability of the subchannels in the outer component codes. For determining of the reliability of the outer component codes, refer to the description in Manner 1 in the foregoing embodiment. Details are not described herein again.

Then, Q3 is determined based on Q1 and Q2. Current first subchannel sequence numbers of Q1 and Q2 may be compared, and a subchannel sequence number with lower (or higher) reliability is extracted and placed at a current tail of the Q3 sequence, until all elements in Q1 and Q2 are extracted. If a mother code length 1024 is less than the maximum mother code length 8192, when subchannel sequence numbers are extracted from Q1 and Q2, only a subchannel sequence number less than or equal to 1024 is extracted (where if the Q sequence starts from 0, only a subchannel sequence number smaller than 1024 is extracted), and a subchannel sequence number greater than 1024 is discarded (where if the Q sequence starts from 0, a subchannel sequence number greater than or equal to 1024 is discarded). In this way, Q3 is obtained.

In this embodiment, Q3 may be stored after Q3 is determined based on Q1 and Q2, and may be directly used in subsequent encoding.

In another implementation, Q3 may be preconfigured. Q3 is preconfigured for both a sending device and a receiving device.

Optionally, S302 may be: extracting the K subchannel sequence numbers with the highest reliability from Q3 to form I, where the information bits corresponding to the subchannel sequence numbers in I determined in this manner are distributed in the X outer component codes, and the X outer component codes include the first-type outer component code (namely, lower-code rate outer component code), the second-type outer component code (namely, higher-code rate outer component code), and one third-type outer component code (namely, intermediate-code rate outer component code), that is, there is only one intermediate-code rate outer component code.

In the encoding method provided in this embodiment, after the to-be-encoded information including K information bits and the mother code length N are obtained, I is determined based on K and Q3, and Q3 may be determined based on Q1 and Q2 or may be preconfigured. The elements in I are K subchannel sequence numbers with the highest reliability in Q3. The information bits corresponding to the subchannel sequence numbers in I determined in this manner are distributed in the X outer component codes, and there is only one intermediate-code rate outer component code in the X outer component codes. Therefore, parallel decoding may be performed on the higher-code rate outer component code and the lower-code rate outer component code when decoding is performed at a decoder, thereby reducing a decoding delay and improving a decoding throughput.

It should be noted that the code rate thresholds LB and HB are used as examples for description in all the foregoing embodiments. In another embodiment, two thresholds KL and KH may be specified for a quantity m of subchannel sequence numbers of information bits in one outer component code. KL=LB*B, and KH=HB*B. Correspondingly, if the two thresholds KL and KH are specified for the quantity m of subchannel sequence numbers of the information bits in one outer component code, in S102, the quantity m of the subchannel sequence numbers of the information bits in the first-type outer component code is less than or equal to the first threshold KL, m in the second-type outer component code is greater than or equal to the second threshold KH, and m in the third-type outer component code is greater than KL and less than KH. KL+1<KH, KH is less than or equal to a length B of the outer component code, and K, N, X, m, KL, KH, and B are positive integers.

In Manner 1 in the foregoing embodiment, when I is determined based on K, the first reliability sequence Q1, and the second reliability sequence Q2, a sum of lengths of Q1 and Q2 is the maximum mother code length $N_{max}$. Q1 includes sequence numbers of subchannels whose reliability is less than or equal to KL in the $$\frac{N_{max}}{B}$$

outer component codes and sequence numbers of subchannels whose reliability is greater than or equal to KH in the $$\frac{N_{max}}{B}$$

outer component codes. Q2 includes sequence numbers of subchannels whose reliability is greater than KL and less than KH in the $$\frac{N_{max}}{B}$$

outer component codes.

The subchannel sequence numbers in Q1 are arranged in first order according to reliability of subchannels, where the first order is descending order or ascending order. The subchannel sequence numbers in Q2 are arranged in the first order according to reliability of outer component codes, where subchannel sequence numbers belonging to one outer component code are consecutive in Q2 and are arranged in the first order according to reliability.

Q1 and Q2 may be determined based on Q, B, KL, and KH, where Q is a reliability sequence of subchannels corresponding to $N_{max}$.

Alternatively, Q1 and Q2 may be preconfigured.

In Manner 1, B, KL, and KH may be predefined.

B, LB, and HB are indicated through indication information.

In Manner 3, when I and F are determined based on N, K, B, KL, and KH by using the code rate allocation method, the first condition is any one of the following:

$$0 \le R_{x-} \le R_{x+} \le \frac{KL}{B};$$

$$0 \le R_{x-} \le \frac{KL}{B} < \frac{KH}{B} \le R_{x+} \le 1; \text{ or}$$

$$\frac{KH}{B} \le R_{x-} \le R_{x+} \le 1.$$

When $$0 \le R_{x-} \le R_{x+} \le \frac{KL}{B},$$

that is, $R_{x-}$ is greater than or equal to 0 and less than or equal to $$\frac{KL}{B},$$

$R_{x+}$ is greater than or equal to 0 and less than or equal to $$\frac{KL}{B},$$

and $R_{x-}$ is less than or equal to $R_{x+}$, when the code rate is 0, $R_{x-}$ may be equal to $R_{x+}$. When $$\frac{KH}{B} \le R_{x-} \le R_{x+} \le 1,$$

that is, $R_{x-}$ is greater than or equal to $$\frac{KH}{B}$$

and less than or equal to 1, $R_{x+}$ is greater than or equal to $$\frac{KH}{B}$$

and less than or equal to 1, and $R_{x-}$ is less than or equal to $R_{x+}$, when the code rate is 1, $R_-$ may be equal to $R_+$. When $$0 \le R_{x-} \le \frac{KL}{B} < \frac{KH}{B} \le R_{x+} \le 1,$$

that is, $R_{x-}$ is greater than or equal to 0 and less than or equal to $$\frac{KL}{B},$$

and $R_{x+}$ is greater than or equal to $$\frac{KH}{B}$$

and less than or equal to 1, LB is less than $$\frac{KH}{B}.$$

It should be noted that other method process descriptions and beneficial effects are the same as those in the foregoing embodiment, and details are not described herein again.

In the foregoing embodiment, Q1, Q2, or Q3 may be preconfigured, and may be directly used during encoding. Examples of Q1, Q2, and Q3 in cases of several different parameters are shown below, where the parameters include: $N_{max}$, B, KL, and KH. It may be understood that the parameters may alternatively include $N_{max}$, B, LB*B, and HB*B. After the to-be-encoded information including the K information bits and the mother code length N are obtained, when corresponding Q1, Q2, and Q3 in cases of six different parameters shown below are directly used during encoding, I may be determined based on K, Q1, and Q2, or I is determined based on K and Q3. The information bits corresponding to subchannel sequence numbers in I determined in the two manners are distributed in X outer component codes, and there is only one intermediate-code rate outer component code or no intermediate-code rate outer component code in the X outer component codes. Therefore, parallel decoding may be performed on a higher-code rate outer component code and a lower-code rate outer component code when decoding is performed at a decoder. This reduces decoding complexity, reduces a decoding delay, and improves a decoding throughput, and decoding performance is better.

In an implementation, when $N_{max}$=1024, B=8, KL=1, and KH=6, corresponding Q1, Q2, and Q3 are as follows.

Q3=[0, 1, 2, 4, 8, 16, 32, 3, 5, 64, 9, 6, 10, 128, 12, 256, 24, 7, 512, 11, 17, 18, 20, 40, 19, 33, 34, 36, 13, 48, 14, 72, 21, 35, 65, 66, 68, 80, 37, 22, 136, 264, 38, 96, 67, 129, 130, 132, 144, 69, 272, 160, 520, 288, 528, 192, 544, 70, 131, 257, 258, 260, 15, 320, 133, 23, 134, 384, 56, 39, 259, 26, 25, 28, 27, 513, 514, 516, 261, 29, 515, 41, 42, 44, 43, 49, 50, 52, 88, 30, 71, 262, 576, 45, 640, 51, 74, 73, 76, 46, 75, 81, 82, 84, 517, 104, 53, 152, 77, 768, 518, 54, 83, 137, 138, 140, 112, 135, 78, 85, 168, 139, 97, 98, 100, 99, 145, 146, 148, 86, 280, 141, 101, 147, 161, 162, 164, 176, 142, 31, 200, 263, 149, 102, 304, 296, 163, 265, 266, 268, 47, 267, 273, 274, 276, 208, 150, 165, 55, 328, 536, 79, 269, 224, 166, 519, 552, 270, 275, 193, 194, 196, 195, 57, 58, 60, 59, 521, 522, 524, 523, 289, 290, 292, 291, 529, 530, 532, 560, 277, 87, 197, 61, 531, 89, 90, 92, 525, 278, 526, 293, 91, 321, 322, 324, 584, 198, 120, 336, 62, 143, 103, 294, 93, 592, 323, 545, 546, 548, 392, 151, 648, 94, 400, 608, 352, 325, 533, 547, 105, 106, 108, 107, 153, 154, 156, 155, 385, 386, 388, 109, 184, 534, 167, 326, 157, 656, 110, 117, 776, 549, 387, 113, 114, 116, 115, 577, 578, 580, 216, 416, 271, 279, 158, 550, 672, 118, 579, 169, 170, 172, 171, 641, 642, 644, 389, 173, 199, 784, 312, 704, 390, 174, 581, 448, 63, 527, 582, 181, 295, 285, 232, 205, 182, 643, 177, 178, 180, 179, 281, 282, 284, 283, 201, 202, 204, 203, 297, 298, 300, 286, 299, 769, 770, 772, 344, 645, 535, 240, 206, 95, 327, 800, 301, 213, 568, 832, 646, 896, 302, 771, 209, 210, 212, 211, 305, 306, 308, 307, 537, 538, 540, 360, 539, 225, 226, 228, 227, 329, 330, 332, 111, 331, 337, 338, 340, 214, 309, 408, 551, 229, 159, 310, 541, 773, 333, 119, 600, 339, 553, 554, 556, 368, 230, 391, 542, 334, 555, 121, 122, 124, 774, 175, 123, 393, 394, 396, 341, 424, 395, 353, 354, 356, 583, 355, 561, 562, 564, 287, 183, 125, 557, 616, 342, 563, 585, 586, 588, 397, 207, 558, 432, 357, 664, 624, 587, 401, 402, 404, 403, 185, 186, 188, 187, 593, 594, 596, 126, 565, 398, 456, 358, 405, 303, 595, 417, 418, 420, 189, 566, 589, 215, 647, 419, 649, 650, 652, 406, 464, 680, 590, 597, 311, 598, 651, 217, 218, 220, 219, 609, 610, 612, 421, 792, 611, 449, 450, 452, 231, 688, 653, 248, 190, 654, 335, 480, 221, 613, 422, 451, 657, 658, 660, 659, 313, 314, 316, 315, 233, 234, 236, 614, 543, 235, 777, 778, 780, 343, 775, 317, 222, 453, 237, 559, 712, 661, 808, 779, 673, 674, 676, 720, 816, 662, 454, 318, 675, 241, 242, 244, 243, 345, 346, 348, 347, 785, 786, 788, 781, 376, 736, 567, 840, 238, 359, 399, 787, 705, 706, 708, 591, 678, 677, 349, 245, 127, 191, 782, 407, 246, 707, 569, 570, 572, 571, 361, 362, 364, 363, 409, 410, 412, 350, 599, 790, 573, 411, 801, 802, 804, 803, 601, 602, 604, 789, 709, 365, 440, 374, 423, 574, 413, 603, 369, 370, 372, 371, 425, 426, 428, 366, 655, 805, 615, 710, 429, 373, 605, 848, 632, 806, 427, 833, 834, 836, 904, 414, 223, 663, 835, 617, 618, 620, 619, 433, 434, 436, 472, 455, 837, 864, 606, 912, 696, 435, 665, 666, 668, 319, 621, 430, 838, 667, 457, 458, 460, 488, 239, 459, 897, 898, 900, 622, 437, 461, 496, 669, 679, 629, 351, 438, 462, 469, 247, 899, 625, 626, 628, 627, 465, 466, 468, 467, 681, 682, 684, 683, 249, 250, 252, 251, 689, 690, 692, 670, 783, 728, 928, 791, 367, 901, 630, 685, 711, 253, 691, 793, 794, 796, 824, 902, 686, 375, 470, 415, 485, 795, 481, 482, 484, 483, 713, 714, 716, 744, 960, 693, 797, 715, 809, 810, 812, 807, 694, 254, 717, 575, 798, 811, 721, 722, 724, 431, 607, 723, 377, 378, 380, 379, 817, 818, 820, 486, 718, 813, 856, 839, 725, 752, 819, 841, 842, 844, 814, 439, 623, 671, 463, 843, 737, 738, 740, 739, 442, 441, 444, 381, 821, 726, 872, 631, 443, 849, 850, 852, 741, 845, 920, 382, 822, 851, 633, 634, 636, 880, 742, 445, 471, 635, 905, 906, 908, 687, 903, 846, 446, 936, 853, 637, 907, 473, 474, 476, 475, 865, 866, 868, 867, 913, 914, 916, 487, 695, 854, 504, 799, 255, 909, 719, 477, 915, 697, 698, 700, 638, 944, 869, 699, 489, 490, 492, 491, 929, 930, 932, 478, 968, 383, 910, 815, 976, 870, 917, 727, 493, 701, 931, 497, 498, 500, 499, 729, 730, 732, 731, 961, 962, 964, 823, 918, 502, 933, 743, 760, 494, 702, 501, 847, 992, 447, 733, 934, 963, 825, 826, 828, 827, 745, 746, 748, 747, 753, 754, 756, 855, 734, 829, 965, 749, 966, 755, 857, 858, 860, 859, 873, 874, 876, 830, 911, 871, 639, 888, 479, 750, 861, 757, 919, 875, 922, 921, 924, 862, 758, 923, 881, 882, 884, 877, 952, 495, 703, 935, 883, 937, 938, 940, 503, 925, 878, 735, 885, 939, 505, 506, 508, 926, 941, 967, 886, 831, 507, 945, 946, 948, 947, 969, 970, 972, 984, 751, 942, 971, 977, 978, 980, 509, 949, 973, 1000, 950, 863, 759, 1008, 510, 979, 761, 762, 764, 763, 993, 994, 996, 974, 879, 981, 982, 927, 995, 889, 890, 892, 765, 887, 997, 943, 891, 953, 954, 956, 998, 766, 511, 951, 893, 975, 894, 955, 985, 986, 988, 957, 983, 958, 987, 1001, 1002, 1004, 999, 1016, 767, 989, 1003, 1009, 1010, 1012, 990, 1005, 959, 1011, 1013, 895, 1006, 1014, 1017, 1018, 991, 1020, 1007, 1015, 1019, 1021, 1022, 1023].

Q1=[0, 8, 16, 32, 5, 64, 6, 128, 256, 24, 7, 512, 40, 13, 48, 14, 72, 21, 80, 37, 22, 136, 264, 38, 96, 144, 69, 272, 160, 520, 288, 528, 192, 544, 70, 15, 320, 133, 23, 134, 384, 56, 39, 261, 29, 88, 30, 71, 262, 576, 45, 640, 46, 517, 104, 53, 152, 77, 768, 518, 54, 112, 135, 78, 85, 168, 86, 280, 141, 101, 176, 142, 31, 200, 263, 149, 102, 304, 296, 47, 208, 150, 165, 55, 328, 536, 79, 269, 224, 166, 519, 552, 270, 560, 277, 87, 197, 61, 525, 278, 526, 293, 584, 198, 120, 336, 62, 143, 103, 294, 93, 592, 392, 151, 648, 94, 400, 608, 352, 325, 533, 109, 184, 534, 167, 326, 157, 656, 110, 117, 776, 549, 216, 416, 271, 279, 158, 550, 672, 118, 389, 173, 199, 784, 312, 704, 390, 174, 581, 448, 63, 527, 582, 181, 295, 285, 232, 205, 182, 286, 344, 645, 535, 240, 206, 95, 327, 800, 301, 213, 568, 832, 646, 896, 302, 360, 111, 214, 309, 408, 551, 229, 159, 310, 541, 773, 333, 119, 600, 368, 230, 391, 542, 334, 774, 175, 341, 424, 583, 287, 183, 125, 557, 616, 342, 397, 207, 558, 432, 357, 664, 624, 126, 565, 398, 456, 358, 405, 303, 189, 566, 589, 215, 647, 406, 464, 680, 590, 597, 311, 598, 421, 792, 231, 688, 653, 248, 190, 654, 335, 480, 221, 613, 422, 614, 543, 343, 775, 317, 222, 453, 237, 559, 712, 661, 808, 720, 816, 662, 454, 318, 781, 376, 736, 567, 840, 238, 359, 399, 591, 678, 677, 349, 245, 127, 191, 782, 407, 246, 350, 599, 790, 573, 789, 709, 365, 440, 374, 423, 574, 413, 366, 655, 805, 615, 710, 429, 373, 605, 848, 632, 806, 904, 414, 223, 663, 472, 455, 837, 864, 606, 912, 696, 319, 621, 430, 838, 488, 239, 622, 437, 461, 496, 669, 679, 351, 438, 462, 469, 247, 670, 783, 728, 928, 791, 367, 901, 630, 685, 711, 253, 824, 902, 686, 375, 470, 415, 485, 744, 960, 693, 797, 807, 694, 254, 717, 575, 798, 431, 607, 486, 718, 813, 856, 839, 725, 752, 814, 439, 623, 671, 463, 381, 821, 726, 872, 631, 741, 845, 920, 382, 822, 880, 742, 445, 471, 687, 903, 846, 446, 936, 853, 637, 487, 695, 854, 504, 799, 255, 909, 719, 477, 638, 944, 869, 478, 968, 383, 910, 815, 976, 870, 917, 727, 493, 701, 823, 918, 502, 933, 743, 760, 494, 702, 501, 847, 992, 447, 733, 934, 855, 734, 829, 965, 749, 966, 830, 911, 871, 639, 888, 479, 750, 861, 757, 919, 862, 758, 877, 952, 495, 703, 935, 503, 925, 878, 735, 885, 926, 941, 967, 886, 831, 984, 751, 942, 509, 949, 973, 1000, 950, 863, 759, 1008, 510, 974, 879, 981, 982, 927, 765, 887, 997, 943, 998, 766, 511, 951, 893, 975, 894, 957, 983, 958, 999, 1016, 767, 989, 990, 1005, 959, 1013, 895, 1006, 1014, 991, 1007, 1015, 1021, 1022, 1023].

Q2=[1, 2, 4, 3, 9, 10, 12, 11, 17, 18, 20, 19, 33, 34, 36, 35, 65, 66, 68, 67, 129, 130, 132, 131, 257, 258, 260, 259, 26, 25, 28, 27, 513, 514, 516, 515, 41, 42, 44, 43, 49, 50, 52, 51, 74, 73, 76, 75, 81, 82, 84, 83, 137, 138, 140, 139, 97, 98, 100, 99, 145, 146, 148, 147, 161, 162, 164, 163, 265, 266, 268, 267, 273, 274, 276, 275, 193, 194, 196, 195, 57, 58, 60, 59, 521, 522, 524, 523, 289, 290, 292, 291, 529, 530, 532, 531, 89, 90, 92, 91, 321, 322, 324, 323, 545, 546, 548, 547, 105, 106, 108, 107, 153, 154, 156, 155, 385, 386, 388, 387, 113, 114, 116, 115, 577, 578, 580, 579, 169, 170, 172, 171, 641, 642, 644, 643, 177, 178, 180, 179, 281, 282, 284, 283, 201, 202, 204, 203, 297, 298, 300, 299, 769, 770, 772, 771, 209, 210, 212, 211, 305, 306, 308, 307, 537, 538, 540, 539, 225, 226, 228, 227, 329, 330, 332, 331, 337, 338, 340, 339, 553, 554, 556, 555, 121, 122, 124, 123, 393, 394, 396, 395, 353, 354, 356, 355, 561, 562, 564, 563, 585, 586, 588, 587, 401, 402, 404, 403, 185, 186, 188, 187, 593, 594, 596, 595, 417, 418, 420, 419, 649, 650, 652, 651, 217, 218, 220, 219, 609, 610, 612, 611, 449, 450, 452, 451, 657, 658, 660, 659, 313, 314, 316, 315, 233, 234, 236, 235, 777, 778, 780, 779, 673, 674, 676, 675, 241, 242, 244, 243, 345, 346, 348, 347, 785, 786, 788, 787, 705, 706, 708, 707, 569, 570, 572, 571, 361, 362, 364, 363, 409, 410, 412, 411, 801, 802, 804, 803, 601, 602, 604, 603, 369, 370, 372, 371, 425, 426, 428, 427, 833, 834, 836, 835, 617, 618, 620, 619, 433, 434, 436, 435, 665, 666, 668, 667, 457, 458, 460, 459, 897, 898, 900, 899, 625, 626, 628, 627, 465, 466, 468, 467, 681, 682, 684, 683, 249, 250, 252, 251, 689, 690, 692, 691, 793, 794, 796, 795, 481, 482, 484, 483, 713, 714, 716, 715, 809, 810, 812, 811, 721, 722, 724, 723, 377, 378, 380, 379, 817, 818, 820, 819, 841, 842, 844, 843, 737, 738, 740, 739, 442, 441, 444, 443, 849, 850, 852, 851, 633, 634, 636, 635, 905, 906, 908, 907, 473, 474, 476, 475, 865, 866, 868, 867, 913, 914, 916, 915, 697, 698, 700, 699, 489, 490, 492, 491, 929, 930, 932, 931, 497, 498, 500, 499, 729, 730, 732, 731, 961, 962, 964, 963, 825, 826, 828, 827, 745, 746, 748, 747, 753, 754, 756, 755, 857, 858, 860, 859, 873, 874, 876, 875, 922, 921, 924, 923, 881, 882, 884, 883, 937, 938, 940, 939, 505, 506, 508, 507, 945, 946, 948, 947, 969, 970, 972, 971, 977, 978, 980, 979, 761, 762, 764, 763, 993, 994, 996, 995, 889, 890, 892, 891, 953, 954, 956, 955, 985, 986, 988, 987, 1001, 1002, 1004, 1003, 1009, 1010, 1012, 1011, 1017, 1018, 1020, 1019].

In an implementation, when $N_{max}$=1024, B=16, KL=3, and KH=13, corresponding Q1, Q2, and Q3 are as follows.

Q3=[0, 1, 2, 4, 8, 16, 32, 3, 5, 64, 9, 6, 17, 10, 18, 128, 12, 33, 65, 256, 34, 7, 129, 66, 512, 11, 20, 24, 130, 19, 13, 48, 14, 257, 21, 258, 26, 513, 80, 25, 22, 514, 96, 144, 28, 49, 272, 160, 288, 528, 192, 544, 44, 81, 50, 15, 320, 23, 384, 76, 82, 27, 36, 40, 35, 37, 38, 41, 42, 97, 39, 145, 29, 43, 68, 72, 67, 69, 74, 70, 73, 98, 140, 30, 146, 71, 161, 576, 45, 640, 46, 75, 132, 136, 131, 133, 134, 137, 138, 273, 162, 193, 77, 768, 268, 274, 112, 135, 78, 289, 194, 139, 260, 264, 259, 261, 262, 265, 266, 60, 290, 529, 524, 141, 176, 142, 530, 321, 31, 545, 322, 263, 304, 92, 47, 267, 516, 520, 515, 517, 518, 521, 522, 385, 546, 208, 386, 577, 113, 79, 269, 108, 578, 224, 519, 270, 641, 523, 52, 56, 51, 53, 54, 57, 58, 55, 59, 84, 88, 83, 85, 86, 89, 90, 560, 114, 156, 87, 61, 525, 642, 526, 177, 91, 100, 104, 99, 101, 102, 105, 106, 769, 172, 336, 62, 143, 103, 178, 93, 592, 770, 107, 148, 152, 147, 149, 150, 153, 154, 151, 209, 284, 94, 204, 400, 608, 352, 155, 164, 168, 163, 165, 166, 169, 170, 210, 305, 300, 109, 167, 225, 306, 157, 656, 110, 171, 276, 280, 275, 277, 281, 278, 282, 226, 416, 271, 279, 158, 337, 672, 332, 540, 173, 784, 338, 704, 174, 283, 196, 200, 195, 197, 198, 201, 202, 199, 448, 353, 561, 203, 292, 296, 291, 293, 294, 297, 298, 63, 527, 556, 295, 285, 124, 205, 562, 286, 299, 532, 536, 531, 533, 534, 537, 538, 354, 401, 396, 593, 535, 240, 206, 95, 800, 402, 301, 417, 832, 588, 896, 594, 418, 302, 539, 324, 328, 323, 325, 326, 329, 330, 327, 111, 331, 548, 552, 547, 549, 550, 553, 554, 188, 449, 609, 551, 159, 541, 610, 657, 333, 368, 652, 450, 542, 334, 555, 116, 120, 115, 117, 118, 121, 122, 119, 175, 123, 388, 392, 387, 389, 390, 393, 394, 391, 658, 220, 395, 580, 584, 579, 581, 582, 585, 586, 673, 583, 287, 125, 557, 316, 241, 397, 207, 674, 558, 785, 432, 236, 624, 587, 180, 184, 179, 181, 182, 185, 186, 183, 187, 644, 648, 643, 645, 646, 649, 650, 780, 705, 126, 242, 398, 303, 189, 706, 589, 786, 647, 348, 464, 801, 590, 572, 651, 212, 216, 211, 213, 214, 217, 218, 215, 219, 308, 312, 307, 309, 310, 313, 314, 311, 802, 688, 653, 369, 190, 364, 654, 335, 480, 315, 772, 776, 771, 773, 774, 777, 778, 221, 370, 543, 412, 775, 317, 222, 237, 559, 833, 834, 779, 228, 232, 227, 229, 230, 233, 234, 231, 235, 340, 344, 339, 341, 342, 345, 346, 343, 604, 433, 720, 816, 347, 356, 360, 355, 357, 358, 361, 362, 897, 318, 898, 781, 428, 736, 625, 238, 359, 399, 591, 434, 349, 620, 363, 564, 568, 563, 565, 569, 566, 570, 567, 127, 191, 782, 626, 571, 404, 408, 403, 405, 406, 409, 410, 407, 465, 350, 668, 460, 573, 411, 596, 600, 595, 597, 598, 601, 602, 599, 365, 689, 466, 481, 574, 413, 603, 420, 424, 419, 421, 422, 425, 426, 423, 366, 655, 684, 429, 252, 605, 848, 690, 482, 427, 612, 616, 611, 613, 614, 617, 618, 615, 414, 223, 619, 660, 664, 659, 661, 662, 665, 666, 663, 796, 721, 716, 864, 606, 912, 722, 817, 319, 621, 812, 430, 667, 452, 456, 451, 453, 454, 457, 458, 455, 239, 459, 676, 680, 675, 678, 677, 681, 682, 622, 380, 818, 461, 496, 669, 679, 351, 737, 462, 683, 244, 248, 243, 245, 246, 249, 250, 251, 247, 788, 792, 787, 790, 789, 793, 794, 738, 670, 783, 849, 928, 791, 367, 685, 844, 253, 686, 850, 444, 415, 795, 708, 712, 707, 709, 710, 713, 714, 711, 960, 865, 797, 715, 804, 808, 803, 805, 806, 809, 810, 807, 636, 254, 717, 575, 913, 798, 811, 372, 376, 374, 371, 373, 377, 378, 375, 379, 836, 840, 835, 837, 838, 841, 842, 431, 607, 866, 908, 718, 813, 476, 839, 914, 752, 814, 929, 623, 671, 463, 843, 436, 440, 435, 437, 438, 442, 441, 439, 381, 497, 930, 961, 492, 700, 443, 628, 632, 627, 629, 630, 633, 634, 631, 845, 382, 498, 880, 445, 635, 468, 472, 467, 469, 470, 473, 474, 471, 687, 846, 732, 446, 962, 475, 900, 904, 899, 901, 902, 905, 906, 903, 637, 907, 692, 696, 691, 693, 694, 697, 698, 695, 828, 753, 799, 255, 909, 719, 477, 638, 748, 944, 699, 484, 488, 483, 485, 489, 486, 490, 487, 491, 724, 728, 723, 725, 726, 729, 730, 754, 478, 383, 910, 815, 976, 727, 493, 701, 860, 731, 820, 824, 819, 821, 822, 825, 826, 823, 881, 494, 702, 876, 847, 992, 447, 733, 827, 740, 744, 739, 741, 742, 745, 746, 743, 882, 747, 852, 856, 851, 853, 854, 857, 858, 855, 924, 734, 829, 749, 945, 859, 868, 872, 867, 869, 870, 873, 874, 940, 830, 911, 871, 639, 479, 946, 750, 508, 861, 875, 916, 920, 915, 917, 922, 918, 921, 919, 862, 977, 923, 932, 936, 931, 933, 934, 937, 938, 972, 877, 495, 703, 935, 978, 925, 878, 735, 993, 939, 500, 504, 499, 502, 501, 505, 506, 503, 994, 926, 764, 941, 831, 507, 964, 968, 963, 965, 966, 969, 970, 967, 751, 942, 971, 756, 760, 755, 757, 758, 761, 762, 509, 973, 892, 863, 759, 1008, 510, 763, 884, 888, 883, 885, 886, 889, 890, 974, 879, 927, 765, 956, 887, 943, 891, 948, 952, 947, 949, 950, 953, 954, 766, 511, 988, 951, 893, 975, 894, 1009, 955, 980, 984, 979, 981, 982, 985, 986, 1004, 1010, 957, 983, 958, 987, 996, 1000, 995, 997, 998, 1001, 1002, 999, 767, 989, 1003, 1012, 1016, 990, 1005, 959, 1011, 1013, 895, 1006, 1014, 1017, 1018, 991, 1020, 1007, 1015, 1019, 1021, 1022, 1023].

Q1=[0, 1, 2, 16, 32, 64, 17, 18, 128, 12, 33, 65, 256, 34, 129, 66, 512, 130, 13, 48, 14, 257, 258, 513, 80, 514, 96, 144, 28, 49, 272, 160, 288, 528, 192, 544, 44, 81, 50, 15, 320, 384, 76, 82, 97, 145, 29, 98, 140, 30, 146, 161, 576, 45, 640, 46, 273, 162, 193, 77, 768, 268, 274, 112, 78, 289, 194, 60, 290, 529, 524, 141, 176, 142, 530, 321, 31, 545, 322, 304, 92, 47, 385, 546, 208, 386, 577, 113, 79, 269, 108, 578, 224, 270, 641, 560, 114, 156, 61, 525, 642, 526, 177, 769, 172, 336, 62, 143, 178, 93, 592, 770, 209, 284, 94, 204, 400, 608, 352, 210, 305, 300, 109, 225, 306, 157, 656, 110, 226, 416, 271, 158, 337, 672, 332, 540, 173, 784, 338, 704, 174, 448, 353, 561, 63, 527, 556, 285, 124, 205, 562, 286, 354, 401, 396, 593, 240, 206, 95, 800, 402, 301, 417, 832, 588, 896, 594, 418, 302, 111, 188, 449, 609, 159, 541, 610, 657, 333, 368, 652, 450, 542, 334, 175, 658, 220, 673, 287, 125, 557, 316, 241, 397, 207, 674, 558, 785, 432, 236, 624, 780, 705, 126, 242, 398, 303, 189, 706, 589, 786, 348, 464, 801, 590, 572, 802, 688, 653, 369, 190, 364, 654, 335, 480, 221, 370, 543, 412, 317, 222, 237, 559, 833, 834, 604, 433, 720, 816, 897, 318, 898, 781, 428, 736, 625, 238, 399, 591, 434, 349, 620, 127, 191, 782, 626, 465, 350, 668, 460, 573, 365, 689, 466, 481, 574, 413, 366, 655, 684, 429, 252, 605, 848, 690, 482, 414, 223, 796, 721, 716, 864, 606, 912, 722, 817, 319, 621, 812, 430, 239, 622, 380, 818, 461, 496, 669, 351, 737, 462, 738, 670, 783, 849, 928, 367, 685, 844, 253, 686, 850, 444, 415, 960, 865, 797, 636, 254, 717, 575, 913, 798, 431, 607, 866, 908, 718, 813, 476, 914, 752, 814, 929, 623, 671, 463, 381, 497, 930, 961, 492, 700, 845, 382, 498, 880, 445, 687, 846, 732, 446, 962, 637, 828, 753, 799, 255, 909, 719, 477, 638, 748, 944, 754, 478, 383, 910, 815, 976, 493, 701, 860, 881, 494, 702, 876, 847, 992, 447, 733, 882, 924, 734, 829, 749, 945, 940, 830, 911, 639, 479, 946, 750, 508, 861, 862, 977, 972, 877, 495, 703, 978, 925, 878, 735, 993, 994, 926, 764, 941, 831, 751, 942, 509, 973, 892, 863, 1008, 510, 974, 879, 927, 765, 956, 943, 766, 511, 988, 893, 975, 894, 1009, 1004, 1010, 957, 958, 767, 989, 990, 1005, 959, 895, 1006, 991, 1020, 1007, 1021, 1022, 1023].

Q2=[4, 8, 3, 5, 9, 6, 10, 7, 11, 20, 24, 19, 21, 26, 25, 22, 23, 27, 36, 40, 35, 37, 38, 41, 42, 39, 43, 68, 72, 67, 69, 74, 70, 73, 71, 75, 132, 136, 131, 133, 134, 137, 138, 135, 139, 260, 264, 259, 261, 262, 265, 266, 263, 267, 516, 520, 515, 517, 518, 521, 522, 519, 523, 52, 56, 51, 53, 54, 57, 58, 55, 59, 84, 88, 83, 85, 86, 89, 90, 87, 91, 100, 104, 99, 101, 102, 105, 106, 103, 107, 148, 152, 147, 149, 150, 153, 154, 151, 155, 164, 168, 163, 165, 166, 169, 170, 167, 171, 276, 280, 275, 277, 281, 278, 282, 279, 283, 196, 200, 195, 197, 198, 201, 202, 199, 203, 292, 296, 291, 293, 294, 297, 298, 295, 299, 532, 536, 531, 533, 534, 537, 538, 535, 539, 324, 328, 323, 325, 326, 329, 330, 327, 331, 548, 552, 547, 549, 550, 553, 554, 551, 555, 116, 120, 115, 117, 118, 121, 122, 119, 123, 388, 392, 387, 389, 390, 393, 394, 391, 395, 580, 584, 579, 581, 582, 585, 586, 583, 587, 180, 184, 179, 181, 182, 185, 186, 183, 187, 644, 648, 643, 645, 646, 649, 650, 647, 651, 212, 216, 211, 213, 214, 217, 218, 215, 219, 308, 312, 307, 309, 310, 313, 314, 311, 315, 772, 776, 771, 773, 774, 777, 778, 775, 779, 228, 232, 227, 229, 230, 233, 234, 231, 235, 340, 344, 339, 341, 342, 345, 346, 343, 347, 356, 360, 355, 357, 358, 361, 362, 359, 363, 564, 568, 563, 565, 569, 566, 570, 567, 571, 404, 408, 403, 405, 406, 409, 410, 407, 411, 596, 600, 595, 597, 598, 601, 602, 599, 603, 420, 424, 419, 421, 422, 425, 426, 423, 427, 612, 616, 611, 613, 614, 617, 618, 615, 619, 660, 664, 659, 661, 662, 665, 666, 663, 667, 452, 456, 451, 453, 454, 457, 458, 455, 459, 676, 680, 675, 678, 677, 681, 682, 679, 683, 244, 248, 243, 245, 246, 249, 250, 251, 247, 788, 792, 787, 790, 789, 793, 794, 791, 795, 708, 712, 707, 709, 710, 713, 714, 711, 715, 804, 808, 803, 805, 806, 809, 810, 807, 811, 372, 376, 374, 371, 373, 377, 378, 375, 379, 836, 840, 835, 837, 838, 841, 842, 839, 843, 436, 440, 435, 437, 438, 442, 441, 439, 443, 628, 632, 627, 629, 630, 633, 634, 631, 635, 468, 472, 467, 469, 470, 473, 474, 471, 475, 900, 904, 899, 901, 902, 905, 906, 903, 907, 692, 696, 691, 693, 694, 697, 698, 695, 699, 484, 488, 483, 485, 489, 486, 490, 487, 491, 724, 728, 723, 725, 726, 729, 730, 727, 731, 820, 824, 819, 821, 822, 825, 826, 823, 827, 740, 744, 739, 741, 742, 745, 746, 743, 747, 852, 856, 851, 853, 854, 857, 858, 855, 859, 868, 872, 867, 869, 870, 873, 874, 871, 875, 916, 920, 915, 917, 922, 918, 921, 919, 923, 932, 936, 931, 933, 934, 937, 938, 935, 939, 500, 504, 499, 502, 501, 505, 506, 503, 507, 964, 968, 963, 965, 966, 969, 970, 967, 971, 756, 760, 755, 757, 758, 761, 762, 759, 763, 884, 888, 883, 885, 886, 889, 890, 887, 891, 948, 952, 947, 949, 950, 953, 954, 951, 955, 980, 984, 979, 981, 982, 985, 986, 983, 987, 996, 1000, 995, 997, 998, 1001, 1002, 999, 1003, 1012, 1016, 1011, 1013, 1014, 1017, 1018, 1015, 1019].

In an implementation, when $N_{max}$=4096, B=8, KL=1, and KH=6, corresponding Q1, Q2, and Q3 are as follows.

Q3=[0, 1, 2, 4, 8, 16, 32, 3, 5, 64, 9, 6, 10, 128, 12, 256, 24, 7, 512, 11, 17, 18, 20, 40, 19, 33, 34, 36, 13, 48, 14, 72, 21, 35, 65, 66, 68, 80, 37, 22, 136, 264, 38, 96, 67, 129, 130, 132, 144, 69, 272, 160, 520, 288, 528, 192, 544, 70, 131, 257, 258, 260, 15, 320, 133, 23, 134, 384, 56, 39, 259, 26, 25, 28, 27, 513, 514, 516, 261, 29, 515, 41, 42, 44, 43, 49, 50, 52, 88, 30, 71, 262, 2048, 576, 45, 640, 51, 74, 73, 76, 46, 75, 81, 82, 84, 517, 104, 53, 1032, 152, 77, 768, 518, 54, 83, 137, 138, 140, 112, 1024, 135, 78, 85, 168, 139, 97, 98, 100, 99, 145, 146, 148, 86, 280, 141, 1040, 101, 147, 161, 162, 164, 176, 142, 31, 200, 1056, 263, 149, 102, 304, 296, 1030, 163, 265, 266, 268, 47, 267, 1026, 1028, 1025, 208, 150, 165, 55, 328, 1088, 536, 79, 269, 2056, 224, 166, 519, 552, 270, 560, 277, 87, 1152, 197, 2064, 61, 525, 278, 526, 293, 584, 198, 2080, 120, 336, 62, 143, 1029, 103, 294, 93, 592, 392, 2053, 1280, 151, 1027, 273, 274, 276, 275, 193, 194, 196, 195, 57, 58, 60, 59, 521, 522, 524, 523, 289, 290, 292, 291, 529, 530, 532, 531, 89, 90, 92, 91, 2049, 2050, 2052, 2051, 321, 322, 324, 323, 105, 106, 108, 107, 545, 546, 548, 648, 94, 400, 608, 2112, 352, 325, 533, 547, 153, 154, 156, 155, 385, 386, 388, 109, 1048, 184, 534, 167, 326, 2054, 157, 656, 110, 117, 1038, 776, 1064, 549, 387, 113, 114, 116, 115, 577, 578, 580, 216, 416, 271, 279, 158, 550, 672, 118, 579, 169, 170, 172, 171, 1041, 1042, 1044, 1043, 1033, 1034, 1036, 1072, 2176, 389, 173, 1037, 199, 784, 312, 1536, 704, 390, 174, 581, 1046, 448, 1096, 63, 527, 582, 181, 295, 285, 232, 205, 182, 2304, 286, 1045, 1104, 1061, 344, 645, 535, 240, 2072, 206, 95, 327, 800, 2055, 301, 1160, 213, 568, 1120, 832, 1035, 641, 642, 644, 643, 177, 178, 180, 179, 281, 282, 284, 283, 201, 202, 204, 203, 1057, 1058, 1060, 1059, 297, 298, 300, 299, 769, 770, 772, 646, 896, 2560, 302, 771, 209, 210, 212, 211, 305, 306, 308, 307, 1089, 1090, 1092, 1091, 537, 538, 540, 360, 539, 225, 226, 228, 227, 329, 330, 332, 111, 331, 2057, 2058, 2060, 2059, 2065, 2066, 2068, 1168, 214, 309, 1062, 2088, 408, 551, 229, 159, 310, 1093, 541, 1288, 773, 333, 119, 2067, 337, 338, 340, 2061, 600, 339, 1153, 1154, 1156, 1184, 2096, 368, 1031, 230, 391, 542, 334, 2062, 774, 175, 1155, 553, 554, 556, 555, 121, 122, 124, 123, 393, 394, 396, 2120, 341, 2069, 424, 395, 353, 354, 356, 583, 355, 2081, 2082, 2084, 1296, 1094, 287, 183, 125, 557, 1216, 616, 342, 2083, 561, 562, 564, 1157, 563, 1049, 1050, 1052, 1051, 585, 586, 588, 397, 1112, 207, 2128, 558, 432, 1039, 357, 664, 1312, 624, 587, 401, 402, 404, 403, 1281, 1282, 1284, 1080, 2085, 126, 2070, 1063, 565, 398, 2184, 456, 358, 405, 303, 2312, 1544, 1158, 1283, 185, 186, 188, 187, 2113, 2114, 2116, 189, 566, 1054, 2086, 589, 1344, 215, 647, 2144, 2115, 593, 594, 596, 595, 417, 418, 420, 419, 649, 650, 652, 406, 464, 680, 1069, 590, 1286, 1552, 2192, 597, 311, 2117, 598, 651, 217, 218, 220, 219, 609, 610, 612, 421, 792, 611, 1073, 1076, 1074, 1075, 2177, 2178, 2180, 1047, 231, 688, 653, 1128, 248, 1070, 2320, 190, 1568, 654, 2208, 1095, 335, 480, 221, 1285, 613, 2568, 1408, 422, 2336, 1077, 614, 543, 2576, 343, 2240, 775, 317, 2592, 2118, 222, 453, 237, 559, 2179, 1537, 1538, 1540, 1539, 449, 450, 452, 451, 657, 658, 660, 659, 313, 314, 316, 315, 1066, 1065, 1068, 712, 661, 1053, 808, 1541, 720, 816, 1101, 2063, 1176, 2368, 2181, 1136, 662, 2071, 1600, 454, 318, 1110, 2182, 781, 376, 736, 567, 2432, 1192, 1078, 840, 238, 1159, 359, 2104, 399, 591, 678, 677, 2087, 1542, 349, 1102, 245, 127, 1067, 233, 234, 236, 235, 1098, 1100, 1097, 1099, 777, 778, 780, 779, 673, 674, 676, 675, 2305, 2306, 2308, 2307, 241, 242, 244, 243, 345, 346, 348, 347, 1105, 1108, 1106, 1107, 2074, 2073, 2076, 2075, 785, 786, 788, 787, 2561, 2562, 2564, 191, 1125, 782, 407, 2309, 2077, 246, 350, 599, 2563, 705, 706, 708, 707, 1162, 1164, 1161, 1163, 569, 570, 572, 571, 361, 362, 364, 363, 1122, 1121, 1124, 790, 1165, 1320, 1123, 2089, 2090, 2092, 2091, 1169, 1172, 1170, 2136, 1200, 1664, 573, 1171, 409, 410, 412, 411, 801, 802, 804, 803, 601, 602, 604, 2078, 789, 1304, 709, 365, 440, 2119, 374, 1224, 423, 2310, 1174, 574, 413, 2624, 1109, 603, 369, 370, 372, 371, 2097, 2098, 2100, 366, 2093, 1287, 1055, 655, 2688, 805, 615, 1166, 710, 2099, 1186, 1185, 1188, 1187, 425, 426, 428, 429, 373, 605, 1232, 848, 2094, 632, 806, 2565, 427, 1289, 1292, 1290, 2152, 904, 414, 1291, 2122, 2121, 2124, 2123, 833, 834, 836, 2101, 223, 1126, 663, 3080, 835, 617, 618, 620, 1328, 619, 1082, 1081, 1084, 1083, 1298, 1297, 1300, 472, 2200, 455, 2125, 1189, 1248, 837, 2816, 1086, 1302, 1352, 864, 2566, 2102, 1173, 606, 912, 1103, 696, 1424, 2160, 1293, 1560, 1792, 319, 621, 3072, 430, 2183, 2126, 1299, 2129, 2130, 2132, 2131, 1217, 1220, 1218, 838, 1219, 433, 434, 436, 435, 665, 666, 668, 667, 457, 458, 460, 488, 2133, 1111, 239, 459, 2185, 2186, 2188, 622, 2216, 437, 2187, 625, 626, 628, 627, 897, 898, 900, 1608, 1294, 461, 2134, 1543, 496, 669, 1190, 1317, 679, 1079, 1221, 2328, 629, 1584, 351, 1360, 438, 462, 2189, 3088, 2149, 469, 1549, 247, 2224, 1127, 1144, 2190, 899, 2145, 2146, 2148, 2147, 1113, 1116, 1114, 1115, 465, 466, 468, 467, 1546, 1548, 1545, 670, 1318, 783, 1085, 2079, 2248, 1576, 728, 928, 791, 367, 3104, 1376, 901, 630, 685, 711, 1118, 253, 2311, 1301, 2197, 824, 2150, 1175, 902, 686, 1222, 2352, 1416, 1133, 375, 2344, 1558, 3078, 470, 1167, 1547, 681, 682, 684, 683, 2193, 2194, 2196, 2195, 249, 250, 252, 251, 1314, 1313, 1316, 415, 485, 2095, 1240, 744, 1616, 960, 693, 2256, 1350, 797, 2198, 2213, 1141, 2103, 2376, 807, 3136, 694, 254, 2584, 1550, 717, 1071, 1315, 1553, 1556, 1554, 1555, 689, 690, 692, 691, 1346, 1348, 1345, 1347, 3074, 3076, 3073, 575, 1440, 798, 1208, 2127, 1191, 2317, 431, 1142, 607, 2272, 2214, 2567, 2600, 486, 1573, 2318, 1181, 718, 813, 856, 1117, 839, 1295, 725, 1472, 752, 2608, 2325, 1349, 814, 439, 2135, 3200, 2245, 1197, 1680, 623, 1632, 1336, 671, 1198, 1557, 2109, 1413, 1303, 463, 2573, 1135, 381, 2326, 1672, 2574, 821, 2341, 726, 1182, 872, 2632, 2246, 631, 1574, 1223, 2168, 1605, 741, 1304, 2110, 1205, 845, 1319, 920, 382, 2191, 3077, 822, 2151, 1229, 2342, 2141, 880, 1256, 742, 445, 1392, 471, 2640, 1696, 2440, 687, 1325, 1800, 903, 1134, 3328, 2199, 846, 1670, 3075, 793, 794, 796, 795, 2209, 2210, 2212, 2211, 2313, 2314, 2316, 2315, 481, 482, 484, 483, 1130, 1132, 1129, 1131, 1570, 1569, 1572, 1571, 713, 714, 716, 715, 809, 810, 812, 811, 1177, 1180, 1178, 1179, 2321, 2322, 2324, 2323, 721, 722, 724, 723, 377, 378, 380, 379, 2241, 2242, 2244, 2243, 1409, 1410, 1412, 1411, 1137, 1138, 1140, 1139, 2105, 2106, 2108, 2107, 2569, 2570, 2572, 2571, 817, 818, 820, 819, 2337, 2338, 2340, 2339, 1601, 1602, 1604, 1603, 841, 842, 844, 843, 2577, 2578, 2580, 2579, 1194, 1196, 1193, 1195, 737, 738, 740, 739, 442, 441, 444, 443, 1305, 1308, 1306, 1307, 2137, 2138, 2140, 2139, 1201, 1204, 1202, 1203, 2369, 2370, 2372, 2371, 849, 850, 852, 851, 1666, 1668, 1665, 2696, 1264, 446, 2142, 936, 2448, 853, 2656, 1310, 637, 2400, 1551, 2373, 1230, 2581, 1414, 1206, 1667, 633, 634, 636, 635, 2593, 2594, 2596, 1333, 487, 1808, 2595, 2153, 2154, 2156, 2155, 1226, 1225, 1228, 695, 2157, 1087, 3096, 2232, 854, 2582, 1237, 1236, 1368, 504, 799, 255, 2215, 909, 1559, 2374, 1309, 719, 1143, 477, 2205, 2704, 1448, 2158, 2165, 638, 944, 1728, 3086, 2824, 1227, 905, 906, 908, 907, 473, 474, 476, 475, 1233, 1234, 1236, 1235, 1321, 1322, 1324, 3112, 869, 1592, 1253, 1351, 1183, 1565, 2597, 478, 968, 383, 2264, 910, 2464, 2319, 2327, 815, 2206, 976, 2598, 2720, 870, 2166, 917, 1606, 1824, 3120, 727, 1150, 493, 1357, 2437, 2221, 3085, 1384, 701, 1566, 2247, 1323, 865, 866, 868, 867, 2201, 2202, 2204, 2203, 2433, 2434, 2436, 2435, 2161, 2162, 2164, 2163, 2625, 2626, 2628, 2627, 913, 914, 916, 915, 1330, 1329, 1332, 1331, 697, 698, 700, 699, 1252, 1249, 1250, 1251, 1353, 1354, 1356, 1355, 489, 490, 492, 491, 3081, 3082, 3084, 1798, 2832, 1365, 1334, 2360, 3584, 2752, 2438, 1648, 2222, 1238, 823, 2629, 1575, 3094, 1199, 1432, 1421, 918, 2496, 1254, 502, 933, 1366, 3144, 1488, 743, 2111, 1358, 760, 1581, 2575, 2630, 494, 2229, 2343, 1272, 702, 2333, 1624, 501, 2280, 1415, 847, 2253, 1856, 2230, 992, 447, 1607, 2334, 1704, 733, 1797, 1669, 1231, 3093, 1590, 934, 3152, 3109, 2392, 2693, 1119, 2583, 1381, 855, 2288, 734, 829, 2254, 1213, 2143, 2375, 2848, 1430, 1688, 965, 1614, 2349, 1239, 3208, 2261, 1327, 2616, 1589, 3168, 749, 2880, 1640, 966, 3083, 1794, 1793, 1796, 1795, 2217, 2218, 2220, 2219, 3089, 3090, 3092, 3091, 1564, 1561, 1562, 1563, 929, 930, 932, 931, 2689, 2690, 2692, 2691, 1578, 1580, 1577, 1579, 1146, 1145, 1148, 1147, 2225, 2226, 2228, 2227, 1364, 1362, 1361, 1363, 497, 498, 500, 499, 2329, 2330, 2332, 2331, 729, 730, 732, 731, 1586, 1585, 1588, 1587, 2249, 2250, 2252, 2251, 3105, 3106, 3108, 3107, 961, 962, 964, 963, 1378, 1377, 1380, 1379, 1418, 1420, 1417, 1419, 1609, 1612, 1610, 1611, 2345, 2346, 2348, 2347, 825, 826, 828, 827, 2817, 2818, 2820, 1456, 2694, 2944, 1214, 830, 911, 2350, 1621, 2819, 1210, 1209, 1212, 1211, 2257, 2258, 2260, 2259, 1425, 1426, 1428, 1427, 745, 746, 748, 747, 2353, 2354, 2356, 2355, 3137, 3138, 3140, 3139, 753, 754, 756, 755, 2585, 2586, 2588, 1582, 2408, 2587, 857, 858, 860, 859, 1620, 1617, 1618, 1832, 871, 2159, 639, 1480, 1335, 3216, 888, 2262, 1245, 479, 2357, 1422, 3110, 1677, 750, 2456, 1613, 861, 1446, 2599, 2277, 757, 2207, 1382, 2358, 3141, 2589, 3336, 2821, 919, 2381, 2167, 1504, 862, 1920, 2648, 1445, 758, 3232, 1149, 1359, 2416, 1816, 3079, 2278, 2439, 1671, 1712, 2590, 2382, 1622, 1311, 2822, 2223, 877, 2389, 1207, 952, 1686, 495, 1262, 2472, 1619, 2377, 2378, 2380, 2379, 2273, 2274, 2276, 2275, 1242, 1241, 1244, 1243, 1673, 1676, 1674, 1675, 2385, 2386, 2388, 2387, 1441, 1442, 1444, 1341, 1429, 703, 2631, 1638, 3344, 1567, 1736, 935, 3142, 2335, 1685, 2231, 2173, 2605, 3264, 2664, 1246, 503, 2390, 3205, 925, 1269, 878, 1478, 735, 1799, 1678, 2445, 1443, 3201, 3202, 3204, 3203, 873, 874, 876, 875, 1337, 1338, 1340, 1339, 1476, 1473, 1474, 1475, 1633, 1636, 1634, 1635, 2601, 2602, 2604, 2603, 2169, 2170, 2172, 2171, 1260, 1257, 1258, 1259, 922, 921, 924, 923, 2441, 2442, 2444, 2443, 2401, 2402, 2404, 2403, 1684, 1682, 1681, 1637, 1373, 3160, 2255, 1255, 1591, 2606, 2480, 885, 3087, 2405, 1400, 2712, 1744, 1656, 3360, 2672, 926, 3128, 1270, 941, 1367, 2174, 1805, 3111, 2613, 2446, 1583, 2504, 967, 2406, 2453, 2351, 886, 3592, 831, 1683, 2609, 2610, 2612, 2611, 881, 882, 884, 883, 3097, 3098, 3100, 3099, 2633, 2634, 2636, 2635, 1369, 1370, 1372, 1371, 2449, 2450, 2452, 2451, 937, 938, 940, 939, 3329, 3330, 3332, 3206, 1342, 3331, 2233, 2234, 2236, 2235, 1801, 1804, 1802, 2237, 2614, 1431, 1261, 1840, 3102, 984, 1760, 2637, 1615, 751, 3392, 2263, 1702, 942, 2695, 2454, 1423, 2512, 2728, 1383, 3117, 2638, 1814, 3334, 1477, 1512, 1733, 3600, 1598, 1374, 509, 1806, 2645, 949, 2359, 973, 1397, 2646, 2469, 1000, 2840, 3095, 1438, 2279, 2736, 2701, 1390, 1464, 3176, 2296, 3118, 950, 1151, 2238, 1597, 863, 3616, 2702, 759, 1864, 3143, 1701, 2383, 2528, 1803, 1697, 1698, 1700, 1699, 1265, 1266, 1268, 1267, 505, 506, 508, 507, 2641, 2642, 2644, 2643, 1386, 1388, 1385, 1387, 2465, 2466, 2468, 2467, 1810, 1809, 1812, 1811, 945, 946, 948, 947, 1730, 1732, 1729, 1731, 1436, 1433, 1434, 1008, 2269, 1623, 3333, 2661, 510, 3456, 2470, 1435, 2697, 2698, 2700, 2699, 969, 970, 972, 971, 2657, 2658, 2660, 2659, 2265, 2266, 2268, 2267, 3121, 3124, 3122, 3123, 3585, 3586, 3588, 3125, 2662, 2591, 2391, 1928, 1829, 2823, 1389, 2365, 1872, 974, 1453, 3587, 1393, 1396, 1394, 1395, 1593, 1594, 1596, 2270, 1215, 2501, 2285, 1629, 1520, 2607, 1830, 1734, 2760, 2709, 879, 3101, 981, 2856, 3589, 982, 2768, 927, 2864, 3149, 3224, 1639, 1447, 1343, 1679, 3184, 2710, 1479, 3648, 2502, 2366, 3158, 1888, 765, 2829, 1496, 2424, 1861, 887, 2784, 1437, 2615, 1720, 3240, 997, 3126, 2888, 1630, 1813, 1462, 2286, 1398, 3207, 2407, 1645, 2447, 1848, 1687, 2639, 1247, 2726, 2725, 1936, 3590, 2397, 3150, 2293, 943, 1454, 998, 1595, 2497, 2498, 2500, 2499, 2705, 2706, 2708, 2707, 3114, 3113, 3116, 2175, 3115, 1626, 1625, 1628, 1627, 1826, 1825, 1828, 1827, 2361, 2362, 2364, 2363, 977, 978, 980, 979, 2281, 2282, 2284, 2283, 761, 762, 764, 763, 1449, 1452, 1450, 1451, 3146, 3148, 3145, 3147, 2825, 2826, 2828, 2827, 1857, 1860, 1858, 1859, 2721, 2722, 2724, 2723, 1644, 1642, 1641, 1643, 2289, 2290, 2292, 2291, 1458, 1457, 1460, 1459, 2393, 2394, 2396, 2395, 993, 994, 996, 995, 3153, 3156, 3154, 3155, 1689, 1692, 1690, 1691, 2833, 2834, 2836, 2835, 1481, 1484, 1482, 1483, 2753, 2754, 2756, 1278, 2239, 766, 3173, 2830, 2455, 1709, 1646, 2294, 2755, 3210, 3212, 3209, 3211, 2617, 2618, 2620, 2619, 889, 890, 892, 891, 2409, 2410, 2412, 2411, 1273, 1274, 1276, 1275, 1650, 1649, 1652, 1651, 3170, 3169, 3172, 511, 2398, 1485, 2647, 1693, 2838, 1952, 3213, 3368, 3171, 1490, 1489, 1492, 1491, 3217, 3220, 3218, 3248, 1752, 1807, 3712, 1399, 2621, 3219, 1921, 1922, 1924, 951, 1654, 2837, 1926, 3352, 2757, 2413, 2488, 1391, 2422, 3272, 2471, 1494, 1271, 3222, 2622, 1694, 893, 2461, 1923, 2457, 2458, 2460, 2459, 1705, 1708, 1706, 1707, 2849, 2850, 2852, 2851, 2649, 2650, 2652, 1461, 3157, 2651, 2417, 2418, 2420, 2419, 3234, 3233, 3236, 2414, 975, 1862, 894, 1815, 3335, 3103, 1653, 2703, 1510, 2853, 2663, 1375, 3214, 2758, 1703, 3235, 1714, 1713, 1716, 1715, 1817, 1818, 1820, 2477, 2421, 2653, 3280, 2896, 2680, 1486, 2854, 1821, 1718, 2952, 1599, 1776, 2462, 1405, 1735, 2271, 3174, 1831, 1493, 2711, 1984, 1455, 3376, 2520, 957, 2503, 3237, 3296, 983, 2885, 1710, 958, 3134, 3350, 3400, 2912, 1768, 3221, 2654, 2960, 3151, 1819, 3337, 3340, 3338, 3339, 2473, 2474, 2476, 2475, 953, 954, 956, 955, 1506, 1505, 1508, 1507, 2881, 2882, 2884, 2883, 1738, 1740, 1737, 1739, 3346, 3345, 3348, 2744, 1741, 3472, 3341, 3608, 3840, 2367, 2669, 1463, 2478, 1749, 999, 3347, 2665, 2666, 2668, 2667, 3130, 3129, 3132, 3131, 1402, 1401, 1404, 1403, 3265, 3268, 3266, 2886, 1838, 1277, 3267, 2481, 2482, 2484, 2483, 985, 986, 988, 987, 2713, 2714, 2716, 2715, 2505, 2506, 2508, 1647, 2536, 3159, 2287, 1925, 2507, 1746, 1745, 1748, 2670, 1742, 2485, 1880, 1717, 1016, 3656, 3342, 2509, 1837, 3591, 2544, 2717, 1631, 1469, 3238, 3365, 2727, 1747, 1833, 1834, 1836, 3127, 767, 3269, 1904, 2677, 989, 3632, 2399, 1406, 3408, 2486, 2510, 1822, 1835, 2945, 2946, 2948, 2517, 3597, 2295, 1944, 1863, 3175, 3192, 2947, 1868, 1866, 1865, 1867, 2673, 2674, 2676, 2675, 1761, 1764, 1762, 1763, 1841, 1844, 1842, 1843, 3594, 3596, 3593, 2718, 3366, 1695, 2831, 990, 3133, 1005, 3624, 2776, 2976, 1845, 2839, 2415, 1495, 3424, 2949, 2678, 1655, 2733, 1765, 2759, 3166, 2301, 1487, 3349, 2872, 1750, 1869, 3223, 2950, 2734, 959, 3270, 1896, 1263, 3464, 3181, 2423, 1877, 1509, 3606, 1711, 2518, 3215, 1846, 3595, 3161, 3164, 3162, 3163, 2513, 2514, 2516, 2515, 2729, 2730, 2732, 2731, 1465, 1468, 1466, 1467, 3362, 3361, 3364, 2463, 1960, 2533, 3288, 2792, 1784, 3664, 3008, 1870, 2741, 1662, 1013, 3398, 2845, 1927, 1528, 1766, 3189, 1511, 2855, 1719, 2742, 2302, 895, 3598, 2765, 1439, 3119, 3363, 2297, 2298, 2300, 2299, 3601, 3604, 3602, 3603, 1001, 1002, 1004, 1003, 3394, 3396, 3393, 3395, 2737, 2738, 2740, 2739, 2841, 2842, 2844, 2843, 2529, 2530, 2532, 2531, 3178, 3180, 3177, 3179, 1497, 1500, 1498, 1499, 1009, 1010, 1012, 1011, 1657, 1658, 1660, 2623, 3488, 1006, 2846, 1878, 3256, 3239, 1661, 1502, 2479, 3190, 2655, 1934, 2534, 3621, 1014, 3229, 1470, 2766, 2861, 1743, 2904, 3165, 2887, 3343, 2773, 1968, 3520, 1894, 2800, 1517, 3397, 2862, 2487, 1941, 1823, 3245, 1659, 3618, 3617, 3620, 3619, 1873, 1874, 1876, 3728, 2671, 1992, 1875, 2761, 2762, 2764, 2763, 1930, 1929, 1932, 1931, 2857, 2858, 2860, 2859, 3225, 3228, 3226, 3227, 1889, 1892, 1890, 1891, 1514, 1516, 1513, 1515, 2769, 2770, 2772, 2771, 2425, 2426, 2428, 2427, 3457, 3458, 3460, 3459, 3185, 3186, 3188, 3187, 1721, 1724, 1722, 1723, 2865, 2866, 2868, 2867, 1938, 1937, 1940, 1939, 3649, 3650, 3652, 3680, 3384, 2719, 3246, 3651, 3242, 3244, 3241, 1501, 3605, 3461, 3351, 2511, 1725, 991, 3183, 2429, 1933, 3720, 2869, 1839, 2774, 1525, 3230, 2920, 2679, 3622, 3271, 1726, 3653, 2789, 1518, 1767, 3253, 2893, 3367, 2968, 2430, 2870, 1893, 3277, 1757, 2928, 3304, 2790, 2493, 3440, 2519, 3744, 1958, 2735, 1471, 1007, 2000, 3373, 3848, 2951, 1847, 3182, 1942, 2894, 3718, 1871, 3243, 2889, 2890, 2892, 2891, 2785, 2786, 2788, 2787, 2490, 2489, 2492, 2491, 3249, 3252, 3250, 3251, 3353, 3356, 3354, 3355, 1524, 1522, 1521, 1523, 1953, 1956, 1954, 1955, 1754, 1756, 1753, 1755, 2897, 2898, 2900, 2899, 3714, 3716, 3713, 3312, 2494, 2984, 2901, 3358, 2685, 1912, 3599, 1758, 3278, 3462, 1989, 3254, 3715, 2681, 2682, 2684, 2683, 1850, 1849, 1852, 1851, 3274, 3273, 3276, 1526, 3381, 2535, 3856, 2743, 1773, 1957, 3135, 1853, 1976, 2902, 1015, 3285, 3374, 3416, 2552, 2847, 2303, 1751, 2957, 3607, 3357, 2767, 1503, 3191, 2525, 1781, 3496, 1885, 2686, 2016, 2992, 3776, 1854, 3275, 2953, 2954, 2956, 2955, 2521, 2522, 2524, 2523, 1770, 1772, 1769, 1771, 3281, 3282, 3284, 3283, 3369, 3370, 3372, 2917, 3640, 3301, 3399, 1774, 3231, 3613, 2526, 1895, 3016, 2431, 2958, 2863, 1782, 3024, 1279, 2918, 1943, 2965, 1663, 3654, 3872, 2775, 3198, 2541, 3405, 3432, 2749, 3614, 1021, 3371, 2913, 2914, 2916, 2915, 1882, 1881, 1884, 1883, 1985, 1986, 1988, 1987, 2961, 2962, 2964, 2963, 3378, 3377, 3380, 3379, 2745, 2746, 2748, 2747, 3300, 3297, 3298, 3299, 2537, 2538, 2540, 2539, 3842, 3841, 3844, 3846, 1935, 3413, 3382, 1886, 3696, 3286, 2871, 1407, 3623, 3247, 3480, 3469, 2966, 1990, 3302, 2550, 3843, 3401, 3402, 3404, 3403, 1777, 1778, 1780, 1779, 1017, 1018, 1020, 1019, 1897, 1900, 1898, 1899, 3612, 3609, 3610, 2981, 3414, 1879, 1022, 3536, 2791, 1902, 3406, 2808, 3629, 2542, 1759, 3320, 2750, 3672, 2549, 3463, 2895, 1527, 3904, 3040, 2495, 3655, 3752, 2781, 1959, 3845, 3717, 3279, 1949, 3638, 2982, 1534, 3167, 3429, 2903, 2782, 2877, 3611, 2977, 2978, 2980, 2979, 3194, 3193, 3196, 3195, 3626, 3628, 3625, 3627, 3412, 3410, 3409, 3261, 3411, 2545, 2546, 2548, 2547, 2777, 2778, 2780, 2779, 3634, 3633, 3636, 3635, 1948, 1945, 1946, 1947, 3009, 3010, 3012, 3011, 3426, 3425, 3428, 3427, 3466, 3468, 3465, 3467, 3657, 3660, 3658, 3659, 1905, 1906, 1908, 1907, 2873, 2874, 2876, 2875, 3258, 3257, 3260, 3259, 3473, 3474, 3476, 1910, 1965, 3478, 3736, 3013, 1901, 3662, 1966, 1775, 3287, 2008, 3375, 3637, 2797, 3688, 3014, 3504, 3475, 1530, 1529, 1532, 1531, 2793, 2794, 2796, 2795, 1961, 1962, 1964, 3262, 2950, 2878, 2959, 1909, 3669, 3630, 1991, 3880, 2919, 2687, 3528, 1727, 3383, 2936, 3293, 2527, 1855, 3470, 3725, 2798, 1974, 3661, 2909, 3494, 2805, 3430, 2967, 3552, 2910, 3968, 2005, 3493, 2806, 1887, 3197, 3407, 1023, 3864, 3719, 3760, 1963, 3668, 3665, 3666, 3670, 3359, 1998, 1783, 2925, 3255, 2024, 3000, 3734, 2543, 3310, 3667, 2801, 2802, 2804, 2803, 2905, 2906, 2908, 2907, 1972, 1969, 1970, 1971, 3290, 3289, 3292, 3291, 3721, 3724, 3722, 3723, 1993, 1994, 1996, 1995, 3489, 3490, 3492, 3389, 3477, 2751, 1903, 3686, 1973, 3615, 3784, 2983, 3733, 1789, 3294, 2551, 2973, 3317, 2926, 3526, 2783, 1997, 3847, 3726, 3491, 2921, 2922, 2924, 2923, 3385, 3386, 3388, 3387, 3524, 3521, 3522, 3523, 3681, 3684, 3682, 3683, 3308, 3305, 3306, 3307, 1785, 1786, 1788, 1787, 2970, 2969, 2972, 2971, 2001, 2002, 2004, 2003, 3732, 3730, 3729, 3685, 2032, 3421, 3303, 1917, 3639, 2933, 3448, 3792, 3704, 2974, 3318, 2989, 1519, 3415, 3853, 3631, 2006, 3015, 1951, 1911, 2934, 2021, 2879, 3731, 2929, 2930, 2932, 2931, 3417, 3418, 3420, 3419, 2985, 2986, 2988, 2987, 3849, 3852, 3850, 3390, 3479, 3309, 3888, 3032, 3808, 3663, 2799, 3750, 2990, 1790, 3471, 3431, 1975, 3862, 3525, 3560, 3781, 3646, 3422, 2557, 3854, 2997, 1967, 3021, 3445, 3048, 3486, 3438, 3512, 2022, 2998, 3199, 1981, 3645, 2911, 2807, 3912, 3749, 3851, 3745, 3746, 3748, 3747, 3313, 3314, 3316, 3315, 2553, 2554, 2556, 2555, 2017, 2018, 2020, 2019, 3434, 3436, 3433, 3435, 3858, 3857, 3860, 3859, 1913, 1916, 1914, 1915, 2993, 2994, 2996, 2995, 3484, 3481, 3482, 3056, 3671, 1918, 2558, 3483, 3778, 3780, 3777, 3779, 3017, 3018, 3020, 3019, 3641, 3642, 3644, 1999, 3976, 3877, 3437, 3920, 3022, 3501, 3263, 1533, 3677, 3568, 3878, 3782, 2927, 3029, 3030, 2975, 1982, 3687, 3495, 3391, 3727, 3527, 2023, 3936, 2813, 3544, 3909, 2935, 3485, 3768, 3045, 3678, 3861, 3510, 3446, 2013, 3693, 3896, 3735, 3295, 3984, 2007, 2991, 3502, 3046, 3643, 3441, 3444, 3442, 3443, 3674, 3673, 3676, 3675, 3874, 3873, 3876, 3875, 1977, 1980, 1978, 1979, 3025, 3026, 3028, 3027, 2809, 2810, 2812, 2811, 3497, 3500, 3498, 3499, 3905, 3908, 3906, 3907, 3692, 3690, 3689, 3691, 3506, 3505, 3508, 3507, 3041, 3042, 3044, 3043, 2010, 2009, 2012, 2011, 3737, 3740, 3738, 3739, 3529, 3532, 3530, 3531, 2937, 2938, 2940, 2939, 3698, 3697, 3700, 3699, 3321, 3322, 3324, 3323, 3538, 3537, 3540, 3326, 2814, 2030, 3757, 3694, 2559, 2014, 3533, 3741, 2040, 4000, 3539, 3969, 3970, 3972, 3800, 3855, 3447, 2999, 3702, 3974, 3439, 1535, 3542, 3319, 2029, 3742, 2941, 3971, 3753, 3756, 3754, 3755, 2026, 2025, 2028, 2027, 3762, 3761, 3764, 3509, 3763, 3865, 3866, 3868, 3023, 3910, 2942, 3863, 3701, 3558, 3423, 3751, 3534, 3869, 2037, 3766, 3647, 3824, 3453, 3783, 3879, 3541, 4032, 3503, 1791, 3005, 3031, 3758, 3006, 3816, 2038, 3867, 3001, 3002, 3004, 3003, 3554, 3553, 3556, 3555, 2033, 2034, 2036, 2035, 3786, 3788, 3785, 3787, 3450, 3449, 3452, 3451, 3033, 3034, 3036, 3789, 3035, 3916, 3914, 3913, 3511, 3797, 3047, 3886, 3325, 3695, 1919, 3973, 3790, 3928, 3765, 3064, 3885, 3915, 3881, 3882, 3884, 3679, 3517, 2815, 3952, 3037, 3454, 3870, 3883, 3794, 3793, 3796, 3795, 3809, 3812, 3810, 2039, 3992, 3911, 3811, 3889, 3892, 3890, 3891, 3513, 3516, 3514, 3515, 3049, 3050, 3052, 3051, 3545, 3548, 3546, 3547, 3705, 3706, 3708, 3743, 3038, 3053, 3893, 3543, 3703, 3813, 3535, 3798, 3917, 3007, 3944, 3311, 3925, 3557, 3759, 3894, 4008, 2031, 3832, 3918, 3710, 3061, 3975, 3576, 3814, 3559, 3767, 2943, 3487, 3054, 3926, 3709, 3550, 1983, 3982, 3062, 3518, 3791, 4016, 3942, 3565, 3989, 3871, 2046, 3707, 3921, 3922, 3924, 4040, 3923, 3057, 3058, 3060, 3059, 3978, 3977, 3980, 3979, 3937, 3940, 3938, 3939, 3562, 3564, 3561, 3563, 2041, 2042, 2044, 2043, 3769, 3772, 3770, 3771, 3986, 3985, 3988, 3987, 3572, 3570, 3569, 3549, 3773, 3039, 3981, 3887, 3573, 2047, 3774, 3566, 3815, 3941, 3805, 2015, 4006, 3519, 3055, 4048, 3895, 3571, 4001, 4004, 4002, 4003, 3802, 3804, 3801, 3803, 3898, 3897, 3900, 3899, 3818, 3820, 3817, 3990, 3919, 3819, 3930, 3929, 3932, 3960, 3806, 4037, 3574, 3931, 4033, 4034, 4036, 3821, 4005, 3901, 4024, 3063, 3799, 3551, 3829, 3933, 4064, 3902, 3822, 3943, 4035, 3825, 3826, 3828, 3830, 3327, 3991, 3711, 3069, 3983, 3934, 3455, 3827, 3065, 3066, 3068, 3067, 3945, 3948, 3946, 3947, 3996, 3993, 3994, 2045, 4038, 3927, 3070, 3950, 3995, 3953, 3954, 3956, 3807, 3955, 3578, 3577, 3580, 3575, 4007, 3997, 3582, 3958, 4013, 3949, 4014, 3823, 4056, 3579, 4009, 4010, 4012, 3998, 3957, 4039, 3775, 3903, 4022, 4053, 3935, 3071, 4011, 4020, 4017, 4018, 4019, 4041, 4042, 4044, 4043, 3833, 3834, 3836, 3835, 4049, 4050, 4052, 4046, 3831, 4072, 3951, 4021, 4051, 4065, 4066, 4068, 3837, 4045, 4080, 3965, 3567, 4067, 3961, 3964, 3962, 4054, 3999, 3959, 4069, 3838, 4023, 4015, 3963, 4025, 4028, 4026, 4070, 4029, 3966, 4047, 3581, 4030, 4027, 4058, 4057, 4060, 4059, 4074, 4073, 4076, 4071, 4061, 4055, 4078, 4062, 4088, 3583, 4075, 4081, 4082, 4084, 4077, 4083, 4085, 3839, 4086, 4089, 3967, 4090, 4087, 4092, 4091, 4079, 4031, 4094, 4095, 4063, 4093].

Q1=[0, 8, 16, 32, 5, 64, 6, 128, 256, 24, 7, 512, 40, 13, 48, 14, 72, 21, 80, 37, 22, 136, 264, 38, 96, 144, 69, 272, 160, 520, 288, 528, 192, 544, 70, 15, 320, 133, 23, 134, 384, 56, 39, 261, 29, 88, 30, 71, 262, 2048, 576, 45, 640, 46, 517, 104, 53, 1032, 152, 77, 768, 518, 54, 112, 1024, 135, 78, 85, 168, 86, 280, 141, 1040, 101, 176, 142, 31, 200, 1056, 263, 149, 102, 304, 296, 1030, 47, 208, 150, 165, 55, 328, 1088, 536, 79, 269, 2056, 224, 166, 519, 552, 270, 560, 277, 87, 1152, 197, 2064, 61, 525, 278, 526, 293, 584, 198, 2080, 120, 336, 62, 143, 1029, 103, 294, 93, 592, 392, 2053, 1280, 151, 648, 94, 400, 608, 2112, 352, 325, 533, 109, 1048, 184, 534, 167, 326, 2054, 157, 656, 110, 117, 1038, 776, 1064, 549, 216, 416, 271, 279, 158, 550, 672, 118, 1072, 2176, 389, 173, 1037, 199, 784, 312, 1536, 704, 390, 174, 581, 1046, 448, 1096, 63, 527, 582, 181, 295, 285, 232, 205, 182, 2304, 286, 1045, 1104, 1061, 344, 645, 535, 240, 2072, 206, 95, 327, 800, 2055, 301, 1160, 213, 568, 1120, 832, 646, 896, 2560, 302, 360, 111, 1168, 214, 309, 1062, 2088, 408, 551, 229, 159, 310, 1093, 541, 1288, 773, 333, 119, 2061, 600, 1184, 2096, 368, 1031, 230, 391, 542, 334, 2062, 774, 175, 2120, 341, 2069, 424, 583, 1296, 1094, 287, 183, 125, 557, 1216, 616, 342, 1157, 397, 1112, 207, 2128, 558, 432, 1039, 357, 664, 1312, 624, 1080, 2085, 126, 2070, 1063, 565, 398, 2184, 456, 358, 405, 303, 2312, 1544, 1158, 189, 566, 1054, 2086, 589, 1344, 215, 647, 2144, 406, 464, 680, 1069, 590, 1286, 1552, 2192, 597, 311, 2117, 598, 421, 792, 1047, 231, 688, 653, 1128, 248, 1070, 2320, 190, 1568, 654, 2208, 1095, 335, 480, 221, 1285, 613, 2568, 1408, 422, 2336, 1077, 614, 543, 2576, 343, 2240, 775, 317, 2592, 2118, 222, 453, 237, 559, 712, 661, 1053, 808, 1541, 720, 816, 1101, 2063, 1176, 2368, 2181, 1136, 662, 2071, 1600, 454, 318, 1110, 2182, 781, 376, 736, 567, 2432, 1192, 1078, 840, 238, 1159, 359, 2104, 399, 591, 678, 677, 2087, 1542, 349, 1102, 245, 127, 191, 1125, 782, 407, 2309, 2077, 246, 350, 599, 790, 1165, 1320, 2136, 1200, 1664, 573, 2078, 789, 1304, 709, 365, 440, 2119, 374, 1224, 423, 2310, 1174, 574, 413, 2624, 1109, 366, 2093, 1287, 1055, 655, 2688, 805, 615, 1166, 710, 429, 373, 605, 1232, 848, 2094, 632, 806, 2565, 2152, 904, 414, 2101, 223, 1126, 663, 3080, 1328, 472, 2200, 455, 2125, 1189, 1248, 837, 2816, 1086, 1302, 1352, 864, 2566, 2102, 1173, 606, 912, 1103, 696, 1424, 2160, 1293, 1560, 1792, 319, 621, 3072, 430, 2183, 2126, 838, 488, 2133, 1111, 239, 622, 2216, 437, 1608, 1294, 461, 2134, 1543, 496, 669, 1190, 1317, 679, 1079, 1221, 2328, 629, 1584, 351, 1360, 438, 462, 2189, 3088, 2149, 469, 1549, 247, 2224, 1127, 1144, 2190, 670, 1318, 783, 1085, 2079, 2248, 1576, 728, 928, 791, 367, 3104, 1376, 901, 630, 685, 711, 1118, 253, 2311, 1301, 2197, 824, 2150, 1175, 902, 686, 1222, 2352, 1416, 1133, 375, 2344, 1558, 3078, 470, 1167, 415, 485, 2095, 1240, 744, 1616, 960, 693, 2256, 1350, 797, 2198, 2213, 1141, 2103, 2376, 807, 3136, 694, 254, 2584, 1550, 717, 1071, 575, 1440, 798, 1208, 2127, 1191, 2317, 431, 1142, 607, 2272, 2214, 2567, 2600, 486, 1573, 2318, 1181, 718, 813, 856, 1117, 839, 1295, 725, 1472, 752, 2608, 2325, 1349, 814, 439, 2135, 3200, 2245, 1197, 1680, 623, 1632, 1336, 671, 1198, 1557, 2109, 1413, 1303, 463, 2573, 1135, 381, 2326, 1672, 2574, 821, 2341, 726, 1182, 872, 2632, 2246, 631, 1574, 1223, 2168, 1605, 741, 2384, 2110, 1205, 845, 1319, 920, 382, 2191, 3077, 822, 2151, 1229, 2342, 2141, 880, 1256, 742, 445, 1392, 471, 2640, 1696, 2440, 687, 1325, 1800, 903, 1134, 3328, 2199, 846, 1670, 2696, 1264, 446, 2142, 936, 2448, 853, 2656, 1310, 637, 2400, 1551, 2373, 1230, 2581, 1414, 1206, 1333, 487, 1808, 695, 2157, 1087, 3096, 2232, 854, 2582, 1237, 1326, 1368, 504, 799, 255, 2215, 909, 1559, 2374, 1309, 719, 1143, 477, 2205, 2704, 1448, 2158, 2165, 638, 944, 1728, 3086, 2824, 3112, 869, 1592, 1253, 1351, 1183, 1565, 2597, 478, 968, 383, 2264, 910, 2464, 2319, 2327, 815, 2206, 976, 2598, 2720, 870, 2166, 917, 1606, 1824, 3120, 727, 1150, 493, 1357, 2437, 2221, 3085, 1384, 701, 1566, 2247, 1798, 2832, 1365, 1334, 2360, 3584, 2752, 2438, 1648, 2222, 1238, 823, 2629, 1575, 3094, 1199, 1432, 1421, 918, 2496, 1254, 502, 933, 1366, 3144, 1488, 743, 2111, 1358, 760, 1581, 2575, 2630, 494, 2229, 2343, 1272, 702, 2333, 1624, 501, 2280, 1415, 847, 2253, 1856, 2230, 992, 447, 1607, 2334, 1704, 733, 1797, 1669, 1231, 3093, 1590, 934, 3152, 3109, 2392, 2693, 1119, 2583, 1381, 855, 2288, 734, 829, 2254, 1213, 2143, 2375, 2848, 1430, 1688, 965, 1614, 2349, 1239, 3208, 2261, 1327, 2616, 1589, 3168, 749, 2880, 1640, 966, 1456, 2694, 2944, 1214, 830, 911, 2350, 1621, 1582, 2408, 1832, 871, 2159, 639, 1480, 1335, 3216, 888, 2262, 1245, 479, 2357, 1422, 3110, 1677, 750, 2456, 1613, 861, 1446, 2599, 2277, 757, 2207, 1382, 2358, 3141, 2589, 3336, 2821, 919, 2381, 2167, 1504, 862, 1920, 2648, 1445, 758, 3232, 1149, 1359, 2416, 1816, 3079, 2278, 2439, 1671, 1712, 2590, 2382, 1622, 1311, 2822, 2223, 877, 2389, 1207, 952, 1686, 495, 1262, 2472, 1341, 1429, 703, 2631, 1638, 3344, 1567, 1736, 935, 3142, 2335, 1685, 2231, 2173, 2605, 3264, 2664, 1246, 503, 2390, 3205, 925, 1269, 878, 1478, 735, 1799, 1678, 2445, 1637, 1373, 3160, 2255, 1255, 1591, 2606, 2480, 885, 3087, 2405, 1400, 2712, 1744, 1656, 3360, 2672, 926, 3128, 1270, 941, 1367, 2174, 1805, 3111, 2613, 2446, 1583, 2504, 967, 2406, 2453, 2351, 886, 3592, 831, 3206, 1342, 2237, 2614, 1431, 1261, 1840, 3102, 984, 1760, 2637, 1615, 751, 3392, 2263, 1702, 942, 2695, 2454, 1423, 2512, 2728, 1383, 3117, 2638, 1814, 3334, 1477, 1512, 1733, 3600, 1598, 1374, 509, 1806, 2645, 949, 2359, 973, 1397, 2646, 2469, 1000, 2840, 3095, 1438, 2279, 2736, 2701, 1390, 1464, 3176, 2296, 3118, 950, 1151, 2238, 1597, 863, 3616, 2702, 759, 1864, 3143, 1701, 2383, 2528, 1008, 2269, 1623, 3333, 2661, 510, 3456, 2470, 3125, 2662, 2591, 2391, 1928, 1829, 2823, 1389, 2365, 1872, 974, 1453, 2270, 1215, 2501, 2285, 1629, 1520, 2607, 1830, 1734, 2760, 2709, 879, 3101, 981, 2856, 3589, 982, 2768, 927, 2864, 3149, 3224, 1639, 1447, 1343, 1679, 3184, 2710, 1479, 3648, 2502, 2366, 3158, 1888, 765, 2829, 1496, 2424, 1861, 887, 2784, 1437, 2615, 1720, 3240, 997, 3126, 2888, 1630, 1813, 1462, 2286, 1398, 3207, 2407, 1645, 2447, 1848, 1687, 2639, 1247, 2726, 2725, 1936, 3590, 2397, 3150, 2293, 943, 1454, 998, 2175, 1278, 2239, 766, 3173, 2830, 2455, 1709, 1646, 2294, 511, 2398, 1485, 2647, 1693, 2838, 1952, 3213, 3368, 3248, 1752, 1807, 3712, 1399, 2621, 951, 1654, 2837, 1926, 3352, 2757, 2413, 2488, 1391, 2422, 3272, 2471, 1494, 1271, 3222, 2622, 1694, 893, 2461, 1461, 3157, 2414, 975, 1862, 894, 1815, 3335, 3103, 1653, 2703, 1510, 2853, 2663, 1375, 3214, 2758, 1703, 2477, 2421, 2653, 3280, 2896, 2680, 1486, 2854, 1821, 1718, 2952, 1599, 1776, 2462, 1405, 1735, 2271, 3174, 1831, 1493, 2711, 1984, 1455, 3376, 2520, 957, 2503, 3237, 3296, 983, 2885, 1710, 958, 3134, 3350, 3400, 2912, 1768, 3221, 2654, 2960, 3151, 2744, 1741, 3472, 3341, 3608, 3840, 2367, 2669, 1463, 2478, 1749, 999, 2886, 1838, 1277, 1647, 2536, 3159, 2287, 1925, 2670, 1742, 2485, 1880, 1717, 1016, 3656, 3342, 2509, 1837, 3591, 2544, 2717, 1631, 1469, 3238, 3365, 2727, 3127, 767, 3269, 1904, 2677, 989, 3632, 2399, 1406, 3408, 2486, 2510, 1822, 2517, 3597, 2295, 1944, 1863, 3175, 3192, 2718, 3366, 1695, 2831, 990, 3133, 1005, 3624, 2776, 2976, 1845, 2839, 2415, 1495, 3424, 2949, 2678, 1655, 2733, 1765, 2759, 3166, 2301, 1487, 3349, 2872, 1750, 1869, 3223, 2950, 2734, 959, 3270, 1896, 1263, 3464, 3181, 2423, 1877, 1509, 3606, 1711, 2518, 3215, 1846, 2463, 1960, 2533, 3288, 2792, 1784, 3664, 3008, 1870, 2741, 1662, 1013, 3398, 2845, 1927, 1528, 1766, 3189, 1511, 2855, 1719, 2742, 2302, 895, 3598, 2765, 1439, 3119, 2623, 3488, 1006, 2846, 1878, 3256, 3239, 1661, 1502, 2479, 3190, 2655, 1934, 2534, 3621, 1014, 3229, 1470, 2766, 2861, 1743, 2904, 3165, 2887, 3343, 2773, 1968, 3520, 1894, 2800, 1517, 3397, 2862, 2487, 1941, 1823, 3245, 3728, 2671, 1992, 3680, 3384, 2719, 3246, 1501, 3605, 3461, 3351, 2511, 1725, 991, 3183, 2429, 1933, 3720, 2869, 1839, 2774, 1525, 3230, 2920, 2679, 3622, 3271, 1726, 3653, 2789, 1518, 1767, 3253, 2893, 3367, 2968, 2430, 2870, 1893, 3277, 1757, 2928, 3304, 2790, 2493, 3440, 2519, 3744, 1958, 2735, 1471, 1007, 2000, 3373, 3848, 2951, 1847, 3182, 1942, 2894, 3718, 1871, 3312, 2494, 2984, 2901, 3358, 2685, 1912, 3599, 1758, 3278, 3462, 1989, 3254, 1526, 3381, 2535, 3856, 2743, 1773, 1957, 3135, 1853, 1976, 2902, 1015, 3285, 3374, 3416, 2552, 2847, 2303, 1751, 2957, 3607, 3357, 2767, 1503, 3191, 2525, 1781, 3496, 1885, 2686, 2016, 2992, 3776, 1854, 2917, 3640, 3301, 3399, 1774, 3231, 3613, 2526, 1895, 3016, 2431, 2958, 2863, 1782, 3024, 1279, 2918, 1943, 2965, 1663, 3654, 3872, 2775, 3198, 2541, 3405, 3432, 2749, 3614, 1021, 3846, 1935, 3413, 3382, 1886, 3696, 3286, 2871, 1407, 3623, 3247, 3480, 3469, 2966, 1990, 3302, 2550, 2981, 3414, 1879, 1022, 3536, 2791, 1902, 3406, 2808, 3629, 2542, 1759, 3320, 2750, 3672, 2549, 3463, 2895, 1527, 3904, 3040, 2495, 3655, 3752, 2781, 1959, 3845, 3717, 3279, 1949, 3638, 2982, 1534, 3167, 3429, 2903, 2782, 2877, 3261, 1910, 1965, 3478, 3736, 3013, 1901, 3662, 1966, 1775, 3287, 2008, 3375, 3637, 2797, 3688, 3014, 3504, 3262, 1950, 2878, 2959, 1909, 3669, 3630, 1991, 3880, 2919, 2687, 3528, 1727, 3383, 2936, 3293, 2527, 1855, 3470, 3725, 2798, 1974, 3661, 2909, 3494, 2805, 3430, 2967, 3552, 2910, 3968, 2005, 3493, 2806, 1887, 3197, 3407, 1023, 3864, 3719, 3760, 3670, 3359, 1998, 1783, 2925, 3255, 2024, 3000, 3734, 2543, 3310, 3389, 3477, 2751, 1903, 3686, 1973, 3615, 3784, 2983, 3733, 1789, 3294, 2551, 2973, 3317, 2926, 3526, 2783, 1997, 3847, 3726, 3685, 2032, 3421, 3303, 1917, 3639, 2933, 3448, 3792, 3704, 2974, 3318, 2989, 1519, 3415, 3853, 3631, 2006, 3015, 1951, 1911, 2934, 2021, 2879, 3390, 3479, 3309, 3888, 3032, 3808, 3663, 2799, 3750, 2990, 1790, 3471, 3431, 1975, 3862, 3525, 3560, 3781, 3646, 3422, 2557, 3854, 2997, 1967, 3021, 3445, 3048, 3486, 3438, 3512, 2022, 2998, 3199, 1981, 3645, 2911, 2807, 3912, 3749, 3056, 3671, 1918, 2558, 1999, 3976, 3877, 3437, 3920, 3022, 3501, 3263, 1533, 3677, 3568, 3878, 3782, 2927, 3029, 3030, 2975, 1982, 3687, 3495, 3391, 3727, 3527, 2023, 3936, 2813, 3544, 3909, 2935, 3485, 3768, 3045, 3678, 3861, 3510, 3446, 2013, 3693, 3896, 3735, 3295, 3984, 2007, 2991, 3502, 3046, 3326, 2814, 3030, 3757, 3694, 2559, 2014, 3533, 3741, 2040, 4000, 3800, 3855, 3447, 2999, 3702, 3974, 3439, 1535, 3542, 3319, 2029, 3742, 2941, 3509, 3023, 3910, 2942, 3863, 3701, 3558, 3423, 3751, 3534, 3869, 2037, 3766, 3647, 3824, 3453, 3783, 3879, 3541, 4032, 3503, 1791, 3005, 3031, 3758, 3006, 3816, 2038, 3789, 3511, 3797, 3047, 3886, 3325, 3695, 1919, 3973, 3790, 3928, 3765, 3064, 3885, 3679, 3517, 2815, 3952, 3037, 3454, 3870, 2039, 3992, 3911, 3743, 3038, 3053, 3893, 3543, 3703, 3813, 3535, 3798, 3917, 3007, 3944, 3311, 3925, 3557, 3759, 3894, 4008, 2031, 3832, 3918, 3710, 3061, 3975, 3576, 3814, 3559, 3767, 2943, 3487, 3054, 3926, 3709, 3550, 1983, 3982, 3062, 3518, 3791, 4016, 3942, 3565, 3989, 3871, 2046, 4040, 3549, 3773, 3039, 3981, 3887, 3573, 2047, 3774, 3566, 3815, 3941, 3805, 2015, 4006, 3519, 3055, 3048, 3895, 3990, 3919, 3960, 3806, 4037, 3574, 3821, 4005, 3901, 4024, 3063, 3799, 3551, 3829, 3933, 4064, 3902, 3822, 3943, 3830, 3327, 3991, 3711, 3069, 3983, 3934, 3455, 2045, 4038, 3927, 3070, 3950, 3807, 3575, 4007, 3997, 3582, 3958, 4013, 3949, 4014, 3823, 4056, 3998, 3957, 4039, 3775, 3903, 4022, 4053, 3935, 3071, 4046, 3831, 4072, 3951, 4021, 3837, 4045, 4080, 3965, 3567, 4054, 3999, 3959, 4069, 3838, 4023, 4015, 4070, 4029, 3966, 4047, 3581, 4030, 4071, 4061, 4055, 4078, 4062, 4088, 3583, 4077, 4085, 3839, 4086, 3967, 4087, 4079, 4031, 4094, 4095, 4063, 4093].

Q2=[1, 2, 4, 3, 9, 10, 12, 11, 17, 18, 20, 19, 33, 34, 36, 35, 65, 66, 68, 67, 129, 130, 132, 131, 257, 258, 260, 259, 26, 25, 28, 27, 513, 514, 516, 515, 41, 42, 44, 43, 49, 50, 52, 51, 74, 73, 76, 75, 81, 82, 84, 83, 137, 138, 140, 139, 97, 98, 100, 99, 145, 146, 148, 147, 161, 162, 164, 163, 265, 266, 268, 267, 1026, 1028, 1025, 1027, 273, 274, 276, 275, 193, 194, 196, 195, 57, 58, 60, 59, 521, 522, 524, 523, 289, 290, 292, 291, 529, 530, 532, 531, 89, 90, 92, 91, 2049, 2050, 2052, 2051, 321, 322, 324, 323, 105, 106, 108, 107, 545, 546, 548, 547, 153, 154, 156, 155, 385, 386, 388, 387, 113, 114, 116, 115, 577, 578, 580, 579, 169, 170, 172, 171, 1041, 1042, 1044, 1043, 1033, 1034, 1036, 1035, 641, 642, 644, 643, 177, 178, 180, 179, 281, 282, 284, 283, 201, 202, 204, 203, 1057, 1058, 1060, 1059, 297, 298, 300, 299, 769, 770, 772, 771, 209, 210, 212, 211, 305, 306, 308, 307, 1089, 1090, 1092, 1091, 537, 538, 540, 539, 225, 226, 228, 227, 329, 330, 332, 331, 2057, 2058, 2060, 2059, 2065, 2066, 2068, 2067, 337, 338, 340, 339, 1153, 1154, 1156, 1155, 553, 554, 556, 555, 121, 122, 124, 123, 393, 394, 396, 395, 353, 354, 356, 355, 2081, 2082, 2084, 2083, 561, 562, 564, 563, 1049, 1050, 1052, 1051, 585, 586, 588, 587, 401, 402, 404, 403, 1281, 1282, 1284, 1283, 185, 186, 188, 187, 2113, 2114, 2116, 2115, 593, 594, 596, 595, 417, 418, 420, 419, 649, 650, 652, 651, 217, 218, 220, 219, 609, 610, 612, 611, 1073, 1076, 1074, 1075, 2177, 2178, 2180, 2179, 1537, 1538, 1540, 1539, 449, 450, 452, 451, 657, 658, 660, 659, 313, 314, 316, 315, 1066, 1065, 1068, 1067, 233, 234, 236, 235, 1098, 1100, 1097, 1099, 777, 778, 780, 779, 673, 674, 676, 675, 2305, 2306, 2308, 2307, 241, 242, 244, 243, 345, 346, 348, 347, 1105, 1108, 1106, 1107, 2074, 2073, 2076, 2075, 785, 786, 788, 787, 2561, 2562, 2564, 2563, 705, 706, 708, 707, 1162, 1164, 1161, 1163, 569, 570, 572, 571, 361, 362, 364, 363, 1122, 1121, 1124, 1123, 2089, 2090, 2092, 2091, 1169, 1172, 1170, 1171, 409, 410, 412, 411, 801, 802, 804, 803, 601, 602, 604, 603, 369, 370, 372, 371, 2097, 2098, 2100, 2099, 1186, 1185, 1188, 1187, 425, 426, 428, 427, 1289, 1292, 1290, 1291, 2122, 2121, 2124, 2123, 833, 834, 836, 835, 617, 618, 620, 619, 1082, 1081, 1084, 1083, 1298, 1297, 1300, 1299, 2129, 2130, 2132, 2131, 1217, 1220, 1218, 1219, 433, 434, 436, 435, 665, 666, 668, 667, 457, 458, 460, 459, 2185, 2186, 2188, 2187, 625, 626, 628, 627, 897, 898, 900, 899, 2145, 2146, 2148, 2147, 1113, 1116, 1114, 1115, 465, 466, 468, 467, 1546, 1548, 1545, 1547, 681, 682, 684, 683, 2193, 2194, 2196, 2195, 249, 250, 252, 251, 1314, 1313, 1316, 1315, 1553, 1556, 1554, 1555, 689, 690, 692, 691, 1346, 1348, 1345, 1347, 3074, 3076, 3073, 3075, 793, 794, 796, 795, 2209, 2210, 2212, 2211, 2313, 2314, 2316, 2315, 481, 482, 484, 483, 1130, 1132, 1129, 1131, 1570, 1569, 1572, 1571, 713, 714, 716, 715, 809, 810, 812, 811, 1177, 1180, 1178, 1179, 2321, 2322, 2324, 2323, 721, 722, 724, 723, 377, 378, 380, 379, 2241, 2242, 2244, 2243, 1409, 1410, 1412, 1411, 1137, 1138, 1140, 1139, 2105, 2106, 2108, 2107, 2569, 2570, 2572, 2571, 817, 818, 820, 819, 2337, 2338, 2340, 2339, 1601, 1602, 1604, 1603, 841, 842, 844, 843, 2577, 2578, 2580, 2579, 1194, 1196, 1193, 1195, 737, 738, 740, 739, 442, 441, 444, 443, 1305, 1308, 1306, 1307, 2137, 2138, 2140, 2139, 1201, 1204, 1202, 1203, 2369, 2370, 2372, 2371, 849, 850, 852, 851, 1666, 1668, 1665, 1667, 633, 634, 636, 635, 2593, 2594, 2596, 2595, 2153, 2154, 2156, 2155, 1226, 1225, 1228, 1227, 905, 906, 908, 907, 473, 474, 476, 475, 1233, 1234, 1236, 1235, 1321, 1322, 1324, 1323, 865, 866, 868, 867, 2201, 2202, 2204, 2203, 2433, 2434, 2436, 2435, 2161, 2162, 2164, 2163, 2625, 2626, 2628, 2627, 913, 914, 916, 915, 1330, 1329, 1332, 1331, 697, 698, 700, 699, 1252, 1249, 1250, 1251, 1353, 1354, 1356, 1355, 489, 490, 492, 491, 3081, 3082, 3084, 3083, 1794, 1793, 1796, 1795, 2217, 2218, 2220, 2219, 3089, 3090, 3092, 3091, 1564, 1561, 1562, 1563, 929, 930, 932, 931, 2689, 2690, 2692, 2691, 1578, 1580, 1577, 1579, 1146, 1145, 1148, 1147, 2225, 2226, 2228, 2227, 1364, 1362, 1361, 1363, 497, 498, 500, 499, 2329, 2330, 2332, 2331, 729, 730, 732, 731, 1586, 1585, 1588, 1587, 2249, 2250, 2252, 2251, 3105, 3106, 3108, 3107, 961, 962, 964, 963, 1378, 1377, 1380, 1379, 1418, 1420, 1417, 1419, 1609, 1612, 1610, 1611, 2345, 2346, 2348, 2347, 825, 826, 828, 827, 2817, 2818, 2820, 2819, 1210, 1209, 1212, 1211, 2257, 2258, 2260, 2259, 1425, 1426, 1428, 1427, 745, 746, 748, 747, 2353, 2354, 2356, 2355, 3137, 3138, 3140, 3139, 753, 754, 756, 755, 2585, 2586, 2588, 2587, 857, 858, 860, 859, 1620, 1617, 1618, 1619, 2377, 2378, 2380, 2379, 2273, 2274, 2276, 2275, 1242, 1241, 1244, 1243, 1673, 1676, 1674, 1675, 2385, 2386, 2388, 2387, 1441, 1442, 1444, 1443, 3201, 3202, 3204, 3203, 873, 874, 876, 875, 1337, 1338, 1340, 1339, 1476, 1473, 1474, 1475, 1633, 1636, 1634, 1635, 2601, 2602, 2604, 2603, 2169, 2170, 2172, 2171, 1260, 1257, 1258, 1259, 922, 921, 924, 923, 2441, 2442, 2444, 2443, 2401, 2402, 2404, 2403, 1684, 1682, 1681, 1683, 2609, 2610, 2612, 2611, 881, 882, 884, 883, 3097, 3098, 3100, 3099, 2633, 2634, 2636, 2635, 1369, 1370, 1372, 1371, 2449, 2450, 2452, 2451, 937, 938, 940, 939, 3329, 3330, 3332, 3331, 2233, 2234, 2236, 2235, 1801, 1804, 1802, 1803, 1697, 1698, 1700, 1699, 1265, 1266, 1268, 1267, 505, 506, 508, 507, 2641, 2642, 2644, 2643, 1386, 1388, 1385, 1387, 2465, 2466, 2468, 2467, 1810, 1809, 1812, 1811, 945, 946, 948, 947, 1730, 1732, 1729, 1731, 1436, 1433, 1434, 1435, 2697, 2698, 2700, 2699, 969, 970, 972, 971, 2657, 2658, 2660, 2659, 2265, 2266, 2268, 2267, 3121, 3124, 3122, 3123, 3585, 3586, 3588, 3587, 1393, 1396, 1394, 1395, 1593, 1594, 1596, 1595, 2497, 2498, 2500, 2499, 2705, 2706, 2708, 2707, 3114, 3113, 3116, 3115, 1626, 1625, 1628, 1627, 1826, 1825, 1828, 1827, 2361, 2362, 2364, 2363, 977, 978, 980, 979, 2281, 2282, 2284, 2283, 761, 762, 764, 763, 1449, 1452, 1450, 1451, 3146, 3148, 3145, 3147, 2825, 2826, 2828, 2827, 1857, 1860, 1858, 1859, 2721, 2722, 2724, 2723, 1644, 1642, 1641, 1643, 2289, 2290, 2292, 2291, 1458, 1457, 1460, 1459, 2393, 2394, 2396, 2395, 993, 994, 996, 995, 3153, 3156, 3154, 3155, 1689, 1692, 1690, 1691, 2833, 2834, 2836, 2835, 1481, 1484, 1482, 1483, 2753, 2754, 2756, 2755, 3210, 3212, 3209, 3211, 2617, 2618, 2620, 2619, 889, 890, 892, 891, 2409, 2410, 2412, 2411, 1273, 1274, 1276, 1275, 1650, 1649, 1652, 1651, 3170, 3169, 3172, 3171, 1490, 1489, 1492, 1491, 3217, 3220, 3218, 3219, 1921, 1922, 1924, 1923, 2457, 2458, 2460, 2459, 1705, 1708, 1706, 1707, 2849, 2850, 2852, 2851, 2649, 2650, 2652, 2651, 2417, 2418, 2420, 2419, 3234, 3233, 3236, 3235, 1714, 1713, 1716, 1715, 1817, 1818, 1820, 1819, 3337, 3340, 3338, 3339, 2473, 2474, 2476, 2475, 953, 954, 956, 955, 1506, 1505, 1508, 1507, 2881, 2882, 2884, 2883, 1738, 1740, 1737, 1739, 3346, 3345, 3348, 3347, 2665, 2666, 2668, 2667, 3130, 3129, 3132, 3131, 1402, 1401, 1404, 1403, 3265, 3268, 3266, 3267, 2481, 2482, 2484, 2483, 985, 986, 988, 987, 2713, 2714, 2716, 2715, 2505, 2506, 2508, 2507, 1746, 1745, 1748, 1747, 1833, 1834, 1836, 1835, 2945, 2946, 2948, 2947, 1868, 1866, 1865, 1867, 2673, 2674, 2676, 2675, 1761, 1764, 1762, 1763, 1841, 1844, 1842, 1843, 3594, 3596, 3593, 3595, 3161, 3164, 3162, 3163, 2513, 2514, 2516, 2515, 2729, 2730, 2732, 2731, 1465, 1468, 1466, 1467, 3362, 3361, 3364, 3363, 2297, 2298, 2300, 2299, 3601, 3604, 3602, 3603, 1001, 1002, 1004, 1003, 3394, 3396, 3393, 3395, 2737, 2738, 2740, 2739, 2841, 2842, 2844, 2843, 2529, 2530, 2532, 2531, 3178, 3180, 3177, 3179, 1497, 1500, 1498, 1499, 1009, 1010, 1012, 1011, 1657, 1658, 1660, 1659, 3618, 3617, 3620, 3619, 1873, 1874, 1876, 1875, 2761, 2762, 2764, 2763, 1930, 1929, 1932, 1931, 2857, 2858, 2860, 2859, 3225, 3228, 3226, 3227, 1889, 1892, 1890, 1891, 1514, 1516, 1513, 1515, 2769, 2770, 2772, 2771, 2425, 2426, 2428, 2427, 3457, 3458, 3460, 3459, 3185, 3186, 3188, 3187, 1721, 1724, 1722, 1723, 2865, 2866, 2868, 2867, 1938, 1937, 1940, 1939, 3649, 3650, 3652, 3651, 3242, 3244, 3241, 3243, 2889, 2890, 2892, 2891, 2785, 2786, 2788, 2787, 2490, 2489, 2492, 2491, 3249, 3252, 3250, 3251, 3353, 3356, 3354, 3355, 1524, 1522, 1521, 1523, 1953, 1956, 1954, 1955, 1754, 1756, 1753, 1755, 2897, 2898, 2900, 2899, 3714, 3716, 3713, 3715, 2681, 2682, 2684, 2683, 1850, 1849, 1852, 1851, 3274, 3273, 3276, 3275, 2953, 2954, 2956, 2955, 2521, 2522, 2524, 2523, 1770, 1772, 1769, 1771, 3281, 3282, 3284, 3283, 3369, 3370, 3372, 3371, 2913, 2914, 2916, 2915, 1882, 1881, 1884, 1883, 1985, 1986, 1988, 1987, 2961, 2962, 2964, 2963, 3378, 3377, 3380, 3379, 2745, 2746, 2748, 2747, 3300, 3297, 3298, 3299, 2537, 2538, 2540, 2539, 3842, 3841, 3844, 3843, 3401, 3402, 3404, 3403, 1777, 1778, 1780, 1779, 1017, 1018, 1020, 1019, 1897, 1900, 1898, 1899, 3612, 3609, 3610, 3611, 2977, 2978, 2980, 2979, 3194, 3193, 3196, 3195, 3626, 3628, 3625, 3627, 3412, 3410, 3409, 3411, 2545, 2546, 2548, 2547, 2777, 2778, 2780, 2779, 3634, 3633, 3636, 3635, 1948, 1945, 1946, 1947, 3009, 3010, 3012, 3011, 3426, 3425, 3428, 3427, 3466, 3468, 3465, 3467, 3657, 3660, 3658, 3659, 1905, 1906, 1908, 1907, 2873, 2874, 2876, 2875, 3258, 3257, 3260, 3259, 3473, 3474, 3476, 3475, 1530, 1529, 1532, 1531, 2793, 2794, 2796, 2795, 1961, 1962, 1964, 1963, 3668, 3665, 3666, 3667, 2801, 2802, 2804, 2803, 2905, 2906, 2908, 2907, 1972, 1969, 1970, 1971, 3290, 3289, 3292, 3291, 3721, 3724, 3722, 3723, 1993, 1994, 1996, 1995, 3489, 3490, 3492, 3491, 2921, 2922, 2924, 2923, 3385, 3386, 3388, 3387, 3524, 3521, 3522, 3523, 3681, 3684, 3682, 3683, 3308, 3305, 3306, 3307, 1785, 1786, 1788, 1787, 2970, 2969, 2972, 2971, 2001, 2002, 2004, 2003, 3732, 3730, 3729, 3731, 2929, 2930, 2932, 2931, 3417, 3418, 3420, 3419, 2985, 2986, 2988, 2987, 3849, 3852, 3850, 3851, 3745, 3746, 3748, 3747, 3313, 3314, 3316, 3315, 2553, 2554, 2556, 2555, 2017, 2018, 2020, 2019, 3434, 3436, 3433, 3435, 3858, 3857, 3860, 3859, 1913, 1916, 1914, 1915, 2993, 2994, 2996, 2995, 3484, 3481, 3482, 3483, 3778, 3780, 3777, 3779, 3017, 3018, 3020, 3019, 3641, 3642, 3644, 3643, 3441, 3444, 3442, 3443, 3674, 3673, 3676, 3675, 3874, 3873, 3876, 3875, 1977, 1980, 1978, 1979, 3025, 3026, 3028, 3027, 2809, 2810, 2812, 2811, 3497, 3500, 3498, 3499, 3905, 3908, 3906, 3907, 3692, 3690, 3689, 3691, 3506, 3505, 3508, 3507, 3041, 3042, 3044, 3043, 2010, 2009, 2012, 2011, 3737, 3740, 3738, 3739, 3529, 3532, 3530, 3531, 2937, 2938, 2940, 2939, 3698, 3697, 3700, 3699, 3321, 3322, 3324, 3323, 3538, 3537, 3540, 3539, 3969, 3970, 3972, 3971, 3753, 3756, 3754, 3755, 2026, 2025, 2028, 2027, 3762, 3761, 3764, 3763, 3865, 3866, 3868, 3867, 3001, 3002, 3004, 3003, 3554, 3553, 3556, 3555, 2033, 2034, 2036, 2035, 3786, 3788, 3785, 3787, 3450, 3449, 3452, 3451, 3033, 3034, 3036, 3035, 3916, 3914, 3913, 3915, 3881, 3882, 3884, 3883, 3794, 3793, 3796, 3795, 3809, 3812, 3810, 3811, 3889, 3892, 3890, 3891, 3513, 3516, 3514, 3515, 3049, 3050, 3052, 3051, 3545, 3548, 3546, 3547, 3705, 3706, 3708, 3707, 3921, 3922, 3924, 3923, 3057, 3058, 3060, 3059, 3978, 3977, 3980, 3979, 3937, 3940, 3938, 3939, 3562, 3564, 3561, 3563, 2041, 2042, 2044, 2043, 3769, 3772, 3770, 3771, 3986, 3985, 3988, 3987, 3572, 3570, 3569, 3571, 4001, 4004, 4002, 4003, 3802, 3804, 3801, 3803, 3898, 3897, 3900, 3899, 3818, 3820, 3817, 3819, 3930, 3929, 3932, 3931, 4033, 4034, 4036, 4035, 3825, 3826, 3828, 3827, 3065, 3066, 3068, 3067, 3945, 3948, 3946, 3947, 3996, 3993, 3994, 3995, 3953, 3954, 3956, 3955, 3578, 3577, 3580, 3579, 4009, 4010, 4012, 4011, 4020, 4017, 4018, 4019, 4041, 4042, 4044, 4043, 3833, 3834, 3836, 3835, 4049, 4050, 4052, 4051, 4065, 4066, 4068, 4067, 3961, 3964, 3962, 3963, 4025, 4028, 4026, 4027, 4058, 4057, 4060, 4059, 4074, 4073, 4076, 4075, 4081, 4082, 4084, 4083, 4089, 4090, 4092, 4091].

In an implementation, when $N_{max}=4096$, B=16, KL=3, and KH=13, corresponding Q1, Q2, and Q3 are as follows.

Q3=[0, 1, 2, 4, 8, 16, 32, 3, 5, 64, 9, 6, 17, 10, 18, 128, 12, 33, 65, 256, 34, 7, 129, 66, 512, 11, 20, 24, 130, 19, 13, 48, 14, 257, 21, 258, 26, 513, 80, 25, 22, 514, 96, 144, 28, 49, 272, 160, 1026, 288, 528, 192, 544, 44, 81, 50, 15, 320, 23, 384, 76, 82, 27, 36, 40, 35, 37, 38, 41, 42, 97, 39, 145, 29, 43, 68, 72, 67, 69, 74, 70, 73, 98, 140, 30, 146, 71, 2048, 161, 576, 45, 640, 1025, 46, 75, 132, 136, 131, 133, 134, 137, 138, 273, 162, 193, 77, 768, 268, 274, 112, 1024, 135, 78, 289, 194, 139, 260, 264, 259, 261, 262, 265, 266, 60, 290, 529, 524, 141, 1040, 176, 2049, 142, 530, 321, 31, 1056, 545, 322, 2050, 263, 304, 92, 47, 267, 516, 520, 515, 517, 518, 521, 522, 385, 546, 208, 386, 1088, 577, 113, 79, 269, 108, 578, 224, 519, 270, 1041, 641, 1036, 523, 52, 56, 51, 53, 54, 57, 58, 55, 59, 84, 88, 83, 85, 86, 89, 90, 560, 114, 156, 87, 1152, 2064, 61, 1042, 525, 642, 526, 177, 1057, 91, 100, 104, 99, 101, 102, 105, 106, 769, 2080, 172, 336, 62, 143, 103, 178, 93, 1058, 592, 770, 107, 148, 152, 147, 149, 150, 153, 154, 1280, 151, 209, 284, 94, 204, 400, 608, 2112, 1089, 352, 155, 164, 168, 163, 165, 166, 169, 170, 210, 305, 300, 109, 1090, 167, 225, 306, 157, 2065, 656, 110, 171, 276, 280, 275, 277, 281, 278, 282, 1038, 1153, 226, 416, 271, 279, 158, 337, 2066, 672, 332, 540, 1072, 2176, 173, 1037, 784, 338, 1536, 704, 1154, 174, 2060, 283, 196, 200, 195, 197, 198, 201, 202, 199, 2081, 448, 353, 2113, 561, 203, 1028, 1032, 1030, 1033, 1034, 1029, 1027, 63, 1281, 527, 556, 285, 124, 205, 2304, 562, 286, 354, 2082, 401, 1104, 396, 1282, 593, 240, 206, 95, 800, 402, 301, 417, 1120, 832, 588, 1035, 1537, 2177, 2114, 896, 594, 418, 2560, 302, 111, 1052, 1168, 188, 449, 1073, 609, 159, 2178, 541, 610, 657, 333, 2061, 1184, 2096, 368, 652, 1031, 292, 296, 291, 293, 294, 297, 298, 295, 299, 532, 536, 531, 533, 534, 537, 538, 535, 539, 2052, 2056, 2051, 2053, 2057, 2054, 2058, 2055, 2059, 324, 328, 323, 325, 326, 329, 330, 327, 331, 548, 552, 547, 549, 550, 553, 554, 551, 450, 542, 1538, 334, 555, 116, 120, 115, 117, 118, 121, 122, 119, 2062, 175, 123, 388, 392, 387, 389, 390, 393, 394, 391, 658, 2305, 220, 1105, 1068, 395, 580, 584, 579, 581, 582, 585, 586, 673, 583, 1296, 287, 125, 557, 1216, 316, 241, 2306, 1074, 397, 2561, 207, 2128, 674, 558, 785, 1100, 432, 1039, 236, 1312, 624, 587, 1044, 1048, 1043, 1046, 1049, 1045, 1050, 1051, 780, 1122, 705, 126, 242, 398, 303, 189, 1169, 1054, 706, 589, 2562, 1344, 786, 348, 2144, 464, 801, 1069, 1164, 590, 1121, 1552, 2192, 1106, 2076, 572, 1186, 802, 1047, 180, 184, 179, 181, 182, 185, 186, 183, 187, 644, 648, 643, 645, 646, 649, 650, 647, 651, 212, 216, 211, 213, 214, 217, 218, 215, 219, 1060, 1064, 1059, 1061, 1066, 1062, 1065, 1063, 2097, 688, 653, 1070, 369, 2320, 190, 364, 1568, 654, 2208, 335, 480, 221, 3074, 370, 1408, 2336, 543, 1298, 412, 2576, 2240, 1185, 317, 2592, 222, 2092, 237, 559, 1170, 1292, 833, 834, 1053, 2129, 1217, 604, 2098, 433, 720, 816, 1101, 2063, 2368, 897, 1136, 1297, 1600, 318, 898, 781, 1314, 428, 736, 2432, 2124, 625, 238, 2130, 399, 2145, 591, 434, 349, 1102, 620, 1553, 1313, 127, 1067, 308, 312, 307, 309, 310, 313, 314, 311, 315, 228, 232, 227, 229, 230, 233, 234, 231, 235, 772, 776, 771, 773, 774, 777, 778, 775, 779, 1092, 1096, 1091, 1093, 1098, 1094, 1097, 1095, 1099, 340, 344, 339, 341, 342, 345, 346, 343, 347, 2068, 2072, 2067, 2069, 2074, 2073, 2070, 2071, 2075, 1156, 1160, 1155, 1157, 1162, 1158, 1161, 1159, 1163, 356, 360, 355, 357, 358, 361, 362, 359, 363, 564, 568, 563, 565, 569, 566, 570, 567, 191, 782, 2193, 626, 2077, 1218, 571, 2084, 2088, 2083, 2085, 2086, 2089, 2090, 2087, 465, 2091, 404, 408, 403, 405, 406, 409, 410, 407, 2146, 1346, 350, 1084, 668, 1548, 1165, 460, 1200, 2188, 1664, 573, 411, 596, 600, 595, 597, 598, 601, 602, 599, 2078, 1116, 2194, 365, 689, 466, 481, 574, 2209, 413, 2624, 603, 1284, 1288, 1283, 1286, 1289, 1285, 1290, 366, 2093, 1287, 1055, 1570, 655, 2688, 3073, 1166, 684, 1409, 429, 252, 605, 1232, 848, 690, 2094, 482, 2321, 1132, 2210, 1569, 414, 1291, 2116, 2120, 2115, 2117, 2122, 2118, 2121, 2119, 2123, 420, 424, 419, 421, 422, 425, 426, 423, 427, 612, 616, 611, 613, 614, 617, 618, 615, 223, 2241, 1554, 1328, 619, 1076, 1080, 1075, 1077, 1082, 1081, 1078, 1083, 1137, 796, 2125, 1601, 1248, 721, 2816, 716, 1086, 2316, 864, 2322, 606, 912, 1103, 722, 1424, 2160, 1293, 817, 1792, 319, 621, 1180, 812, 3072, 1345, 430, 1138, 2126, 2337, 2242, 239, 622, 1410, 380, 1201, 818, 1294, 461, 496, 669, 1079, 660, 664, 659, 661, 662, 665, 666, 663, 667, 452, 456, 451, 453, 454, 457, 458, 455, 459, 2180, 2184, 2179, 2181, 2182, 2185, 2186, 2183, 2187, 1540, 1544, 1539, 1541, 1546, 1542, 1545, 1543, 2108, 1584, 351, 2338, 2577, 1360, 2572, 737, 462, 2189, 3088, 1666, 1549, 2224, 1196, 738, 2190, 1308, 2578, 1602, 670, 783, 2369, 1085, 849, 2079, 928, 367, 3104, 2593, 1376, 1233, 2370, 685, 844, 1118, 253, 686, 2352, 1133, 850, 444, 1167, 2140, 1547, 676, 680, 675, 678, 677, 681, 682, 679, 683, 1112, 1108, 1110, 1107, 1113, 1109, 1114, 1111, 1115, 244, 248, 243, 245, 246, 249, 250, 251, 247, 2308, 2312, 2307, 2309, 2310, 2313, 2314, 2311, 415, 2095, 1202, 2315, 788, 792, 787, 790, 789, 793, 794, 791, 795, 1128, 1124, 1125, 1123, 1130, 1126, 1129, 1127, 2433, 2594, 1616, 960, 865, 2256, 1131, 708, 712, 707, 709, 710, 713, 714, 711, 2434, 1794, 797, 715, 1172, 1176, 1171, 1174, 1177, 1173, 1178, 1175, 1330, 3136, 636, 1179, 804, 808, 803, 805, 806, 809, 810, 807, 254, 1550, 1665, 717, 2625, 1071, 575, 913, 1440, 798, 811, 372, 376, 374, 371, 373, 377, 378, 375, 2161, 379, 2564, 2568, 2563, 2565, 2566, 2569, 2570, 2127, 2317, 2156, 1564, 431, 2626, 607, 2272, 1228, 2567, 1324, 866, 2318, 1181, 1234, 3089, 908, 1793, 718, 813, 2689, 476, 3084, 1117, 1329, 2571, 2100, 2104, 2099, 2101, 2102, 2105, 2106, 2103, 1295, 1472, 914, 2107, 836, 840, 835, 837, 838, 841, 842, 839, 1249, 752, 2608, 2162, 2204, 814, 929, 3200, 1197, 1680, 623, 1632, 671, 1198, 1362, 2109, 3090, 463, 843, 1192, 1188, 1187, 1189, 1194, 1190, 1193, 1191, 2573, 2690, 1135, 381, 497, 2574, 2225, 1586, 930, 961, 3105, 1182, 2817, 492, 1250, 2220, 700, 2384, 1378, 2110, 1356, 845, 382, 2191, 1585, 1425, 2226, 1229, 2141, 498, 3106, 880, 445, 1392, 2640, 1148, 1696, 1580, 687, 1420, 2818, 1612, 1325, 1134, 1361, 3328, 846, 2257, 2332, 1195, 2132, 2136, 2131, 2133, 2134, 2137, 2138, 2135, 2139, 436, 440, 435, 437, 438, 442, 441, 439, 443, 1300, 1304, 1302, 1299, 1305, 1301, 1306, 1303, 1307, 1220, 1224, 1219, 1221, 1226, 1222, 1225, 1223, 732, 1264, 446, 962, 2142, 2252, 1426, 2448, 1377, 2656, 1310, 637, 3137, 2400, 1551, 1230, 2258, 2353, 1808, 1441, 2348, 2157, 1087, 828, 753, 1326, 799, 255, 3138, 909, 2273, 1309, 719, 2354, 477, 2205, 1617, 2704, 2158, 638, 748, 944, 1728, 3086, 1227, 628, 632, 627, 629, 630, 633, 634, 631, 635, 2148, 2152, 2147, 2149, 2150, 2153, 2154, 2151, 2155, 468, 472, 467, 469, 470, 473, 474, 471, 475, 1320, 1316, 1317, 1318, 1321, 1322, 1315, 1319, 754, 3201, 1183, 1565, 1618, 2274, 478, 1260, 383, 1212, 910, 2464, 2319, 815, 2206, 2385, 976, 2720, 1633, 2380, 2588, 1824, 3120, 1150, 1442, 493, 1357, 2221, 1676, 3085, 701, 1566, 1323, 900, 904, 899, 901, 902, 905, 906, 903, 907, 2196, 2200, 2195, 2197, 2198, 2201, 2202, 2199, 2203, 692, 696, 691, 693, 694, 697, 698, 695, 699, 1348, 1352, 1347, 1350, 1353, 1349, 1354, 1355, 1351, 484, 488, 483, 485, 489, 486, 490, 487, 491, 2212, 2216, 2211, 2213, 2214, 2217, 2218, 2215, 2219, 1556, 1560, 1555, 1558, 1561, 1557, 1562, 1559, 2832, 1473, 2386, 860, 3584, 2752, 3202, 1648, 2222, 1199, 1421, 2496, 2401, 2609, 1682, 1488, 2111, 1358, 1244, 1581, 881, 3329, 2575, 494, 2604, 702, 2333, 876, 2172, 847, 2253, 1856, 992, 1697, 447, 2610, 1436, 2334, 733, 2402, 1340, 1231, 1634, 2449, 3152, 1474, 882, 2444, 1265, 1119, 3330, 2641, 924, 2288, 1810, 734, 829, 2254, 1563, 1140, 1144, 1141, 1142, 1146, 1139, 1145, 1143, 1147, 1572, 1576, 1571, 1573, 1578, 1574, 1577, 1579, 1575, 2324, 2328, 2323, 2325, 2329, 2326, 2330, 2327, 2331, 3076, 3080, 3078, 3081, 3082, 3077, 3075, 1213, 2143, 2848, 2450, 1614, 1730, 2349, 2465, 1327, 1804, 3168, 749, 2880, 945, 2636, 3083, 1456, 1681, 3585, 1266, 1388, 940, 1214, 830, 2642, 2466, 1809, 911, 2350, 1582, 2159, 639, 3100, 1698, 3216, 1372, 1245, 479, 1422, 946, 1677, 750, 2236, 2497, 1393, 3121, 508, 1613, 861, 2657, 1857, 2207, 2589, 2658, 2705, 2381, 1826, 1504, 862, 1920, 3232, 1149, 1359, 2416, 2700, 1596, 3079, 724, 728, 723, 725, 726, 729, 730, 727, 731, 2244, 2248, 2243, 2245, 2246, 2249, 2250, 2247, 2251, 820, 824, 819, 821, 822, 825, 826, 823, 827, 2340, 2344, 2339, 2341, 2342, 2345, 2346, 2343, 2347, 1412, 1416, 1411, 1413, 1418, 1414, 1417, 1415, 1419, 740, 744, 739, 741, 742, 745, 746, 743, 747, 1608, 1604, 1603, 1605, 1609, 1610, 1606, 1607, 1611, 1204, 1208, 1203, 1205, 1210, 1206, 1209, 1211, 1712, 977, 2498, 2590, 3586, 2382, 972, 1311, 2223, 1729, 2706, 877, 1207, 2580, 2584, 2579, 2581, 2582, 2585, 2586, 2583, 2587, 852, 856, 851, 853, 854, 857, 858, 855, 859, 2372, 2376, 2371, 2373, 2374, 2377, 2378, 2375, 2379, 1240, 1236, 1235, 1237, 1242, 1241, 1238, 1239, 1243, 1668, 1672, 1670, 1667, 1673, 1674, 1669, 1675, 1671, 2596, 2600, 2595, 2597, 2598, 2601, 2602, 2599, 2603, 868, 872, 867, 869, 870, 873, 874, 871, 875, 1336, 1332, 1333, 1331, 1337, 1334, 1338, 1335, 1339, 2164, 2168, 2163, 2165, 2166, 2169, 2170, 2167, 2171, 916, 920, 915, 917, 922, 918, 921, 919, 923, 2436, 2440, 2435, 2437, 2438, 2441, 2442, 2439, 2268, 495, 1262, 3153, 1644, 3116, 2443, 1252, 1256, 1253, 1251, 1254, 1257, 1258, 1259, 1341, 1825, 703, 2721, 3344, 1567, 2335, 978, 2173, 2605, 3264, 1246, 2364, 1458, 925, 2289, 1394, 878, 735, 3122, 1678, 2445, 1373, 2255, 1255, 2628, 2632, 2627, 2629, 2630, 2633, 2634, 2631, 993, 2722, 2606, 2833, 3148, 2480, 1452, 3087, 994, 2284, 1744, 3360, 2672, 2635, 1364, 1368, 1365, 1366, 1369, 1363, 1370, 1371, 926, 764, 2828, 941, 3170, 2753, 1628, 1367, 932, 936, 931, 933, 934, 937, 938, 935, 939, 3092, 3096, 3091, 3094, 3097, 3093, 3098, 3099, 2174, 1805, 2290, 1457, 2446, 1921, 1583, 1484, 2351, 831, 1342, 2237, 3217, 1261, 1840, 3102, 1650, 1760, 2754, 1490, 2637, 1615, 751, 3392, 2834, 942, 2396, 1858, 1423, 2512, 2849, 3117, 1692, 3212, 2638, 3169, 3600, 3154, 1598, 1374, 509, 1806, 1922, 2620, 1649, 3234, 973, 1489, 1708, 2850, 892, 3095, 1796, 1800, 1801, 1798, 1795, 1797, 1802, 1799, 1438, 2736, 2701, 1790, 1868, 3118, 2417, 1151, 1506, 2238, 2412, 1597, 863, 3616, 2702, 1714, 2383, 2528, 1803, 2228, 2232, 2227, 2229, 2230, 2233, 2234, 2231, 2235, 500, 504, 499, 502, 501, 505, 506, 503, 507, 2692, 2696, 2691, 2693, 2694, 2697, 2698, 2695, 2699, 964, 968, 963, 965, 966, 969, 970, 967, 971, 1588, 1592, 1587, 1590, 1589, 1593, 1594, 1591, 1008, 2269, 2418, 1276, 510, 3456, 2591, 3346, 2460, 3233, 1389, 2365, 1872, 974, 1453, 2270, 1713, 1215, 2285, 1629, 1520, 2607, 3218, 3340, 2881, 2882, 879, 3101, 1505, 3265, 2652, 2481, 2768, 927, 2864, 3149, 1746, 2945, 1343, 1679, 3184, 1820, 1761, 3345, 3648, 1740, 2366, 1888, 765, 2946, 2829, 956, 3362, 2476, 2784, 1437, 1630, 2673, 2286, 1645, 2447, 2639, 1247, 2482, 1936, 2397, 3150, 1745, 943, 2668, 3601, 1454, 3361, 1841, 1595, 1380, 1384, 1379, 1381, 1386, 1382, 1385, 1387, 1383, 3108, 3112, 3107, 3109, 3114, 3110, 3113, 3111, 2175, 3115, 2260, 2264, 2259, 2261, 2262, 2265, 2266, 2263, 2267, 1428, 1432, 1430, 1427, 1433, 1434, 1429, 1431, 1435, 2356, 2360, 2355, 2357, 2358, 2361, 2362, 2359, 2363, 1620, 1624, 1621, 1626, 1622, 1619, 1625, 1627, 1623, 2820, 2824, 2819, 2821, 2822, 2825, 2826, 2823, 2827, 2276, 2280, 2275, 2277, 2278, 2281, 2282, 2279, 2283, 756, 760, 755, 757, 758, 761, 762, 759, 763, 3140, 3144, 3139, 3141, 3146, 3142, 3145, 3143, 3147, 1448, 1444, 1446, 1445, 1449, 1443, 1450, 1451, 1447, 2388, 2392, 2387, 2389, 2390, 2393, 2394, 2391, 2395, 1636, 1640, 1635, 1638, 1637, 1642, 1641, 1643, 1639, 1684, 1688, 1686, 1685, 1689, 1683, 1690, 1691, 1687, 1476, 1480, 1475, 1478, 1481, 1477, 1482, 1479, 1483, 3204, 3208, 3203, 3205, 3210, 3206, 3209, 3207, 3211, 2404, 2408, 2403, 2405, 2406, 2409, 2410, 2407, 2411, 2612, 2616, 2611, 2613, 2617, 2614, 2618, 2615, 1278, 2239, 766, 2830, 2674, 1709, 3266, 2619, 884, 888, 883, 885, 886, 889, 890, 887, 891, 1272, 1268, 1269, 1270, 1267, 1273, 1274, 1275, 2513, 1646, 511, 3394, 2398, 1485, 3132, 1404, 2716, 1693, 3596, 1952, 3213, 2508, 988, 3248, 1807, 3712, 2621, 3164, 2413, 1391, 2737, 1468, 1836, 2514, 1873, 1271, 2452, 2456, 2451, 2453, 2454, 2457, 2458, 2455, 2459, 1704, 1700, 1699, 1705, 1702, 1701, 1706, 1707, 2529, 2622, 1694, 893, 2461, 2414, 975, 894, 3103, 3618, 2703, 1762, 1842, 1375, 3214, 2732, 3457, 1703, 2644, 2648, 2643, 2645, 2646, 2649, 2650, 2647, 2651, 3332, 3336, 3331, 3334, 3337, 3333, 3338, 3335, 1009, 2477, 1874, 2300, 2653, 3280, 2896, 2738, 1486, 2530, 1889, 1004, 3180, 1821, 1599, 1776, 3617, 2462, 1405, 3339, 948, 952, 947, 949, 950, 953, 954, 951, 955, 2468, 2472, 2467, 2469, 2470, 2473, 2474, 2471, 2475, 1816, 1812, 1811, 1814, 1817, 1818, 1813, 1815, 2271, 1010, 3602, 1984, 1455, 3376, 957, 3185, 2844, 3649, 3296, 2769, 1710, 958, 2764, 3134, 2912, 1938, 1660, 2654, 1500, 2960, 3151, 2770, 1819, 1732, 1736, 1733, 1731, 1738, 1734, 1737, 1739, 1735, 2660, 2664, 2659, 2661, 2662, 2665, 2666, 2663, 2667, 1396, 1400, 1397, 1395, 1402, 1401, 1398, 1399, 1403, 1832, 1828, 1827, 1829, 1830, 1833, 1834, 1831, 1741, 3472, 1516, 3341, 2865, 1932, 3840, 2367, 2669, 3228, 2860, 3393, 2478, 3186, 1838, 1277, 1647, 2287, 2670, 1742, 3458, 2428, 3249, 2866, 1953, 3342, 2509, 1837, 2544, 2717, 1631, 1469, 767, 1904, 1724, 989, 3632, 2399, 1406, 3408, 2785, 2510, 1822, 1835, 3124, 3128, 3123, 3125, 3130, 3129, 3126, 3131, 3127, 2708, 2712, 2707, 2709, 2710, 2713, 2714, 2711, 2715, 2500, 2504, 2499, 2501, 2502, 2505, 2506, 2503, 2507, 980, 984, 979, 981, 982, 985, 986, 983, 987, 3588, 3592, 3587, 3589, 3594, 3590, 3593, 3591, 3714, 3597, 3244, 1890, 2786, 3356, 1522, 3650, 2718, 1695, 2831, 990, 3133, 2897, 1005, 1937, 2976, 2415, 3424, 3281, 2733, 2892, 3166, 2301, 1487, 1869, 2734, 1521, 959, 1263, 3181, 2898, 2492, 1711, 1756, 3215, 3595, 2724, 2728, 2723, 2726, 2725, 2729, 2730, 2727, 2731, 3160, 3156, 3158, 3155, 3161, 3157, 3162, 3159, 3163, 996, 1000, 995, 997, 998, 1001, 1002, 999, 1003, 1460, 1464, 1459, 1462, 1465, 1461, 1466, 1463, 1467, 2292, 2296, 2291, 2293, 2294, 2297, 2298, 2299, 2295, 1860, 1864, 1861, 1859, 1866, 1862, 1865, 1867, 1863, 2836, 2840, 2835, 2838, 2837, 2841, 2842, 2839, 2463, 3250, 2843, 1656, 1652, 1651, 1657, 1654, 1653, 1658, 1655, 3664, 3008, 1870, 2913, 1662, 1985, 3842, 2845, 1954, 3378, 1777, 2684, 2302, 895, 3598, 3713, 2765, 1439, 3119, 2623, 2961, 3488, 1006, 2846, 1661, 3612, 1502, 2479, 1986, 2655, 1852, 3276, 1934, 3372, 2914, 1772, 3229, 3282, 2956, 1470, 3841, 2766, 2861, 1743, 2524, 3165, 3377, 3343, 1968, 3520, 2962, 3297, 2800, 1517, 1778, 2862, 2977, 1823, 3245, 1659, 3176, 3172, 3173, 3171, 3178, 3174, 3177, 3175, 3179, 2756, 2760, 2755, 2757, 2758, 2761, 2762, 2759, 2763, 1492, 1496, 1491, 1494, 1497, 1493, 1498, 1499, 1495, 3220, 3224, 3219, 3222, 3225, 3221, 3226, 3223, 3227, 2852, 2856, 2851, 2853, 2854, 2857, 2858, 2855, 2859, 1928, 1924, 1926, 1923, 1930, 1929, 1925, 1927, 1931, 2420, 2424, 2422, 2419, 2421, 2425, 2426, 2423, 2427, 1512, 1508, 1510, 1507, 1514, 1513, 1509, 1511, 1515, 1720, 1716, 1715, 1718, 1721, 1717, 1722, 1719, 1723, 2884, 2888, 2883, 2885, 2886, 2889, 2890, 2887, 3728, 2671, 3680, 2719, 3246, 3410, 1501, 1900, 2511, 1725, 2891, 3240, 3236, 3235, 3237, 3242, 3238, 3241, 3239, 991, 3183, 2429, 1933, 2545, 3634, 2978, 1839, 3009, 3230, 2540, 1884, 3298, 1726, 2748, 1948, 1518, 1020, 3426, 3404, 2893, 1905, 2430, 3633, 3473, 3277, 2546, 1757, 2928, 2493, 3440, 3196, 3744, 3628, 2735, 1471, 1007, 3468, 2000, 3660, 3373, 3182, 3409, 2894, 1871, 3243, 2484, 2488, 2483, 2485, 2486, 2490, 2489, 2487, 2491, 3348, 3352, 3350, 3347, 3353, 3349, 3354, 3351, 3355, 3268, 3272, 3267, 3269, 3274, 3270, 3273, 3271, 2780, 3312, 2494, 3010, 3474, 3425, 3358, 2685, 3599, 1758, 3278, 1906, 3856, 3489, 1773, 3135, 1853, 2876, 2801, 3374, 2847, 2303, 2957, 3357, 2767, 1503, 2525, 3665, 1885, 2686, 2796, 2016, 2992, 3776, 1854, 3275, 1752, 1748, 1749, 1747, 1754, 1750, 1753, 1755, 1751, 1848, 1844, 1843, 1850, 1845, 1846, 1849, 1851, 1847, 2676, 2680, 2675, 2677, 2678, 2681, 2682, 2679, 2683, 3368, 3364, 3365, 3366, 3369, 3370, 3363, 3367, 1532, 2802, 1774, 3231, 3613, 3666, 2526, 3308, 2431, 3260, 2958, 1969, 2863, 3024, 1279, 3681, 1663, 3872, 3198, 3490, 2541, 3405, 1964, 3724, 2749, 3614, 1021, 3371, 2516, 2520, 2515, 2517, 2518, 2521, 2522, 2519, 2523, 2948, 2952, 2947, 2949, 2950, 2953, 2954, 2951, 2955, 1764, 1768, 1763, 1765, 1770, 1766, 1769, 1767, 1771, 2740, 2744, 2739, 2741, 2742, 2745, 2746, 2743, 2747, 3396, 3400, 3395, 3398, 3401, 3397, 3402, 3403, 3399, 2532, 2536, 2531, 2533, 2537, 2534, 2538, 2535, 2539, 3604, 3608, 3603, 3606, 3609, 3605, 3610, 3607, 1935, 3521, 2908, 1886, 2001, 3696, 1407, 3247, 3469, 1970, 1022, 3730, 3536, 1902, 3406, 3292, 3629, 2929, 2542, 1759, 2750, 2924, 2895, 3904, 3040, 3745, 2495, 1996, 3484, 2781, 2002, 3388, 3279, 1949, 3682, 2017, 3522, 2930, 1534, 3313, 3167, 2972, 3858, 2782, 2877, 1788, 3611, 1876, 1880, 1877, 1882, 1878, 1881, 1875, 1883, 1879, 1012, 1016, 1011, 1013, 1014, 1017, 1018, 1015, 1019, 3188, 3192, 3189, 3190, 3194, 3187, 3193, 3191, 3195, 1892, 1896, 1891, 1897, 1894, 1893, 1898, 1895, 1899, 3620, 3624, 3619, 3621, 3626, 3622, 3625, 3627, 3623, 2772, 2776, 2771, 2773, 2774, 2777, 2778, 2775, 2779, 1944, 1940, 1939, 1941, 1945, 1942, 1946, 1943, 1947, 2868, 2872, 2867, 2869, 2870, 2873, 2874, 2871, 2875, 3460, 3464, 3459, 3461, 3466, 3462, 3465, 3463, 3467, 2788, 2792, 2787, 2789, 2790, 2793, 2794, 2791, 2795, 3656, 3652, 3651, 3653, 3657, 3658, 3654, 3655, 3261, 3659, 1524, 1528, 1525, 1530, 1523, 1529, 1526, 1527, 1965, 1901, 3662, 3778, 1966, 1775, 3375, 3852, 2797, 2993, 3504, 3729, 1531, 3252, 3256, 3251, 3253, 3258, 3254, 3257, 3259, 3314, 3436, 2988, 3262, 1950, 2878, 3857, 2959, 3630, 2018, 2687, 1727, 3746, 1916, 3420, 3293, 2527, 1855, 3470, 2994, 3725, 2798, 3441, 2556, 3661, 2909, 3905, 3874, 3552, 2910, 3968, 1887, 3197, 3407, 1023, 3644, 3760, 3025, 3020, 3359, 1998, 3777, 2925, 3255, 1956, 1960, 1955, 1958, 1961, 1957, 1962, 1959, 1963, 2900, 2904, 2899, 2901, 2902, 2905, 2906, 2903, 2907, 3288, 3284, 3283, 3285, 3290, 3289, 3286, 3287, 3291, 3716, 3720, 3718, 3715, 3721, 3722, 3717, 3723, 3719, 1992, 1988, 1989, 1993, 1987, 1994, 1990, 1991, 1995, 2916, 2920, 2915, 2917, 2918, 2921, 2922, 2919, 2923, 3384, 3380, 3381, 3379, 3385, 3382, 3386, 3383, 3387, 1784, 1780, 1781, 1782, 1785, 1779, 1786, 1787, 1783, 2964, 2968, 2963, 2965, 2970, 2966, 2969, 2967, 2971, 3300, 3304, 3301, 3299, 3302, 3305, 3306, 3307, 2543, 3310, 1980, 3692, 3389, 3873, 2751, 1903, 3615, 3026, 1789, 3294, 3506, 2973, 3442, 2926, 2783, 1997, 3726, 2032, 3421, 3303, 3412, 3416, 3413, 3414, 3417, 3411, 3418, 3419, 3041, 1917, 3500, 3042, 3792, 2974, 2812, 2989, 1519, 3676, 3415, 3844, 3848, 3849, 3846, 3843, 3845, 3850, 3847, 3853, 3505, 3969, 3631, 1951, 3532, 2879, 3390, 3309, 3888, 3698, 3808, 3538, 3663, 2799, 2990, 3906, 1790, 3471, 3740, 2012, 3646, 3422, 2557, 3854, 3970, 3697, 1967, 3021, 3537, 3756, 2940, 3486, 3438, 3916, 3199, 3554, 1981, 3645, 2911, 3762, 3851, 2980, 2984, 2979, 2981, 2982, 2985, 2986, 2983, 2987, 2548, 2552, 2547, 2550, 2549, 2553, 2554, 2551, 2555, 1912, 1908, 1907, 1913, 1910, 1909, 1914, 1911, 1915, 3636, 3640, 3635, 3638, 3637, 3641, 3642, 3639, 3056, 1918, 3324, 2558, 2033, 1999, 3437, 3920, 3022, 3501, 2028, 3761, 3263, 1533, 3677, 3568, 2927, 3553, 2975, 1982, 3794, 3391, 3727, 2034, 3868, 3809, 3788, 3936, 2813, 3004, 3485, 3678, 2013, 3693, 3295, 3984, 3793, 2991, 3502, 3889, 3643, 3012, 3016, 3011, 3013, 3014, 3017, 3018, 3015, 3019, 3428, 3432, 3427, 3429, 3434, 3430, 3433, 3435, 3431, 3476, 3480, 3478, 3475, 3481, 3482, 3477, 3479, 3483, 1976, 1972, 1971, 1974, 1977, 1973, 1978, 1975, 1979, 3668, 3672, 3674, 3670, 3667, 3673, 3675, 3671, 2804, 2808, 2803, 2805, 2806, 2809, 2810, 2807, 2811, 3496, 3492, 3494, 3493, 3497, 3491, 3498, 3499, 3495, 3684, 3688, 3683, 3686, 3685, 3690, 3689, 3691, 3687, 3732, 3736, 3734, 3733, 3737, 3731, 3738, 3739, 3735, 2004, 2008, 2005, 2003, 2010, 2006, 2009, 2011, 2007, 3524, 3528, 3523, 3526, 3529, 3525, 3530, 3527, 3531, 2932, 2936, 2931, 2933, 2934, 2937, 2938, 2935, 2939, 3320, 3316, 3317, 3318, 3315, 3321, 3322, 3323, 3326, 2814, 2030, 3757, 3694, 2559, 2014, 3533, 3452, 3741, 4000, 3036, 3855, 3439, 3516, 1535, 3884, 3921, 3319, 3752, 3748, 3747, 3753, 3750, 3749, 3754, 3755, 2029, 3742, 2941, 3023, 2942, 3810, 3890, 3423, 3751, 2020, 2024, 2019, 2021, 2026, 2025, 2022, 2023, 2027, 2996, 3000, 2995, 2997, 2998, 3001, 3002, 2999, 3057, 3922, 3003, 3864, 3860, 3859, 3862, 3865, 3866, 3861, 3863, 3534, 3937, 3052, 3869, 3647, 3824, 3453, 3058, 4032, 3503, 1791, 3005, 3758, 3006, 3986, 3708, 3548, 3867, 3780, 3784, 3781, 3779, 3786, 3782, 3785, 3787, 3783, 3444, 3448, 3445, 3443, 3450, 3449, 3446, 3447, 3451, 3880, 3876, 3875, 3877, 3878, 3881, 3882, 3879, 3789, 3564, 3980, 3886, 3325, 3695, 1919, 3790, 4001, 3885, 3679, 3517, 2815, 3952, 3772, 3037, 3454, 3870, 3883, 3028, 3032, 3027, 3029, 3030, 3033, 3034, 3031, 3035, 3044, 3048, 3043, 3045, 3046, 3050, 3047, 2044, 3938, 3051, 3508, 3512, 3507, 3510, 3513, 3509, 3514, 3511, 3515, 3908, 3912, 3909, 3907, 3914, 3910, 3913, 3915, 3911, 3704, 3700, 3699, 3705, 3702, 3701, 3706, 3570, 3743, 3038, 3053, 3985, 3703, 3535, 3917, 3569, 3007, 3311, 3759, 3804, 2031, 3918, 3710, 4033, 4002, 3825, 2943, 3487, 3054, 3709, 3550, 4034, 1983, 3900, 3982, 3820, 3518, 3791, 4016, 3565, 3826, 3871, 2046, 3707, 3540, 3544, 3539, 3542, 3545, 3541, 3546, 3547, 3543, 3976, 3972, 3974, 3971, 3978, 3977, 3973, 3975, 3979, 2036, 2040, 2035, 2037, 2038, 2041, 2042, 2039, 2043, 3560, 3556, 3558, 3555, 3562, 3561, 3557, 3559, 3563, 3768, 3764, 3763, 3766, 3769, 3765, 3770, 3767, 3771, 3896, 3892, 3891, 3898, 3893, 3894, 3897, 3549, 3948, 3773, 3039, 3981, 3887, 3932, 2047, 3774, 3996, 3566, 3068, 3953, 3899, 3805, 2015, 3519, 3055, 4048, 3895, 3800, 3796, 3797, 3795, 3802, 3798, 3801, 3803, 3919, 3806, 3954, 3821, 3901, 3799, 3812, 3816, 3811, 3813, 3818, 3814, 3817, 3815, 3819, 3924, 3928, 3925, 3930, 3926, 3929, 3923, 3931, 3551, 3933, 4064, 3902, 3580, 3822, 4017, 3327, 3711, 4012, 3069, 3983, 3934, 4049, 3455, 2045, 4018, 3927, 3060, 3064, 3059, 3061, 3062, 3065, 3066, 3063, 3067, 3940, 3944, 3939, 3945, 3942, 3941, 3946, 3943, 3947, 3992, 3988, 3987, 3989, 3993, 3990, 3994, 3991, 3070, 3950, 3995, 3572, 3576, 3573, 3578, 3571, 3577, 3574, 3807, 3575, 4044, 4050, 3997, 4065, 3582, 3836, 4013, 3949, 4014, 3823, 3579, 4004, 4008, 4003, 4006, 4009, 4005, 4010, 4007, 3998, 4066, 3775, 3964, 3903, 3935, 3071, 4011, 4040, 4036, 4037, 4041, 4035, 4042, 4038, 4039, 4043, 3832, 3828, 3829, 3830, 3833, 3827, 3834, 3835, 4046, 3831, 3960, 3956, 3955, 3961, 3958, 3957, 3962, 4028, 3951, 3837, 4045, 4080, 3965, 3567, 3999, 3959, 3838, 4060, 4015, 3963, 4024, 4020, 4019, 4022, 4025, 4021, 4026, 4023, 4029, 3966, 4081, 4047, 4076, 3581, 4030, 4082, 4027, 4052, 4056, 4053, 4051, 4058, 4054, 4057, 4059, 4061, 4055, 4068, 4072, 4067, 4069, 4074, 4073, 4070, 4071, 4078, 4062, 3583, 4075, 4084, 4088, 4077, 4083, 4085, 3839, 4086, 4089, 3967, 4090, 4087, 4092, 4091, 4079, 4031, 4094, 4095, 4063, 4093].

Q1=[0, 1, 2, 16, 32, 64, 17, 18, 128, 12, 33, 65, 256, 34, 129, 66, 512, 130, 13, 48, 14, 257, 258, 513, 80, 514, 96, 144, 28, 49, 272, 160, 1026, 288, 528, 192, 544, 44, 81, 50, 15, 320, 384, 76, 82, 97, 145, 29, 98, 140, 30, 146, 2048, 161, 576, 45, 640, 1025, 46, 273, 162, 193, 77, 768, 268, 274, 112, 1024, 78, 289, 194, 60, 290, 529, 524, 141, 1040, 176, 2049, 142, 530, 321, 31, 1056, 545, 322, 2050, 304, 92, 47, 385, 546, 208, 386, 1088, 577, 113, 79, 269, 108, 578, 224, 270, 1041, 641, 1036, 560, 114, 156, 1152, 2064, 61, 1042, 525, 642, 526, 177, 1057, 769, 2080, 172, 336, 62, 143, 178, 93, 1058, 592, 770, 1280, 209, 284, 94, 204, 400, 608, 2112, 1089, 352, 210, 305, 300, 109, 1090, 225, 306, 157, 2065, 656, 110, 1038, 1153, 226, 416, 271, 158, 337, 2066, 672, 332, 540, 1072, 2176, 173, 1037, 784, 338, 1536, 704, 1154, 174, 2060, 2081, 448, 353, 2113, 561, 63, 1281, 527, 556, 285, 124, 205, 2304, 562, 286, 354, 2082, 401, 1104, 396, 1282, 593, 240, 206, 95, 800, 402, 301, 417, 1120, 832, 588, 1537, 2177, 2114, 896, 594, 418, 2560, 302, 111, 1052, 1168, 188, 449, 1073, 609, 159, 2178, 541, 610, 657, 333, 2061, 1184, 2096, 368, 652, 450, 542, 1538, 334, 2062, 175, 658, 2305, 220, 1105, 1068, 673, 1296, 287, 125, 557, 1216, 316, 241, 2306, 1074, 397, 2561, 207, 2128, 674, 558, 785, 1100, 432, 1039, 236, 1312, 624, 780, 1122, 705, 126, 242, 398, 303, 189, 1169, 1054, 706, 589, 2562, 1344, 786, 348, 2144, 464, 801, 1069, 1164, 590, 1121, 1552, 2192, 1106, 2076, 572, 1186, 802, 2097, 688, 653, 1070, 369, 2320, 190, 364, 1568, 654, 2208, 335, 480, 221, 3074, 370, 1408, 2336, 543, 1298, 412, 2576, 2240, 1185, 317, 2592, 222, 2092, 237, 559, 1170, 1292, 833, 834, 1053, 2129, 1217, 604, 2098, 433, 720, 816, 1101, 2063, 2368, 897, 1136, 1297, 1600, 318, 898, 781, 1314, 428, 736, 2432, 2124, 625, 238, 2130, 399, 2145, 591, 434, 349, 1102, 620, 1553, 1313, 127, 191, 782, 2193, 626, 2077, 1218, 465, 2146, 1346, 350, 1084, 668, 1548, 1165, 460, 1200, 2188, 1664, 573, 2078, 1116, 2194, 365, 689, 466, 481, 574, 2209, 413, 2624, 366, 2093, 1055, 1570, 655, 2688, 3073, 1166, 684, 1409, 429, 252, 605, 1232, 848, 690, 2094, 482, 2321, 1132, 2210, 1569, 414, 223, 2241, 1554, 1328, 1137, 796, 2125, 1601, 1248, 721, 2816, 716, 1086, 2316, 864, 2322, 606, 912, 1103, 722, 1424, 2160, 1293, 817, 1792, 319, 621, 1180, 812, 3072, 1345, 430, 1138, 2126, 2337, 2242, 239, 622, 1410, 380, 1201, 818, 1294, 461, 496, 669, 2108, 1584, 351, 2338, 2577, 1360, 2572, 737, 462, 2189, 3088, 1666, 1549, 2224, 1196, 738, 2190, 1308, 2578, 1602, 670, 783, 2369, 1085, 849, 2079, 928, 367, 3104, 2593, 1376, 1233, 2370, 685, 844, 1118, 253, 686, 2352, 1133, 850, 444, 1167, 2140, 415, 2095, 1202, 2433, 2594, 1616, 960, 865, 2256, 2434, 1794, 797, 1330, 3136, 636, 254, 1550, 1665, 717, 2625, 1071, 575, 913, 1440, 798, 2161, 2127, 2317, 2156, 1564, 431, 2626, 607, 2272, 1228, 1324, 866, 2318, 1181, 1234, 3089, 908, 1793, 718, 813, 2689, 476, 3084, 1117, 1329, 1295, 1472, 914, 1249, 752, 2608, 2162, 2204, 814, 929, 3200, 1197, 1680, 623, 1632, 671, 1198, 1362, 2109, 3090, 463, 2573, 2690, 1135, 381, 497, 2574, 2225, 1586, 930, 961, 3105, 1182, 2817, 492, 1250, 2220, 700, 2384, 1378, 2110, 1356, 845, 382, 2191, 1585, 1425, 2226, 1229, 2141, 498, 3106, 880, 445, 1392, 2640, 1148, 1696, 1580, 687, 1420, 2818, 1612, 1325, 1134, 1361, 3328, 846, 2257, 2332, 732, 1264, 446, 962, 2142, 2252, 1426, 2448, 1377, 2656, 1310, 637, 3137, 2400, 1551, 1230, 2258, 2353, 1808, 1441, 2348, 2157, 1087, 828, 753, 1326, 799, 255, 3138, 909, 2273, 1309, 719, 2354, 477, 2205, 1617, 2704, 2158, 638, 748, 944, 1728, 3086, 754, 3201, 1183, 1565, 1618, 2274, 478, 1260, 383, 1212, 910, 2464, 2319, 815, 2206, 2385, 976, 2720, 1633, 2380, 2588, 1824, 3120, 1150, 1442, 493, 1357, 2221, 1676, 3085, 701, 1566, 2832, 1473, 2386, 860, 3584, 2752, 3202, 1648, 2222, 1199, 1421, 2496, 2401, 2609, 1682, 1488, 2111, 1358, 1244, 1581, 881, 3329, 2575, 494, 2604, 702, 2333, 876, 2172, 847, 2253, 1856, 992, 1697, 447, 2610, 1436, 2334, 733, 2402, 1340, 1231, 1634, 2449, 3152, 1474, 882, 2444, 1265, 1119, 3330, 2641, 924, 2288, 1810, 734, 829, 2254, 1213, 2143, 2848, 2450, 1614, 1730, 2349, 2465, 1327, 1804, 3168, 749, 2880, 945, 2636, 1456, 1681, 3585, 1266, 1388, 940, 2944, 1214, 830, 2642, 2466, 1809, 911, 2350, 1582, 2159, 639, 3100, 1698, 3216, 1372, 1245, 479, 1422, 946, 1677, 750, 2236, 2497, 1393, 3121, 508, 1613, 861, 2657, 1857, 2207, 2589, 2658, 2705, 2381, 1826, 1504, 862, 1920, 3232, 1149, 1359, 2416, 2700, 1596, 1712, 977, 2498, 2590, 3586, 2382, 972, 1311, 2223, 1729, 2706, 877, 2268, 495, 1262, 3153, 1644, 3116, 1341, 1825, 703, 2721, 3344, 1567, 2335, 978, 2173, 2605, 3264, 1246, 2364, 1458, 925, 2289, 1394, 878, 735, 3122, 1678, 2445, 1373, 2255, 993, 2722, 2606, 2833, 3148, 2480, 1452, 3087, 994, 2284, 1744, 3360, 2672, 926, 764, 2828, 941, 3170, 2753, 1628, 2174, 1805, 2290, 1457, 2446, 1921, 1583, 1484, 2351, 831, 1342, 2237, 3217, 1261, 1840, 3102, 1650, 1760, 2754, 1490, 2637, 1615, 751, 3392, 2834, 942, 2396, 1858, 1423, 2512, 2849, 3117, 1692, 3212, 2638, 3169, 3600, 3154, 1598, 1374, 509, 1806, 1922, 2620, 1649, 3234, 973, 1489, 1708, 2850, 892, 1438, 2736, 2701, 1390, 1868, 3118, 2417, 1151, 1506, 2238, 2412, 1597, 863, 3616, 2702, 1714, 2383, 2528, 1008, 2269, 2418, 1276, 510, 3456, 2591, 3346, 2460, 3233, 1389, 2365, 1872, 974, 1453, 2270, 1713, 1215, 2285, 1629, 1520, 2607, 3218, 3340, 2881, 2882, 879, 3101, 1505, 3265, 2652, 2481, 2768, 927, 2864, 3149, 1746, 2945, 1343, 1679, 3184, 1820, 1761, 3345, 3648, 1740, 2366, 1888, 765, 2946, 2829, 956, 3362, 2476, 2784, 1437, 1630, 2673, 2286, 1645, 2447, 2639, 1247, 2482, 1936, 2397, 3150, 1745, 943, 2668, 3601, 1454, 3361, 1841, 2175, 1278, 2239, 766, 2830, 2674, 1709, 3266, 2513, 1646, 511, 3394, 2398, 1485, 3132, 1404, 2716, 1693, 3596, 1952, 3213, 2508, 988, 3248, 1807, 3712, 2621, 3164, 2413, 1391, 2737, 1468, 1836, 2514, 1873, 2529, 2622, 1694, 893, 2461, 2414, 975, 894, 3103, 3618, 2703, 1762, 1842, 1375, 3214, 2732, 3457, 1009, 2477, 1874, 2300, 2653, 3280, 2896, 2738, 1486, 2530, 1889, 1004, 3180, 1821, 1599, 1776, 3617, 2462, 1405, 2271, 1010, 3602, 1984, 1455, 3376, 957, 3185, 2844, 3649, 3296, 2769, 1710, 958, 2764, 3134, 2912, 1938, 1660, 2654, 1500, 2960, 3151, 2770, 1741, 3472, 1516, 3341, 2865, 1932, 3840, 2367, 2669, 3228, 2860, 3393, 2478, 3186, 1838, 1277, 1647, 2287, 2670, 1742, 3458, 2428, 3249, 2866, 1953, 3342, 2509, 1837, 2544, 2717, 1631, 1469, 767, 1904, 1724, 989, 3632, 2399, 1406, 3408, 2785, 2510, 1822, 3714, 3597, 3244, 1890, 2786, 3356, 1522, 3650, 2718, 1695, 2831, 990, 3133, 2897, 1005, 1937, 2976, 2415, 3424, 3281, 2733, 2892, 3166, 2301, 1487, 1869, 2734, 1521, 959, 1263, 3181, 2898, 2492, 1711, 1756, 3215, 2463, 3250, 3664, 3008, 1870, 2913, 1662, 1985, 3842, 2845, 1954, 3378, 1777, 2684, 2302, 895, 3598, 3713, 2765, 1439, 3119, 2623, 2961, 3488, 1006, 2846, 1661, 3612, 1502, 2479, 1986, 2655, 1852, 3276, 1934, 3372, 2914, 1772, 3229, 3282, 2956, 1470, 3841, 2766, 2861, 1743, 2524, 3165, 3377, 3343, 1968, 3520, 2962, 3297, 2800, 1517, 1778, 2862, 2977, 1823, 3245, 3728, 2671, 3680, 2719, 3246, 3410, 1501, 1900, 2511, 1725, 991, 3183, 2429, 1933, 2545, 3634, 2978, 1839, 3009, 3230, 2540, 1884, 3298, 1726, 2748, 1948, 1518, 1020, 3426, 3404, 2893, 1905, 2430, 3633, 3473, 3277, 2546, 1757, 2928, 2493, 3440, 3196, 3744, 3628, 2735, 1471, 1007, 3468, 2000, 3660, 3373, 3182, 3409, 2894, 1871, 2780, 3312, 2494, 3010, 3474, 3425, 3358, 2685, 3599, 1758, 3278, 1906, 3856, 3489, 1773, 3135, 1853, 2876, 2801, 3374, 2847, 2303, 2957, 3357, 2767, 1503, 2525, 3665, 1885, 2686, 2796, 2016, 2992, 3776, 1854, 1532, 2802, 1774, 3231, 3613, 3666, 2526, 3308, 2431, 3260, 2958, 1969, 2863, 3024, 1279, 3681, 1663, 3872, 3198, 3490, 2541, 3405, 1964, 3724, 2749, 3614, 1021, 1935, 3521, 2908, 1886, 2001, 3696, 1407, 3247, 3469, 1970, 1022, 3730, 3536, 1902, 3406, 3292, 3629, 2929, 2542, 1759, 2750, 2924, 2895, 3904, 3040, 3745, 2495, 1996, 3484, 2781, 2002, 3388, 3279, 1949, 3682, 2017, 3522, 2930, 1534, 3313, 3167, 2972, 3858, 2782, 2877, 1788, 3261, 1965, 1901, 3662, 3778, 1966, 1775, 3375, 3852, 2797, 2993, 3504, 3729, 3314, 3436, 2988, 3262, 1950, 2878, 3857, 2959, 3630, 2018, 2687, 1727, 3746, 1916, 3420, 3293, 2527, 1855, 3470, 2994, 3725, 2798, 3441, 2556, 3661, 2909, 3905, 3874, 3552, 2910, 3968, 1887, 3197, 3407, 1023, 3644, 3760, 3025, 3020, 3359, 1998, 3777, 2925, 2543, 3310, 1980, 3692, 3389, 3873, 2751, 1903, 3615, 3026, 1789, 3294, 3506, 2973, 3442, 2926, 2783, 1997, 3726, 2032, 3421, 3041, 1917, 3500, 3042, 3792, 2974, 2812, 2989, 1519, 3676, 3853, 3505, 3969, 3631, 1951, 3532, 2879, 3390, 3309, 3888, 3698, 3808, 3538, 3663, 2799, 2990, 3906, 1790, 3471, 3740, 2012, 3646, 3422, 2557, 3854, 3970, 3697, 1967, 3021, 3537, 3756, 2940, 3486, 3438, 3916, 3199, 3554, 1981, 3645, 2911, 3762, 3056, 1918, 3324, 2558, 2033, 1999, 3437, 3920, 3022, 3501, 2028, 3761, 3263, 1533, 3677, 3568, 2927, 3553, 2975, 1982, 3794, 3391, 3727, 2034, 3868, 3809, 3788, 3936, 2813, 3004, 3485, 3678, 2013, 3693, 3295, 3984, 3793, 2991, 3502, 3889, 3326, 2814, 2030, 3757, 3694, 2559, 2014, 3533, 3452, 3741, 4000, 3036, 3855, 3439, 3516, 1535, 3884, 3921, 2029, 3742, 2941, 3023, 2942, 3810, 3890, 3423, 3057, 3922, 3534, 3937, 3052, 3869, 3647, 3824, 3453, 3058, 4032, 3503, 1791, 3005, 3758, 3006, 3986, 3708, 3548, 3789, 3564, 3980, 3886, 3325, 3695, 1919, 3790, 4001, 3885, 3679, 3517, 2815, 3952, 3772, 3037, 3454, 3870, 2044, 3938, 3570, 3743, 3038, 3053, 3985, 3535, 3917, 3569, 3007, 3311, 3759, 3804, 2031, 3918, 3710, 4033, 4002, 3825, 2943, 3487, 3054, 3709, 3550, 4034, 1983, 3900, 3982, 3820, 3518, 3791, 4016, 3565, 3826, 3871, 2046, 3549, 3948, 3773, 3039, 3981, 3887, 3932, 2047, 3774, 3996, 3566, 3068, 3953, 3805, 2015, 3519, 3055, 4048, 3919, 3806, 3954, 3821, 3901, 3551, 3933, 4064, 3902, 3580, 3822, 4017, 3327, 3711, 4012, 3069, 3983, 3934, 4049, 3455, 2045, 4018, 3070, 3950, 3807, 4044, 4050, 3997, 4065, 3582, 3836, 4013, 3949, 4014, 3823, 3998, 4066, 3775, 3964, 3903, 3935, 3071, 4046, 4028, 3951, 3837, 4045, 4080, 3965, 3567, 3999, 3838, 4060, 4015, 4029, 3966, 4081, 4047, 4076, 3581, 4030, 4082, 4061, 4078, 4062, 3583, 4077, 3839, 3967, 4092, 4079, 4031, 4094, 4095, 4063, 4093].

Q2=[4, 8, 3, 5, 9, 6, 10, 7, 11, 20, 24, 19, 21, 26, 25, 22, 23, 27, 36, 40, 35, 37, 38, 41, 42, 39, 43, 68, 72, 67, 69, 74, 70, 73, 71, 75, 132, 136, 131, 133, 134, 137, 138, 135, 139, 260, 264, 259, 261, 262, 265, 266, 263, 267, 516, 520, 515, 517, 518, 521, 522, 519, 523, 52, 56, 51, 53, 54, 57, 58, 55, 59, 84, 88, 83, 85, 86, 89, 90, 87, 91, 100, 104, 99, 101, 102, 105, 106, 103, 107, 148, 152, 147, 149, 150, 153, 154, 151, 155, 164, 168, 163, 165, 166, 169, 170, 167, 171, 276, 280, 275, 277, 281, 278, 282, 279, 283, 196, 200, 195, 197, 198, 201, 202, 199, 203, 1028, 1032, 1030, 1033, 1034, 1029, 1027, 1035, 1031, 292, 296, 291, 293, 294, 297, 298, 295, 299, 532, 536, 531, 533, 534, 537, 538, 535, 539, 2052, 2056, 2051, 2053, 2057, 2054, 2058, 2055, 2059, 324, 328, 323, 325, 326, 329, 330, 327, 331, 548, 552, 547, 549, 550, 553, 554, 551, 555, 116, 120, 115, 117, 118, 121, 122, 119, 123, 388, 392, 387, 389, 390, 393, 394, 391, 395, 580, 584, 579, 581, 582, 585, 586, 583, 587, 1044, 1048, 1043, 1046, 1049, 1045, 1050, 1051, 1047, 180, 184, 179, 181, 182, 185, 186, 183, 187, 644, 648, 643, 645, 646, 649, 650, 647, 651, 212, 216, 211, 213, 214, 217, 218, 215, 219, 1060, 1064, 1059, 1061, 1066, 1062, 1065, 1063, 1067, 308, 312, 307, 309, 310, 313, 314, 311, 315, 228, 232, 227, 229, 230, 233, 234, 231, 235, 772, 776, 771, 773, 774, 777, 778, 775, 779, 1092, 1096, 1091, 1093, 1098, 1094, 1097, 1095, 1099, 340, 344, 339, 341, 342, 345, 346, 343, 347, 2068, 2072, 2067, 2069, 2074, 2073, 2070, 2071, 2075, 1156, 1160, 1155, 1157, 1162, 1158, 1161, 1159, 1163, 356, 360, 355, 357, 358, 361, 362, 359, 363, 564, 568, 563, 565, 569, 566, 570, 567, 571, 2084, 2088, 2083, 2085, 2086, 2089, 2090, 2087, 2091, 404, 408, 403, 405, 406, 409, 410, 407, 411, 596, 600, 595, 597, 598, 601, 602, 599, 603, 1284, 1288, 1283, 1286, 1289, 1285, 1290, 1287, 1291, 2116, 2120, 2115, 2117, 2122, 2118, 2121, 2119, 2123, 420, 424, 419, 421, 422, 425, 426, 423, 427, 612, 616, 611, 613, 614, 617, 618, 615, 619, 1076, 1080, 1075, 1077, 1082, 1081, 1078, 1083, 1079, 660, 664, 659, 661, 662, 665, 666, 663, 667, 452, 456, 451, 453, 454, 457, 458, 455, 459, 2180, 2184, 2179, 2181, 2182, 2185, 2186, 2183, 2187, 1540, 1544, 1539, 1541, 1546, 1542, 1545, 1543, 1547, 676, 680, 675, 678, 677, 681, 682, 679, 683, 1112, 1108, 1110, 1107, 1113, 1109, 1114, 1111, 1115, 244, 248, 243, 245, 246, 249, 250, 251, 247, 2308, 2312, 2307, 2309, 2310, 2313, 2314, 2311, 2315, 788, 792, 787, 790, 789, 793, 794, 791, 795, 1128, 1124, 1125, 1123, 1130, 1126, 1129, 1127, 1131, 708, 712, 707, 709, 710, 713, 714, 711, 715, 1172, 1176, 1171, 1174, 1177, 1173, 1178, 1175, 1179, 804, 808, 803, 805, 806, 809, 810, 807, 811, 372, 376, 374, 371, 373, 377, 378, 375, 379, 2564, 2568, 2563, 2565, 2566, 2569, 2570, 2567, 2571, 2100, 2104, 2099, 2101, 2102, 2105, 2106, 2103, 2107, 836, 840, 835, 837, 838, 841, 842, 839, 843, 1192, 1188, 1187, 1189, 1194, 1190, 1193, 1191, 1195, 2132, 2136, 2131, 2133, 2134, 2137, 2138, 2135, 2139, 436, 440, 435, 437, 438, 442, 441, 439, 443, 1300, 1304, 1302, 1299, 1305, 1301, 1306, 1303, 1307, 1220, 1224, 1219, 1221, 1226, 1222, 1225, 1223, 1227, 628, 632, 627, 629, 630, 633, 634, 631, 635, 2148, 2152, 2147, 2149, 2150, 2153, 2154, 2151, 2155, 468, 472, 467, 469, 470, 473, 474, 471, 475, 1320, 1316, 1317, 1318, 1321, 1322, 1315, 1319, 1323, 900, 904, 899, 901, 902, 905, 906, 903, 907, 2196, 2200, 2195, 2197, 2198, 2201, 2202, 2199, 2203, 692, 696, 691, 693, 694, 697, 698, 695, 699, 1348, 1352, 1347, 1350, 1353, 1349, 1354, 1355, 1351, 484, 488, 483, 485, 489, 486, 490, 487, 491, 2212, 2216, 2211, 2213, 2214, 2217, 2218, 2215, 2219, 1556, 1560, 1555, 1558, 1561, 1557, 1562, 1559, 1563, 1140, 1144, 1141, 1142, 1146, 1139, 1145, 1143, 1147, 1572, 1576, 1571, 1573, 1578, 1574, 1577, 1575, 1579, 2324, 2328, 2323, 2325, 2329, 2326, 2330, 2327, 2331, 3076, 3080, 3078, 3081, 3082, 3077, 3075, 3083, 3079, 724, 728, 723, 725, 726, 729, 730, 727, 731, 2244, 2248, 2243, 2245, 2246, 2249, 2250, 2247, 2251, 820, 824, 819, 821, 822, 825, 826, 823, 827, 2340, 2344, 2339, 2341, 2342, 2345, 2346, 2343, 2347, 1412, 1416, 1411, 1413, 1418, 1414, 1417, 1415, 1419, 740, 744, 739, 741, 742, 745, 746, 743, 747, 1608, 1604, 1603, 1605, 1609, 1610, 1606, 1607, 1611, 1204, 1208, 1203, 1205, 1210, 1206, 1209, 1211, 1207, 2580, 2584, 2579, 2581, 2582, 2585, 2586, 2583, 2587, 852, 856, 851, 853, 854, 857, 858, 855, 859, 2372, 2376, 2371, 2373, 2374, 2377, 2378, 2375, 2379, 1240, 1236, 1235, 1237, 1242, 1241, 1238, 1239, 1243, 1668, 1672, 1670, 1667, 1673, 1674, 1669, 1675, 1671, 2596, 2600, 2595, 2597, 2598, 2601, 2602, 2599, 2603, 868, 872, 867, 869, 870, 873, 874, 871, 875, 1336, 1332, 1333, 1331, 1337, 1334, 1338, 1335, 1339, 2164, 2168, 2163, 2165, 2166, 2169, 2170, 2167, 2171, 916, 920, 915, 917, 922, 918, 921, 919, 923, 2436, 2440, 2435, 2437, 2438, 2441, 2442, 2439, 2443, 1252, 1256, 1253, 1251, 1254, 1257, 1258, 1259, 1255, 2628, 2632, 2627, 2629, 2630, 2633, 2634, 2631, 2635, 1364, 1368, 1365, 1366, 1369, 1363, 1370, 1371, 1367, 932, 936, 931, 933, 934, 937, 938, 935, 939, 3092, 3096, 3091, 3094, 3097, 3093, 3098, 3099, 3095, 1796, 1800, 1801, 1798, 1795, 1797, 1802, 1799, 1803, 2228, 2232, 2227, 2229, 2230, 2233, 2234, 2231, 2235, 500, 504, 499, 502, 501, 505, 506, 503, 507, 2692, 2696, 2691, 2693, 2694, 2697, 2698, 2695, 2699, 964, 968, 963, 965, 966, 969, 970, 967, 971, 1588, 1592, 1587, 1590, 1589, 1593, 1594, 1591, 1595, 1380, 1384, 1379, 1381, 1386, 1382, 1385, 1387, 1383, 3108, 3112, 3107, 3109, 3114, 3110, 3113, 3111, 3115, 2260, 2264, 2259, 2261, 2262, 2265, 2266, 2263, 2267, 1428, 1432, 1430, 1427, 1433, 1434, 1429, 1431, 1435, 2356, 2360, 2355, 2357, 2358, 2361, 2362, 2359, 2363, 1620, 1624, 1621, 1626, 1622, 1619, 1625, 1627, 1623, 2820, 2824, 2819, 2821, 2822, 2825, 2826, 2823, 2827, 2276, 2280, 2275, 2277, 2278, 2281, 2282, 2279, 2283, 756, 760, 755, 757, 758, 761, 762, 759, 763, 3140, 3144, 3139, 3141, 3146, 3142, 3145, 3143, 3147, 1448, 1444, 1446, 1445, 1449, 1443, 1450, 1451, 1447, 2388, 2392, 2387, 2389, 2390, 2393, 2394, 2391, 2395, 1636, 1640, 1635, 1638, 1637, 1642, 1641, 1643, 1639, 1684, 1688, 1686, 1685, 1689, 1683, 1690, 1691, 1687, 1476, 1480, 1475, 1478, 1481, 1477, 1482, 1479, 1483, 3204, 3208, 3203, 3205, 3210, 3206, 3209, 3207, 3211, 2404, 2408, 2403, 2405, 2406, 2409, 2410, 2407, 2411, 2612, 2616, 2611, 2613, 2617, 2614, 2618, 2615, 2619, 884, 888, 883, 885, 886, 889, 890, 887, 891, 1272, 1268, 1269, 1270, 1267, 1273, 1274, 1275, 1271, 2452, 2456, 2451, 2453, 2454, 2457, 2458, 2455, 2459, 1704, 1700, 1699, 1705, 1702, 1701, 1706, 1707, 1703, 2644, 2648, 2643, 2645, 2646, 2649, 2650, 2647, 2651, 3332, 3336, 3331, 3334, 3337, 3333, 3338, 3335, 3339, 948, 952, 947, 949, 950, 953, 954, 951, 955, 2468, 2472, 2467, 2469, 2470, 2473, 2474, 2471, 2475, 1816, 1812, 1811, 1814, 1817, 1818, 1813, 1815, 1819, 1732, 1736, 1733, 1731, 1738, 1734, 1737, 1739, 1735, 2660, 2664, 2659, 2661, 2662, 2665, 2666, 2663, 2667, 1396, 1400, 1397, 1395, 1402, 1401, 1398, 1399, 1403, 1832, 1828, 1827, 1829, 1830, 1833, 1834, 1831, 1835, 3124, 3128, 3123, 3125, 3130, 3129, 3126, 3131, 3127, 2708, 2712, 2707, 2709, 2710, 2713, 2714, 2711, 2715, 2500, 2504, 2499, 2501, 2502, 2505, 2506, 2503, 2507, 980, 984, 979, 981, 982, 985, 986, 983, 987, 3588, 3592, 3587, 3589, 3594, 3590, 3593, 3591, 3595, 2724, 2728, 2723, 2726, 2725, 2729, 2730, 2727, 2731, 3160, 3156, 3158, 3155, 3161, 3157, 3162, 3159, 3163, 996, 1000, 995, 997, 998, 1001, 1002, 999, 1003, 1460, 1464, 1459, 1462, 1465, 1461, 1466, 1463, 1467, 2292, 2296, 2291, 2293, 2294, 2297, 2298, 2299, 2295, 1860, 1864, 1861, 1859, 1866, 1862, 1865, 1867, 1863, 2836, 2840, 2835, 2838, 2837, 2841, 2842, 2839, 2843, 1656, 1652, 1651, 1657, 1654, 1653, 1658, 1655, 1659, 3176, 3172, 3173, 3171, 3178, 3174, 3177, 3175, 3179, 2756, 2760, 2755, 2757, 2758, 2761, 2762, 2759, 2763, 1492, 1496, 1491, 1494, 1497, 1493, 1498, 1499, 1495, 3220, 3224, 3219, 3222, 3225, 3221, 3226, 3223, 3227, 2852, 2856, 2851, 2853, 2854, 2857, 2858, 2855, 2859, 1928, 1924, 1926, 1923, 1930, 1929, 1925, 1927, 1931, 2420, 2424, 2422, 2419, 2421, 2425, 2426, 2423, 2427, 1512, 1508, 1510, 1507, 1514, 1513, 1509, 1511, 1515, 1720, 1716, 1715, 1718, 1721, 1717, 1722, 1719, 1723, 2884, 2888, 2883, 2885, 2886, 2889, 2890, 2887, 2891, 3240, 3236, 3235, 3237, 3242, 3238, 3241, 3239, 3243, 2484, 2488, 2483, 2485, 2486, 2490, 2489, 2487, 2491, 3348, 3352, 3350, 3347, 3353, 3349, 3354, 3351, 3355, 3268, 3272, 3267, 3269, 3274, 3270, 3273, 3271, 3275, 1752, 1748, 1749, 1747, 1754, 1750, 1753, 1755, 1751, 1848, 1844, 1843, 1850, 1845, 1846, 1849, 1851, 1847, 2676, 2680, 2675, 2677, 2678, 2681, 2682, 2679, 2683, 3368, 3364, 3365, 3366, 3369, 3370, 3363, 3367, 3371, 2516, 2520, 2515, 2517, 2518, 2521, 2522, 2519, 2523, 2948, 2952, 2947, 2949, 2950, 2953, 2954, 2951, 2955, 1764, 1768, 1763, 1765, 1770, 1766, 1769, 1767, 1771, 2740, 2744, 2739, 2741, 2742, 2745, 2746, 2743, 2747, 3396, 3400, 3395, 3398, 3401, 3397, 3402, 3403, 3399, 2532, 2536, 2531, 2533, 2537, 2534, 2538, 2535, 2539, 3604, 3608, 3603, 3606, 3609, 3605, 3610, 3607, 3611, 1876, 1880, 1877, 1882, 1878, 1881, 1875, 1883, 1879, 1012, 1016, 1011, 1013, 1014, 1017, 1018, 1015, 1019, 3188, 3192, 3189, 3190, 3194, 3187, 3193, 3191, 3195, 1892, 1896, 1891, 1897, 1894, 1893, 1898, 1895, 1899, 3620, 3624, 3619, 3621, 3626, 3622, 3625, 3627, 3623, 2772, 2776, 2771, 2773, 2774, 2777, 2778, 2775, 2779, 1944, 1940, 1939, 1941, 1945, 1942, 1946, 1943, 1947, 2868, 2872, 2867, 2869, 2870, 2873, 2874, 2871, 2875, 3460, 3464, 3459, 3461, 3466, 3462, 3465, 3463, 3467, 2788, 2792, 2787, 2789, 2790, 2793, 2794, 2791, 2795, 3656, 3652, 3651, 3653, 3657, 3658, 3654, 3655, 3659, 1524, 1528, 1525, 1530, 1523, 1529, 1526, 1527, 1531, 3252, 3256, 3251, 3253, 3258, 3254, 3257, 3259, 3255, 1956, 1960, 1955, 1958, 1961, 1957, 1962, 1959, 1963, 2900, 2904, 2899, 2901, 2902, 2905, 2906, 2903, 2907, 3288, 3284, 3283, 3285, 3290, 3289, 3286, 3287, 3291, 3716, 3720, 3718, 3715, 3721, 3722, 3717, 3723, 3719, 1992, 1988, 1989, 1993, 1987, 1994, 1990, 1991, 1995, 2916, 2920, 2915, 2917, 2918, 2921, 2922, 2919, 2923, 3384, 3380, 3381, 3379, 3385, 3382, 3386, 3383, 3387, 1784, 1780, 1781, 1782, 1785, 1779, 1786, 1787, 1783, 2964, 2968, 2963, 2965, 2970, 2966, 2969, 2967, 2971, 3300, 3304, 3301, 3299, 3302, 3305, 3306, 3307, 3303, 3412, 3416, 3413, 3414, 3417, 3411, 3418, 3419, 3415, 3844, 3848, 3849, 3846, 3843, 3845, 3850, 3847, 3851, 2980, 2984, 2979, 2981, 2982, 2985, 2986, 2983, 2987, 2548, 2552, 2547, 2550, 2549, 2553, 2554, 2551, 2555, 1912, 1908, 1907, 1913, 1910, 1909, 1914, 1911, 1915, 3636, 3640, 3635, 3638, 3637, 3641, 3642, 3639, 3643, 3012, 3016, 3011, 3013, 3014, 3017, 3018, 3015, 3019, 3428, 3432, 3427, 3429, 3434, 3430, 3433, 3435, 3431, 3476, 3480, 3478, 3475, 3481, 3482, 3477, 3479, 3483, 1976, 1972, 1971, 1974, 1977, 1973, 1978, 1975, 1979, 3668, 3672, 3669, 3674, 3670, 3667, 3673, 3675, 3671, 2804, 2808, 2803, 2805, 2806, 2809, 2810, 2807, 2811, 3496, 3492, 3494, 3493, 3497, 3491, 3498, 3499, 3495, 3684, 3688, 3683, 3686, 3685, 3690, 3689, 3691, 3687, 3732, 3736, 3734, 3733, 3737, 3731, 3738, 3739, 3735, 2004, 2008, 2005, 2003, 2010, 2006, 2009, 2011, 2007, 3524, 3528, 3523, 3526, 3529, 3525, 3530, 3527, 3531, 2932, 2936, 2931, 2933, 2934, 2937, 2938, 2935, 2939, 3320, 3316, 3317, 3318, 3315, 3321, 3322, 3323, 3319, 3752, 3748, 3747, 3753, 3750, 3749, 3754, 3755, 3751, 2020, 2024, 2019, 2021, 2026, 2025, 2022, 2023, 2027, 2996, 3000, 2995, 2997, 2998, 3001, 3002, 2999, 3003, 3864, 3860, 3859, 3862, 3865, 3866, 3861, 3863, 3867, 3780, 3784, 3781, 3779, 3786, 3782, 3785, 3787, 3783, 3444, 3448, 3445, 3443, 3450, 3449, 3446, 3447, 3451, 3880, 3876, 3875, 3877, 3878, 3881, 3882, 3879, 3883, 3028, 3032, 3027, 3029, 3030, 3033, 3034, 3031, 3035, 3044, 3048, 3043, 3045, 3046, 3049, 3050, 3047, 3051, 3508, 3512, 3507, 3510, 3513, 3509, 3514, 3511, 3515, 3908, 3912, 3909, 3907, 3914, 3910, 3913, 3915, 3911, 3704, 3700, 3699, 3705, 3702, 3701, 3706, 3703, 3707, 3540, 3544, 3539, 3542, 3545, 3541, 3546, 3547, 3543, 3976, 3972, 3974, 3971, 3978, 3977, 3973, 3975, 3979, 2036, 2040, 2035, 2037, 2038, 2041, 2042, 2039, 2043, 3560, 3556, 3558, 3555, 3562, 3561, 3557, 3559, 3563, 3768, 3764, 3763, 3766, 3769, 3765, 3770, 3767, 3771, 3896, 3892, 3891, 3898, 3893, 3894, 3897, 3899, 3895, 3800, 3796, 3797, 3795, 3802, 3798, 3801, 3803, 3799, 3812, 3816, 3811, 3813, 3818, 3814, 3817, 3815, 3819, 3924, 3928, 3925, 3930, 3926, 3929, 3923, 3931, 3927, 3060, 3064, 3059, 3061, 3062, 3065, 3066, 3063, 3067, 3940, 3944, 3939, 3945, 3942, 3941, 3946, 3943, 3947, 3992, 3988, 3987, 3989, 3993, 3990, 3994, 3991, 3995, 3572, 3576, 3573, 3578, 3571, 3577, 3574, 3575, 3579, 4004, 4008, 4003, 4006, 4009, 4005, 4010, 4007, 4011, 4040, 4036, 4037, 4041, 4035, 4042, 4038, 4039, 4043, 3832, 3828, 3829, 3830, 3833, 3827, 3834, 3835, 3831, 3960, 3956, 3955, 3961, 3958, 3957, 3962, 3959, 3963, 4024, 4020, 4019, 4022, 4025, 4021, 4026, 4023, 4027, 4052, 4056, 4053, 4051, 4058, 4054, 4057, 4059, 4055, 4068, 4072, 4067, 4069, 4074, 4073, 4070, 4071, 4075, 4084, 4088, 4083, 4085, 4086, 4089, 4090, 4087, 4091].

Figure 11:
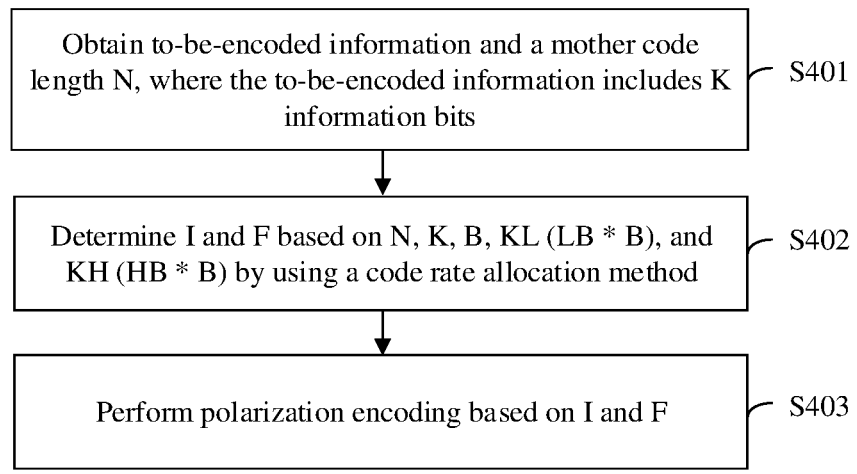
FIG. 11 is a flowchart of an embodiment of an encoding method according to this application.

FIG. 11 is a flowchart of an embodiment of an encoding method according to this application. An execution body of this embodiment may be a sending device such as a base station or a terminal. In this embodiment, description is provided by using an example in which I and F are determined based on N, K, B, LB*B, and HB*B by using a code rate allocation method. As shown in FIG. 11, the method in this embodiment may include the following steps.

S401: Obtain to-be-encoded information and a mother code length N, where the to-be-encoded information includes K information bits.

S402: Determine I and F based on N, K, B, LB*B, and HB*B by using a code rate allocation method.

One Polar code with a length of N may include two outer codes (also referred to as outer component codes) with a length of N/2 and one level of inner code on which polarization encoding is performed. A code rate of one of the two outer component codes is smaller than a code rate of the other outer component code, that is, the two outer component codes include a lower-code rate outer code and a higher-code rate outer code. A code rate of the lower-code rate outer code is $R_-$, and a code rate of the higher-code rate outer code is $R_+$. The outer component code with a length of N/2 may be further decomposed into outer component codes with a length of N/4. Other processes are performed by analogy, until an outermost layer of outer component code, namely, the outer component code whose code length is 1, is obtained through decomposition. The code rate of the outer component code whose code length is 1 may be only 0 or 1. The code rate of the outer component code whose code length is 1 is determined. If the code rate is 0, a corresponding outer component code is a frozen bit, or if the code rate is 1, a corresponding outer component code is an information bit. In this way, I and F are determined accordingly.

S402 may include the following steps.

S4021: Perform code rate allocation on two outer component codes from an $(n+1)^{th}$ level to an $n^{th}$ level based on a target code rate R and the code rate allocation condition.

A code length N of a polar code is equal to $2^n$, $n=\log_2(N)$, n+1 is a quantity of encoding/decoding levels, and in a trellis graph of the polar code, from left to right are respectively the $1^{st}$ level and the $2^{nd}$ level to the $(n+1)^{th}$ level.

$$R = \frac{K}{N},$$

and a code rate allocation condition is $2*R_x = R_{x-} + R_{x+}$. $R_x$ is a code rate of an outer component code of a current level. $R_{x-}$ is a lower code rate of code rates of two outer component codes of a next level. $R_{x+}$ is a higher code rate of the code rates of the two outer component codes of the next level. When code rate allocation is performed on the two outer component codes from the $(n+1)^{th}$ level to the $n^{th}$ level, $R_x=R$, that is, $R_x$ is a code rate of one outer component code of the $(n+1)^{th}$ level, and two outer component codes are included at the $n^{th}$ level.

S4021: Perform code rate allocation on outer component codes from an $s^{th}$ level to an $(s-1)^{th}$ level based on a code rate of the $s^{th}$ level and the code rate allocation condition, where s is greater than or equal to 2 and less than or equal to n, that is, 2≤s≤n.

It can be learned from the trellis graph of the polar code that the code rate allocation is performed on the outer component codes level by level from right to left.

S4022: When $s=\log_2(B)+1$, that is, when code rate allocation is performed on outer component codes from a $(\log_2(B)+1)^{th}$ level to a $(\log_2(B))^{th}$ level, $R_x$, $R_{x-}$, and $R_{x+}$ further satisfy a first condition while satisfying the code rate allocation condition. The first condition is any one of the following:

0≤$R_{x-}$≤$R_{x+}$≤LB;
0≤$R_{x-}$≤LB<HB≤$R_{x+}$≤1; or
HB≤$R_{x-}$≤$R_{x+}$≤1.

B is a code length of the outer component code. It may be understood that, LB is a threshold of a lower code rate, HB is a threshold of a higher code rate, and a code rate between LB and HB is an intermediate code rate. When code rate allocation is performed on the outer component codes from the $(\log_2(B)+1)^{th}$ level to the $(\log_2(B))^{th}$ level, code rates of the outer component codes of the $(\log_2(B))^{th}$ level include $R_x$ and $R_{x-}$. When 0≤$R_{x-}$≤$R_x$, ≤LB, that is, $R_{x-}$ is greater than or equal to 0 and less than or equal to LB, $R_x$, is greater than or equal to 0 and less than or equal to LB, and $R_{x-}$ is less than or equal to $R_{x+}$, when the code rate is 0, $R_{x-}$ may be equal to $R_{x+}$, so that the code rates of the outer component codes of the $(\log_2(B))^{th}$ level may be all lower code rates. When HB≤$R_{x-}$≤$R_{x+}$<1, that is, $R_{x-}$ is greater than or equal to HB and less than or equal to 1, $R_{x+}$ is greater than or equal to HB and less than or equal to 1, and $R_{x-}$ is less than or equal to $R_{x+}$, when the code rate is 1, $R_-$ may be equal to $R_+$, so that the code rates of the outer component codes of the $(\log_2(B))^{th}$ level may be all higher code rates. When 0≤$R_{x-}$ ≤LB<HB≤$R_{x+}$≤1, that is, $R_{x-}$ is greater than or equal to 0 and less than or equal to LB, $R_x$, is greater than or equal to HB and less than or equal to 1, and LB is less than HB, the code rates of the outer component codes of the $(\log_2(B))^{th}$ level may be enabled to include a higher code rate and a lower code rate, and there is no intermediate code rate, where B is a code length of the outer component code. Therefore, the information bits corresponding to the subchannel sequence numbers in I determined in this manner are distributed in the X outer component codes. The X outer component codes include the first-type outer component code (namely, lower-code rate outer component code) and the second-type outer component code (namely, higher-code rate outer component code), that is, there is no intermediate-code rate outer component code.

S4023: When code rate allocation is performed on the outer component codes from the $(\log_2(B))^{th}$ level to a $(\log_2(B)-1)^{th}$ level, and when code rate allocation is performed on an outer component code after the $(\log_2(B)-1)^{th}$ level, perform allocation level by level based on the code rate allocation condition until a code rate of an outer component code whose code length is 1 is determined.

The code rate of the outer component code whose code length is 1 may be only 0 or 1. The code rate of the outer component code whose code length is 1 is determined. If the code rate is 0, a corresponding outer component code is a frozen bit, or if the code rate is 1, a corresponding outer component code is an information bit. In this way, I and F are determined accordingly.

The following uses an example in which N=8, K=4, and R=4/8=0.5 to describe a code rate allocation process of S4021 to S4023.

Figure 12:
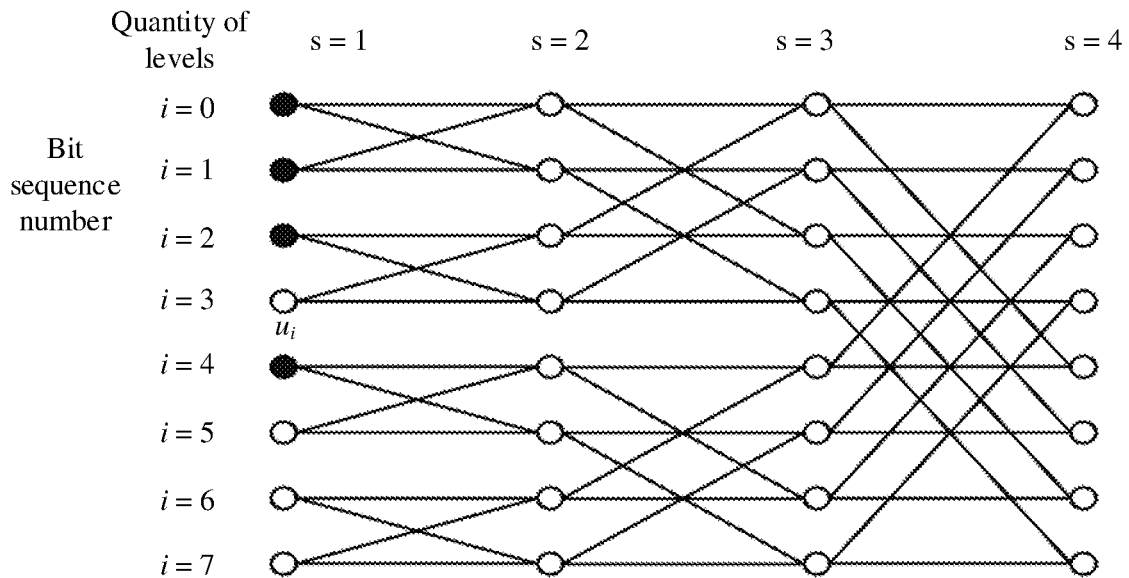
FIG. 12 is a schematic diagram of a trellis graph of a polar code with $N=8$.

FIG. 12 is a schematic diagram of a trellis graph of a polar code with N=8. N=8, K=4, R=4/8=0.5, and n=$\log_2$(N)=3. A quantity of encoding/decoding levels is n+1=4, and there are four levels in total. From left to right are respectively a $1^{st}$ level, a $2^{nd}$ level, a $3^{rd}$ level, and a $4^{th}$ level. First, code rate allocation is performed on two outer component codes from the $4^{th}$ level to the $3^{rd}$ level based on the target code rate R=0.5 and a code rate allocation condition. According to the code rate allocation condition $2*R_x=R_{x-}+R_{x+}$, where $R_x=R=0.5$, code rates of the two outer component codes of the $3^{rd}$ level may be allocated as $$R_{x-} = \frac{1}{4} \text{ and } R_{x+} = \frac{3}{4}.$$

Then, code rate allocation is performed on outer component codes from the $3^{rd}$ level to the $2^{nd}$ level respectively according to 1/4 and 3/4, where there are four outer component codes of the $2^{nd}$ level, code rates of two outer component codes corresponding to 1/4 may be allocated as $R_{x-}=0$ and $$R_{x+} = \frac{1}{4},$$

and code rates of two outer component codes corresponding to 3/4 may be allocated as $$R_{x-} = \frac{1}{2}$$

and $R_{x+}=1$. Then, code rate allocation is performed on outer component codes from the $2^{nd}$ level to the $1^{st}$ level respectively according to $$0, \frac{1}{4}, \frac{1}{2},$$

and 1, where a code length of the outer component code of the $1^{st}$ level is 1. A code rate of the outer component code whose code length is 1 is 0 or 1. The code rate of the outer component code whose code length is 1 is determined. If the code rate is 0, a corresponding outer component code is a frozen bit. If the code rate is 1, a corresponding outer component code is an information bit. In this way, I and F are determined accordingly. FIG. 12 shows a level-by-level code rate allocation process by using an example in which N=8, and a description is provided by satisfying only a code rate allocation condition. When the code length N is relatively long, when the code rate allocation is performed level by level, and when the code rate allocation is performed on outer component codes from a $(\log_2(B)+1)^{th}$ level to a $(\log_2(B))^{th}$ level, $R_x$, $R_{x-}$, and $R_{x+}$ further need to satisfy the foregoing first condition while satisfying the code rate allocation condition, so that there is no intermediate code rate in code rates of all outer component codes.

S403: Perform polarization encoding based on I and F.

After I and F are determined, values of bits on the subchannels are determined. For example, information bits are placed according to I, frozen bits are placed according to F, and polarization encoding is performed on all the determined bits, to obtain a bit sequence after the encoding.

According to the encoding method provided in this embodiment, after the to-be-encoded information including the K information bits and the mother code length N are obtained, I and F are determined based on N, K, B, LB*B, and HB*B by using a code rate allocation method. When the code rate allocation is performed on the outer component codes from the $(\log_2(B)+1)^{th}$ level to the $(\log_2(B))^{th}$ level, $R_x$, $R_{x-}$, and $R_{x+}$ further need to satisfy the first condition while satisfying the code rate allocation condition, so that the information bits corresponding to the subchannel sequence numbers in I determined in this manner are distributed in X outer component codes, and there is no intermediate-code rate outer component code in the X outer component codes. Therefore, parallel decoding may be performed on a higher-code rate outer component code and a lower-code rate outer component code when decoding is performed at a decoder, thereby reducing a decoding delay and improving a decoding throughput.

Figure 13:
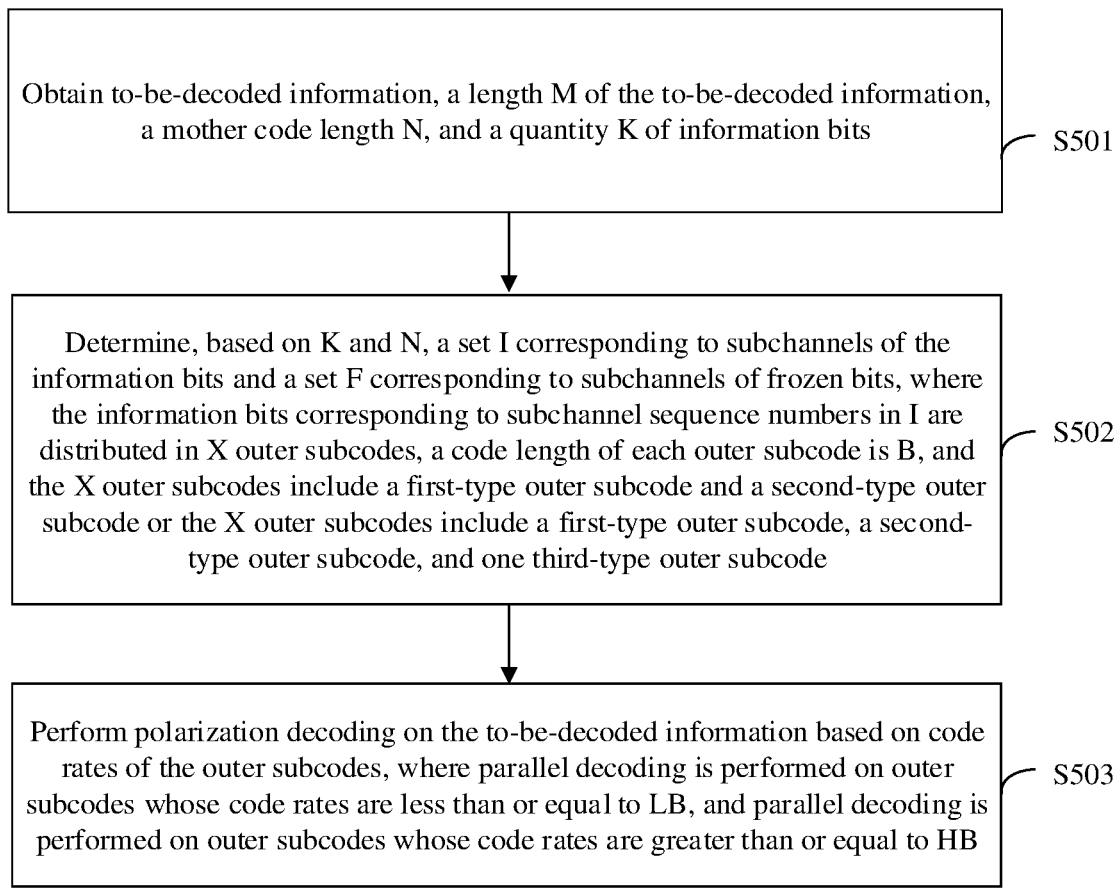
FIG. 13 is a flowchart of an embodiment of a decoding method according to this application.

FIG. 13 is a flowchart of an embodiment of a decoding method according to this application. An execution body of this embodiment may be a receiving device such as a base station or a terminal. As shown in FIG. 13, the method in this embodiment may include the following steps.

S501: Obtain to-be-decoded information, a length M of the to-be-decoded information, a mother code length N, and a quantity K of information bits.

The to-be-decoded information is polarized-encoded information of a sending device, that is, a bit sequence after encoding. After the to-be-decoded information is obtained, the length M of the to-be-decoded information may be obtained. The mother code length (that is, a length of to-be-coded information) N is equal to $2^{\lceil \log_2(M) \rceil}$, where $\lceil\ \rceil$ is an up-rounding function. A value of K may be determined based on a target code rate R and M, K=M*R, and K and M may be input values.

S502: Determine, based on K and N, a set I corresponding to subchannels of the information bits and a set F corresponding to subchannels of frozen bits, where the information bits corresponding to subchannel sequence numbers in I are distributed in X outer component codes, a code length of each outer component code is B, and the X outer component codes include a first-type outer component code and a second-type outer component code or the X outer component codes include a first-type outer component code, a second-type outer component code, and one third-type outer component code.

A code rate of the first-type outer component code is less than or equal to a first threshold LB, a code rate of the second-type outer component code is greater than or equal to a second threshold HB, and a code rate of the third-type outer component code is greater than LB and less than HB, where LB is greater than 0, HB is less than or equal to 1, and K, B, N, and X are positive integers.

The set I corresponding to the subchannels of the information bits and the set F corresponding to the subchannels of the frozen bits are determined based on K and N. A specific determining manner is similar to that of the process at the encoder. For details, refer to the specific implementation process of S102. Details are not described herein again.

S503: Perform polarization decoding on the to-be-decoded information based on the code rate of the outer component code, where parallel decoding is performed on outer component codes whose code rates are less than or equal to LB, and parallel decoding is performed on outer component codes whose code rates are greater than or equal to HB.

The information bits corresponding to the subchannel sequence numbers in I determined in S502 are distributed in the X outer component codes, and the X outer component codes include the higher-code rate outer component code and the lower-code rate outer component code or the X outer component codes include the higher-code rate outer component code, the lower-code rate outer component code, and one intermediate-code rate outer component code. Because there is no intermediate-code rate outer component code or there is only one intermediate-code rate outer component code, during decoding, parallel decoding may be performed on outer component codes whose code rates are less than or equal to LB, and parallel decoding may be performed on outer component codes whose code rates are greater than or equal to HB, thereby reducing a decoding delay and improving a decoding throughput rate.

Outer component codes on which decoding parallel can be performed include:

Rate-0 component code: bits in the outer component code are all frozen bits;

Rate-1 component code: bits in the outer component code are all information bits;

REP component code: there is only one information bit in the outer component code, and the rest are all frozen bits; and SPC component code: there is only one frozen bit in the outer component code, and the rest are all information bits.

In this embodiment, a proportion of a quantity of Rate-0 component codes, Rate-1 component codes, REP component codes, and SPC component codes may be increased in a manner of determining I in S502, so that a fast or simplified SC/SCL decoding algorithm may be used. Therefore, a delay of SC and SCL decoding is lower, a throughput is higher, and power consumption is lower.

According to the decoding method provided in this embodiment, the to-be-decoded information, the length M of the to-be-decoded information, the mother code length N, and the quantity K of information bits are obtained; the set I corresponding to the subchannels of the information bits and the set F corresponding to the subchannels of the frozen bits are determined based on K and N; and finally, polarization decoding is performed on the to-be-decoded information based on the code rate of the outer component code, where parallel decoding is performed on the outer component codes whose code rates are less than or equal to LB, and parallel decoding is performed on the outer component codes whose code rates are greater than or equal to HB. The information bits corresponding to the subchannel sequence numbers in I are distributed in the X outer component codes, and the X outer component codes include the first-type outer component code and the second-type outer component code or the X outer component codes include the first-type outer component code, the second-type outer component code, and one third-type outer component code; the code rate of the first-type outer component code is less than or equal to LB, the code rate of the second-type outer component code is greater than or equal to the second threshold HB, and the code rate of the third-type outer component code is greater than LB and less than HB, where LB and HB are used to divide thresholds of a lower-code rate outer component code, an intermediate-code rate outer component code, and a higher-code rate outer component code. Therefore, the X outer component codes include the higher-code rate outer component code and the lower-code rate outer component code, or the X outer component codes include the higher-code rate outer component code, the lower-code rate outer component code, and one intermediate-code rate outer component code. Because there is no intermediate-code rate outer component code or there is only one intermediate-code rate outer component code, parallel decoding may be performed on the higher-code rate outer component code and the lower-code rate outer component code when decoding is performed, thereby reducing a decoding delay and improving a decoding throughput.

To implement functions in the method provided in the embodiments of this application, both the receiving device and the sending device may include a hardware structure and/or a software module, and implement the foregoing functions in a form of a hardware structure, a software module, or a hardware structure plus a software module. The receiving device may be a terminal device or a network device. Similarly, the sending device may be a terminal device or a network device. Whether a function in the foregoing functions is performed by using the hardware structure, the software module, or the combination of the hardware structure and the software module depends on particular applications and design constraints of the technical solutions.

Based on a same technical concept, an embodiment of this application further provides the following communications apparatuses (including an encoding apparatus and a decoding apparatus), which may include modules or units that are one-to-one corresponding to performing methods/operations/steps/actions of the transmit end or the receive end in the foregoing method embodiments. The unit may be a hardware circuit, may be implemented by software, or may be implemented by combining a hardware circuit with software.

Figure 14:
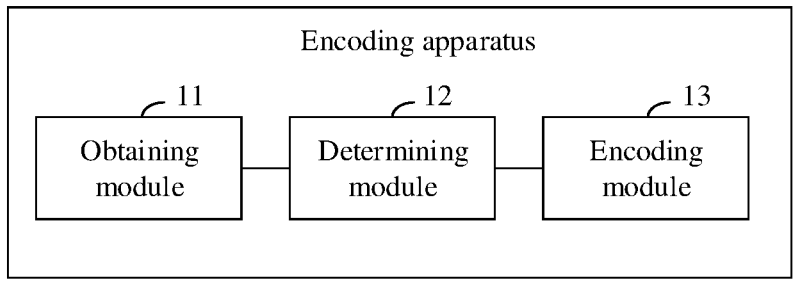
FIG. 14 is a schematic diagram of a structure of an embodiment of an encoding apparatus according to this application.

FIG. 14 is a schematic diagram of a structure of an embodiment of an encoding apparatus according to this application. As shown in FIG. 14, the apparatus in this embodiment may include an obtaining module 11, a determining module 12, and an encoding module 13.

The obtaining module 11 is configured to obtain to-be-encoded information and a mother code length N, where the to-be-encoded information includes K information bits.

The determining module 12 is configured to determine, based on K and N, a set I corresponding to subchannels of the information bits and a set F corresponding to subchannels of frozen bits, where the information bits corresponding to subchannel sequence numbers in I are distributed in X outer component codes, a code length of each outer component code is B, and the X outer component codes include a first-type outer component code and a second-type outer component code or the X outer component codes include a first-type outer component code, a second-type outer component code, and one third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, where LB is greater than 0 and less than HB, HB is less than or equal to 1, and K, B, N, and X are positive integers.

The encoding module 13 is configured to perform polarization encoding based on I and F.

Optionally, there are the following three implementations of determining I based on K and N in this embodiment.

Manner 1: I is determined based on K, a first reliability sequence Q1, and a second reliability sequence Q2.

A sum of lengths of Q1 and Q2 is a maximum mother code length $N_{max}$, and Q1 includes sequence numbers of subchannels whose reliability is less than or equal to LB*B in $$\frac{N_{max}}{B}$$

outer component codes and sequence numbers of subchannels whose reliability is greater than or equal to HB*B in the $$\frac{N_{max}}{B}$$

outer component codes.

Q2 includes sequence numbers of subchannels whose reliability is greater than LB*B and less than HB*B in the $$\frac{N_{max}}{B}$$

outer component codes.

The subchannel sequence numbers in Q1 are arranged in first order according to reliability of subchannels, where the first order is descending order or ascending order.

The subchannel sequence numbers in Q2 are arranged in the first order according to reliability of outer component codes, where subchannel sequence numbers belonging to one outer component code are consecutive in Q2 and are arranged in the first order according to reliability.

Optionally, Q1 and Q2 are determined based on Q, B, LB, and HB, where Q is a reliability sequence of subchannels corresponding to $N_{max}$, or Q1 and Q2 are preconfigured.

Optionally, LB and HB are predefined, or B, LB, and HB are indicated through indication information.

Optionally, the subchannel sequence numbers in I are at least one subchannel sequence number in Q1;
  the subchannel sequence numbers in I are at least one subchannel sequence number in Q1 and at least one subchannel sequence number in Q2; or
  the subchannel sequence numbers in I are at least one subchannel sequence number in Q1 and at least one group of subchannel sequence numbers in Q2, and a quantity of subchannel sequence numbers included in one group of subchannel sequence numbers is BM, where BM is a quantity of subchannels belonging to an intermediate code rate in one outer component code.

Further, the determining module 12 is configured to: when determining I based on K, Q1, and Q2, sequentially compare reliability of one subchannel with highest reliability in Q1 with reliability of one subchannel with highest reliability in Q2, and determine a sequence number of one subchannel currently with highest reliability in Q1 and Q2 as an element in I, until a quantity of elements in I is K; or sequentially compare reliability W1 of one subchannel with highest reliability in Q1 with average reliability W2 of BM subchannels with highest reliability in Q2, determine a sequence number of one subchannel currently with highest reliability in Q1 as an element in I when W1 is greater than W2, or determine sequence numbers of BM subchannels currently with highest reliability in Q2 as elements in I when W1 is not greater than W2, and determine a sequence number of at least one subchannel with highest reliability in Q1 as an element in I when a quantity K' of determined subchannel sequence numbers in I satisfies that K−K' is less than BM, until a quantity of elements in I is K.

Manner 2: I is determined based on K and Q3, and Q3 is determined based on N, Q1, and Q2, or Q3 is preconfigured.

Optionally, Q3 is constituted by subchannel sequence numbers less than or equal to N or subchannel sequence numbers less than N in Q1 and Q2, and the subchannel sequence numbers in Q1 and Q2 are arranged in descending order or ascending order of reliability in Q3.

Optionally, Q2 includes P subsequences $Q2_1$, $Q2_2$, ..., and $Q2_p$, P is a positive integer, and I is determined based on K, Q1, $Q2_1$, $Q2_2$, ..., and $Q2_p$.

Optionally, the subchannel sequence numbers in I are at least one subchannel sequence number in Q1;
  the subchannel sequence numbers in I are at least one subchannel sequence number in Q1 and at least one subchannel sequence number in at least one subsequence of $Q2_1$, $Q2_2$, ..., and $Q2_p$; or
  the subchannel sequence numbers in I are at least one subchannel sequence number in Q1 and at least one group of subchannel sequence numbers in at least one subsequence of $Q2_1$, $Q2_2$, ..., and $Q2_p$, and a quantity of subchannel sequence numbers included in one group of subchannel sequence numbers is Bi, where Bi=BM/P, and BM is a quantity of subchannels belonging to an intermediate code rate in one outer component code.

Further, the determining module 12 is configured to: when I is determined based on K, Q1, $Q2_1$, $Q2_2$, ..., and $Q2_p$, sequentially compare reliability of one subchannel with highest reliability in Q1 with reliability of one subchannel with highest reliability in $Q2_i$ (i=1, 2, ..., P), and determine a sequence number of one subchannel currently with highest reliability in Q1 and $Q2_i$ (i=1, 2, ..., P) as an element in I, until a quantity of elements in I is K; or sequentially compare reliability W1 of one subchannel with highest reliability in Q1 with average reliability $W2_i$ (i=1, 2, ..., P) of Bi subchannels with highest reliability in $Q2_i$ (i=1, 2, ..., P), determine a sequence number of one subchannel currently with highest reliability in Q1 as an element in I when W1 is greater than a maximum value of $W2_i$, or, determine, when W1 is not greater than a maximum value of W21, sequence numbers of Bi subchannels that are currently with highest reliability in $Q2_i$ and that are corresponding to the maximum value of $W2_i$ as elements in I, and determine a sequence number of at least one subchannel with highest reliability in Q1 as an element in I when a quantity K' of determined subchannel sequence numbers in I satisfies that K−K' is less than Bi, until a quantity of elements in I is K.

Optionally, I is determined based on K and Q3, and Q3 is determined based on N, Q1, $Q2_1$, $Q2_2$, ..., and $Q2_p$, or Q3 is preconfigured.

Optionally, Q3 is constituted by subchannel sequence numbers less than or equal to N or subchannel sequence numbers less than N in Q1, $Q2_1$, $Q2_2$, ..., and $Q2_p$, and the subchannel sequence numbers in Q1, Q2$_1$, Q2$_2$, . . . , and Q2$_p$ are arranged in descending order or ascending order of reliability in Q3.

Optionally, the elements in I are K subchannel sequence numbers with highest reliability in Q3.

Optionally, the reliability of the outer component code is reliability of a subchannel with lowest reliability or highest reliability in the outer component code;

the reliability of the outer component code is reliability of a j$^{th}$ subchannel in the outer component code, 1<j<m, and m is a total quantity of sequence numbers of subchannels included in the outer component code; or the reliability of the outer component code is average reliability of all subchannels or a sum of reliability of all subchannels in the outer component code.

Manner 3: I and F are determined based on N, K, B, LB*B, and HB*B by using a code rate allocation method.

Optionally, the code rate allocation method includes:

performing code rate allocation on the outer component codes level by level based on a target code rate R and a code rate allocation condition until a code rate of an outer component code whose code length is 1 is determined, where $$R = \frac{K}{N},$$

the code rate allocation condition is 2*R$_x$=R$_{x-}$+R$_{x+}$, R$_x$ is a code rate of an outer component code of a current level, R$_{x-}$ is a lower code rate in code rates of two outer component codes of a next level, and R$_{x+}$ is a higher code rate in the code rates of the two outer component codes of the next level; when code rate allocation is performed on two outer component codes from an (n+1)$^{th}$ level to an n$^{th}$ level, R$_x$=R, and n=log$_2$(N); and when code rate allocation is performed on outer component codes from a (log$_2$(B)+1)$^{th}$ level to a (log$_2$(B))$^{th}$ level, R$_x$ and R$_{x-}$ further satisfy a first condition while satisfying the code rate allocation condition, where the first condition is any one of the following:

0≤R$_{x-}$≤R$_{x+}$≤LB;
0≤R$_{x-}$≤LB<HB≤R$_{x+}$≤1; or
HB≤R$_{x-}$≤R$_{x+}$≤1.

The performing code rate allocation on the outer component codes level by level based on a target code rate R and a code rate allocation condition may be:

performing code rate allocation on the two outer component codes from the (n+1)$^{th}$ level to the n$^{th}$ level based on R and the code rate allocation condition; and performing code rate allocation on outer component codes from an s$^{th}$ level to an (s−1)$^{th}$ level based on a code rate of the outer component code of the s$^{th}$ level and the code rate allocation condition until a code rate of an outer component code whose code length is 1 is determined, where s is greater than or equal to 2 and less than or equal to n.

Further, I and F are determined based on a determined code rate of an outer component code whose code length is 1.

The apparatus in this embodiment may be used to execute the technical solutions of the method embodiment shown in FIG. 4. The implementation principles and technical effects are similar, and are not further described herein.

Figure 15:
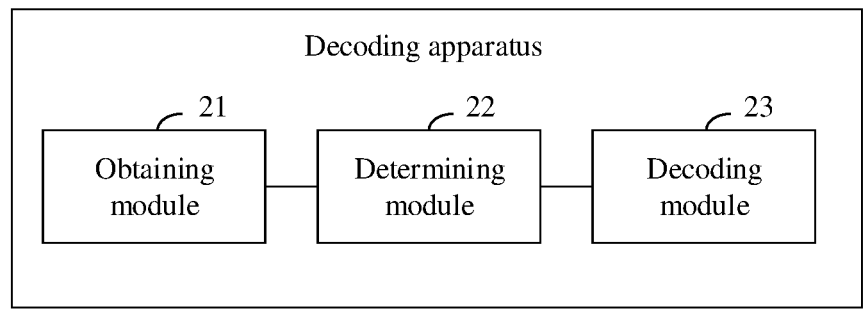
FIG. 15 is a schematic diagram of a structure of an embodiment of a decoding apparatus according to this application.

FIG. 15 is a schematic diagram of a structure of an embodiment of a decoding apparatus according to this application. As shown in FIG. 15, the apparatus in this embodiment may include an obtaining module 21, a determining module 22, and a decoding module 23.

The obtaining module 21 is configured to obtain to-be-decoded information, a length M of the to-be-decoded information, a mother code length N, and a quantity K of information bits.

The determining module 22 is configured to determine, based on K and N, a set I corresponding to subchannels of the information bits and a set F corresponding to subchannels of frozen bits, where the information bits corresponding to subchannel sequence numbers in I are distributed in X outer component codes, a code length of each outer component code is B, and the X outer component codes include a first-type outer component code and a second-type outer component code or the X outer component codes include a first-type outer component code, a second-type outer component code, and one third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, where LB is greater than 0 and less than HB, HB is less than or equal to 1, and K, B, N, and X are positive integers.

The decoding module 23 is configured to perform polarization decoding on the to-be-decoded information based on the code rate of the outer component code, where parallel decoding is performed on outer component codes whose code rates are less than or equal to LB, and parallel decoding is performed on outer component codes whose code rates are greater than or equal to HB.

Optionally, there are the following three implementations of determining I based on K and N in this embodiment.

Manner 1: I is determined based on K, a first reliability sequence Q1, and a second reliability sequence Q2.

A sum of lengths of Q1 and Q2 is a maximum mother code length N$_{max}$, and Q1 includes sequence numbers of subchannels whose reliability is less than or equal to LB*B in $$\frac{N_{max}}{B}$$

outer component codes and sequence numbers of subchannels whose reliability is greater than or equal to HB*B in the $$\frac{N_{max}}{B}$$

outer component codes.

Q2 includes sequence numbers of subchannels whose reliability is greater than LB*B and less than HB*B in the $$\frac{N_{max}}{B}$$

outer component codes.

The subchannel sequence numbers in Q1 are arranged in first order according to reliability of subchannels, where the first order is descending order or ascending order.

The subchannel sequence numbers in Q2 are arranged in the first order according to reliability of outer component codes, where subchannel sequence numbers belonging to one outer component code are consecutive in Q2 and are arranged in the first order according to reliability.

Optionally, Q1 and Q2 are determined based on Q, B, LB, and HB, where Q is a reliability sequence of subchannels corresponding to $N_{max}$, or Q1 and Q2 are preconfigured.

Optionally, LB and HB are predefined, or B, LB, and HB are indicated through indication information.

Optionally, the subchannel sequence numbers in I are at least one subchannel sequence number in Q1;
  the subchannel sequence numbers in I are at least one subchannel sequence number in Q1 and at least one subchannel sequence number in Q2; or
  the subchannel sequence numbers in I are at least one subchannel sequence number in Q1 and at least one group of subchannel sequence numbers in Q2, and a quantity of subchannel sequence numbers included in one group of subchannel sequence numbers is BM, where BM is a quantity of subchannels belonging to an intermediate code rate in one outer component code.

Further, the determining module 12 is configured to: when determining I based on K, Q1, and Q2, sequentially compare reliability of one subchannel with highest reliability in Q1 with reliability of one subchannel with highest reliability in Q2, and determine a sequence number of one subchannel currently with highest reliability in Q1 and Q2 as an element in I, until a quantity of elements in I is K; or
  sequentially compare reliability W1 of one subchannel with highest reliability in Q1 with average reliability W2 of BM subchannels with highest reliability in Q2, determine a sequence number of one subchannel currently with highest reliability in Q1 as an element in I when W1 is greater than W2, or determine sequence numbers of BM subchannels currently with highest reliability in Q2 as elements in I when W1 is not greater than W2, and determine a sequence number of at least one subchannel with highest reliability in Q1 as an element in I when a quantity K' of determined subchannel sequence numbers in I satisfies that K–K' is less than BM, until a quantity of elements in I is K.

Manner 2: I is determined based on K and Q3, and Q3 is determined based on N, Q1, and Q2, or Q3 is preconfigured.

Optionally, Q3 is constituted by subchannel sequence numbers less than or equal to N or subchannel sequence numbers less than N in Q1 and Q2, and the subchannel sequence numbers in Q1 and Q2 are arranged in descending order or ascending order of reliability in Q3.

Optionally, Q2 includes P subsequences $Q2_1, Q2_2, \ldots,$ and $Q2_p$, P is a positive integer, and I is determined based on K, Q1, $Q2_1, Q2_2, \ldots,$ and $Q2_p$.

Optionally, the subchannel sequence numbers in I are at least one subchannel sequence number in Q1;
  the subchannel sequence numbers in I are at least one subchannel sequence number in Q1 and at least one subchannel sequence number in at least one subsequence of $Q2_1, Q2_2, \ldots,$ and $Q2_p$; or
  the subchannel sequence numbers in I are at least one subchannel sequence number in Q1 and at least one group of subchannel sequence numbers in at least one subsequence of $Q2_1, Q2_2, \ldots,$ and $Q2_p$, and a quantity of subchannel sequence numbers included in one group of subchannel sequence numbers is Bi, where Bi=BM/P, and BM is a quantity of subchannels belonging to an intermediate code rate in one outer component code.

Further, the determining module 12 is configured to: when I is determined based on K, Q1, $Q2_1, Q2_2, \ldots,$ and $Q2_p$, sequentially compare reliability of one subchannel with highest reliability in Q1 with reliability of one subchannel with highest reliability in $Q2_i$ (i=1, 2, ..., P), and determine a sequence number of one subchannel currently with highest reliability in Q1 and $Q2_i$ (i=1, 2, ..., P) as an element in I, until a quantity of elements in I is K; or sequentially compare reliability W1 of one subchannel with highest reliability in Q1 with average reliability W2i (i=1, 2, ..., P) of Bi subchannels with highest reliability in $Q2_i$ (i=1, 2, ..., P), determine a sequence number of one subchannel currently with highest reliability in Q1 as an element in I when W1 is greater than a maximum value of $W2_1$, or, determine, when W1 is not greater than a maximum value of W21, sequence numbers of Bi subchannels that are currently with highest reliability in $Q2_1$ and that are corresponding to the maximum value of $W2_1$ as elements in I, and determine a sequence number of at least one subchannel with highest reliability in Q1 as an element in I when a quantity K' of determined subchannel sequence numbers in I satisfies that K–K' is less than Bi, until a quantity of elements in I is K.

Optionally, I is determined based on K and Q3, and Q3 is determined based on N, Q1, $Q2_1, Q2_2, \ldots,$ and $Q2_p$, or Q3 is preconfigured.

Optionally, Q3 is constituted by subchannel sequence numbers less than or equal to N or subchannel sequence numbers less than N in Q1, $Q2_1, Q2_2, \ldots,$ and $Q2_p$, and the subchannel sequence numbers in Q1, $Q2_1, Q2_2, \ldots,$ and $Q2_p$ are arranged in descending order or ascending order of reliability in Q3.

Optionally, the elements in I are K subchannel sequence numbers with highest reliability in Q3.

Optionally, the reliability of the outer component code is reliability of a subchannel with lowest reliability or highest reliability in the outer component code;
  the reliability of the outer component code is reliability of a $j^{th}$ subchannel in the outer component code, 1<j<m, and m is a total quantity of sequence numbers of subchannels included in the outer component code; or
  the reliability of the outer component code is average reliability of all subchannels or a sum of reliability of all subchannels in the outer component code.

Manner 3: I and F are determined based on N, K, B, LB*B, and HB*B by using a code rate allocation method.

Optionally, the code rate allocation method includes:
  performing code rate allocation on the outer component codes level by level based on a target code rate R and a code rate allocation condition until a code rate of an outer component code whose code length is 1 is determined, where $$R = \frac{K}{N},$$

the code rate allocation condition is $2*R_x = R_{x-} + R_{x+}$, $R_x$ is a code rate of an outer component code of a current level, $R_{x-}$ is a lower code rate in code rates of two outer component codes of a next level, and $R_{x+}$ is a higher code rate in the code rates of the two outer component codes of the next level; when code rate allocation is performed on two outer component codes from an $(n+1)^{th}$ level to an $n^{th}$ level, $R_x=R$, and $n=\log_2(N)$; and
  when code rate allocation is performed on outer component codes from a $(\log_2(B)+1)^{th}$ level to a $(\log_2(B))^{th}$ level, $R_x$ and $R_{x-}$ further satisfy a first condition while satisfying the code rate allocation condition, where the first condition is any one of the following:

$0 \leq R_{x-} \leq R_{x+} \leq LB$;
$0 \leq R_{x-} \leq LB < HB \leq R_{x+} \leq 1$; or
$HB \leq R_{x-} \leq R_{x+} \leq 1$.

The performing code rate allocation on the outer component codes level by level based on a target code rate R and a code rate allocation condition may be:

performing code rate allocation on the two outer component codes from the $(n+1)^{th}$ level to the $n^{th}$ level based on R and the code rate allocation condition; and performing code rate allocation on outer component codes from an $s^{th}$ level to an $(s-1)^{th}$ level based on a code rate of the outer component code of the $s^{th}$ level and the code rate allocation condition until a code rate of an outer component code whose code length is 1 is determined, where s is greater than or equal to 2 and less than or equal to n.

Further, I and F are determined based on a determined code rate of an outer component code whose code length is 1.

The apparatus in this embodiment may be configured to perform the technical solutions in the method embodiment shown in FIG. 13. An implementation principle and technical effects of the apparatus are similar to those of the method embodiment. Details are not described herein again.

Figure 16:
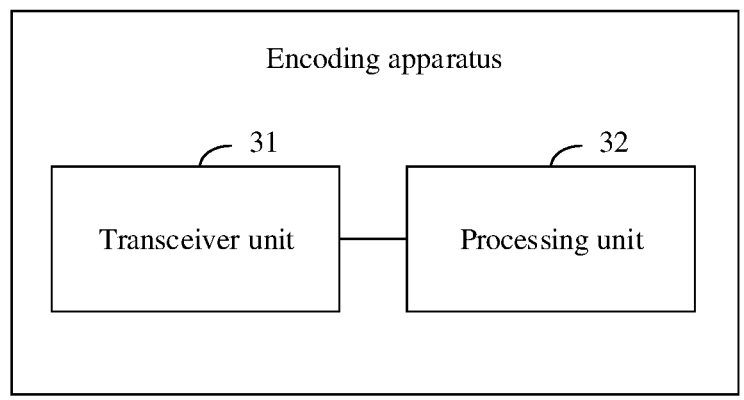
FIG. 16 is a schematic diagram of a structure of an encoding apparatus according to this application.

FIG. 16 is a schematic diagram of a structure of an encoding apparatus according to this application. As shown in FIG. 16, the encoding apparatus includes a transceiver unit 31 and a processing unit 32.

The transceiver unit 31 is configured to obtain to-be-encoded information and a mother code length N, where the to-be-encoded information includes K information bits.

The processing unit 32 is configured to implement steps and/or procedures in the encoding method shown in FIG. 4. For details, refer to related descriptions in the foregoing method embodiments.

For example, the processing unit 32 is configured to determine, based on K and N, a set I corresponding to subchannels of the information bits and a set F corresponding to subchannels of frozen bits, where the information bits corresponding to subchannel sequence numbers in I are distributed in X outer component codes, a code length of each outer component code is B, and the X outer component codes include a first-type outer component code and a second-type outer component code or the X outer component codes include a first-type outer component code, a second-type outer component code, and one third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, where LB is greater than 0 and less than HB, HB is less than or equal to 1, and K, B, N, and X are positive integers.

The processing unit 32 is further configured to perform polarization encoding based on I and F.

Optionally, the transceiver unit 31 is further configured to send a bit sequence after the encoding.

Figure 17:
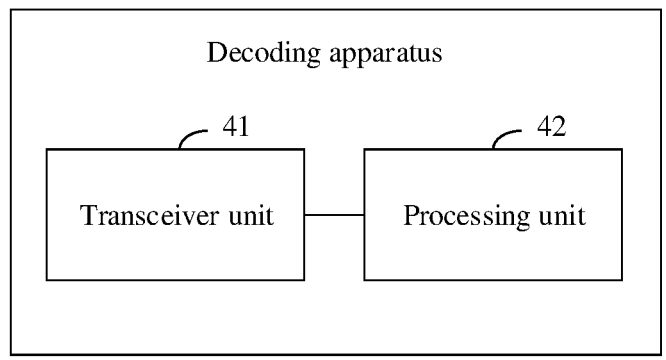
FIG. 17 is a schematic diagram of a structure of a decoding apparatus according to this application.

FIG. 17 is a schematic diagram of a structure of a decoding apparatus according to this application. As shown in FIG. 17, the decoding apparatus includes a transceiver unit 41 and a processing unit 42.

The transceiver unit 41 is configured to obtain to-be-decoded information, a length M of the to-be-decoded information, a mother code length N, and a quantity K of information bits.

The processing unit 42 is configured to implement steps and/or procedures in the decoding method shown in FIG. 13. For details, refer to related descriptions in the foregoing method embodiments.

For example, the processing unit 42 is configured to determine, based on K and N, a set I corresponding to subchannels of the information bits and a set F corresponding to subchannels of frozen bits, where the information bits corresponding to subchannel sequence numbers in I are distributed in X outer component codes, a code length of each outer component code is B, and the X outer component codes include a first-type outer component code and a second-type outer component code or the X outer component codes include a first-type outer component code, a second-type outer component code, and one third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, where LB is greater than 0 and less than HB, HB is less than or equal to 1, and K, B, N, and X are positive integers.

The processing unit 42 is further configured to perform polarization decoding on the to-be-decoded information based on the code rate of the outer component code, where parallel decoding is performed on outer component codes whose code rates are less than or equal to LB, and parallel decoding is performed on outer component codes whose code rates are greater than or equal to HB.

Optionally, the transceiver unit 41 is further configured to send information after the decoding.

Figure 18:
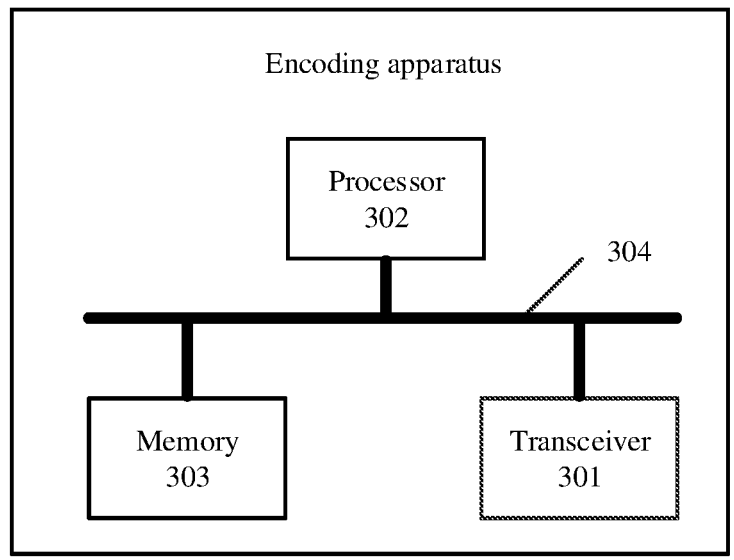
FIG. 18 is a schematic diagram of a structure of an encoding apparatus according to this application.

FIG. 18 is a schematic diagram of a structure of an encoding apparatus according to this application. The encoding apparatus includes:

a transceiver 301, configured to obtain to-be-encoded information; and at least one processor 302, configured to invoke and execute program instructions in a memory, to implement steps in the encoding method shown in FIG. 4. For details, refer to related descriptions in the foregoing method embodiments.

Optionally, the encoding apparatus further includes a memory 303. The memory 303 is configured to store the program instructions. The memory may be alternatively a flash (flash memory).

Optionally, the memory 303 may be independent, or may be integrated with the processor 302.

When the memory 303 is a component independent of the processor 302, the encoding apparatus may further include:

a bus 304, configured to connect the memory 303 and the processor 302. The bus is indicated by a bold line in FIG. 18, and a connection manner between other components is merely illustrative and is not limited by reference. The bus may be classified into an address bus, a data bus, a control bus, and the like. For ease of representation, only one thick line is used to represent the bus in FIG. 18, but this does not mean that there is only one bus or only one type of bus.

The encoding apparatus may be configured to perform steps and/or procedures corresponding to the sending device in the foregoing method embodiments. The encoding apparatus may be a terminal or a network device, or may be an apparatus in the terminal or the network device, or an apparatus that can be used in matching with the terminal or the network device. The encoding apparatus may be a chip system. In this embodiment of this application, the chip system may include a chip, or may include the chip and another discrete component.

Figure 19:
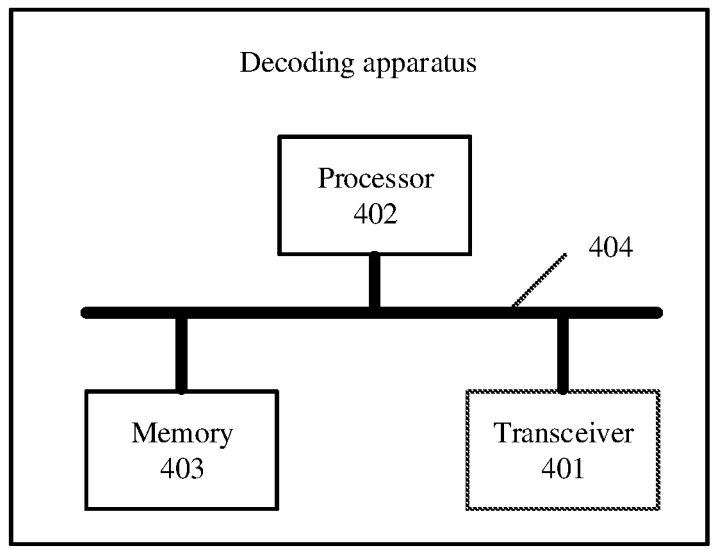
FIG. 19 is a schematic diagram of a structure of a decoding apparatus according to this application.

FIG. 19 is a schematic diagram of a structure of a decoding apparatus according to this application. The decoding apparatus includes:
- a transceiver 401, configured to obtain to-be-decoded information; and
- at least one processor 402, configured to invoke and execute program instructions in a memory, to implement steps in the decoding method shown in FIG. 13. For details, refer to related descriptions in the foregoing method embodiments.

Optionally, the encoding apparatus further includes a memory 403. The memory 403 is configured to store the program instructions. The memory may be alternatively a flash (flash memory).

Optionally, the memory 403 may be independent, or may be integrated with the processor 402.

When the memory 403 is a component independent of the processor 402, the decoding apparatus may further include:
- a bus 404, configured to connect the memory 403 and the processor 402. The bus is indicated by a bold line in FIG. 19, and a connection manner between other components is merely illustrative and is not limited by reference. The bus may be classified into an address bus, a data bus, a control bus, and the like. For ease of representation, only one thick line is used to represent the bus in in FIG. 19, but this does not mean that there is only one bus or only one type of bus.

The decoding apparatus may be configured to perform steps and/or procedures corresponding to the receiving device in the foregoing method embodiments. The decoding apparatus may be a terminal or a network device, or may be an apparatus in the terminal or the network device, or an apparatus that can be used in matching with the terminal or the network device. The decoding apparatus may be a chip system. In this embodiment of this application, the chip system may include a chip, or may include the chip and another discrete component.

The processor in this application (for example, the processor 302 in FIG. 18 or the processor 402 in FIG. 19) may be one or more central processing units (Central Processing Units, CPUs). When the processor 302 or the processor 402 is one CPU, the CPU may be a single-core CPU, or may be a multi-core CPU. The processor 402 may be a general-purpose processor, a digital signal processor, an application-specific integrated circuit, a field programmable gate array or another programmable logic device, a discrete gate or transistor logic device, or a discrete hardware component, and may implement or execute the methods, steps, and logical block diagrams disclosed in embodiments of this application. The general-purpose processor may be a microprocessor, any conventional processor, or the like. The steps of the method disclosed with reference to embodiments of this application may be directly performed by a hardware processor, or may be performed by a combination of hardware and software modules in the processor.

The memory in this application (for example, the memory 303 in FIG. 18 or the memory 403 in FIG. 19) may include but is not limited to a nonvolatile memory such as a hard disk drive (HDD) or a solid-state drive (SSD), a random access memory (RAM), an erasable programmable read-only memory (EPROM), a read-only memory (ROM) or a compact disc read-only memory (CD-ROM), or the like. The memory is any other medium that can carry or store expected program code in a form of an instruction structure or a data structure and that can be accessed by a computer, but is not limited thereto. The memory in this embodiment of this application may alternatively be a circuit or any other apparatus that can implement a storage function, and is configured to store program instructions and/or data.

Figure 20:
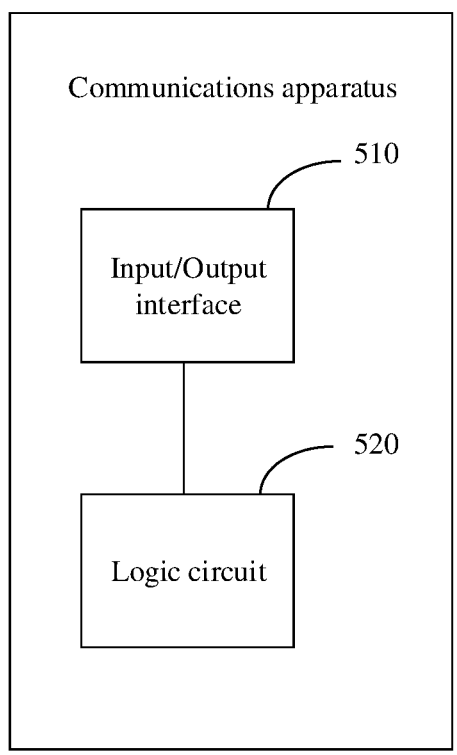
FIG. 20 is a schematic diagram of a structure of a communications apparatus according to this application.

FIG. 20 is a schematic diagram of a structure of a communications apparatus according to this application. Refer to FIG. 20. An embodiment of this application further provides a communications apparatus, which may be configured to implement a function of the sending device or the receiving device in the foregoing methods. The communications apparatus may be a communications apparatus or a chip in the communications apparatus. The communications apparatus includes:
- at least one input/output interface 510 and a logic circuit 520. The input/output interface 510 may be an input/output circuit. The logic circuit 520 may be a signal processor, a chip, or another integrated circuit that can implement the method in this application.

The at least one input/output interface 510 is configured to input or output a signal or data. For example, when the communications apparatus is a transmit-end device or is used by a transmit-end device, the input/output interface 510 is configured to obtain to-be-encoded information, and the input/output interface 510 is further configured to output a bit sequence after encoding.

For example, when the communications apparatus is a receive-end device or is used by a receive-end device, the input/output interface 510 is configured to obtain to-be-decoded information, and the input/output interface 510 is further configured to output information after decoding.

The logic circuit 520 is configured to perform some or all steps of any method provided in the embodiments of this application. The logic circuit may implement functions implemented by the processing unit 32 in the apparatus shown in FIG. 16, the processing unit 42 in the apparatus shown in FIG. 17, the processor 302 in the apparatus shown in FIG. 18, and the processor 402 in the apparatus shown in FIG. 19. For example, when being a transmit-end device or being used for a transmit-end device, the communications apparatus is configured to perform various steps in the foregoing encoding method embodiments. For example, the logic circuit 520 is configured to determine, based on K and N, a set I corresponding to subchannels of the information bits and a set F corresponding to subchannels of frozen bits, where the information bits corresponding to subchannel sequence numbers in I are distributed in X outer component codes, a code length of each outer component code is B, and the X outer component codes include a first-type outer component code and a second-type outer component code or the X outer component codes include a first-type outer component code, a second-type outer component code, and one third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, where LB is greater than 0 and less than HB, HB is less than or equal to 1, and K, B, N, and X are positive integers; and perform polarization encoding based on I and F.

For example, when being a receive-end device or is used for a receive-end device, the communications apparatus is configured to perform various steps in the foregoing decoding method embodiments. For example, the logic circuit 520 is configured to determine, based on K and N, a set I corresponding to subchannels of the information bits and a set F corresponding to subchannels of frozen bits, where the information bits corresponding to subchannel sequence numbers in I are distributed in X outer component codes, a code length of each outer component code is B, and the X outer component codes include a first-type outer component code and a second-type outer component code or the X outer component codes include a first-type outer component code, a second-type outer component code, and a third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, where LB is greater than 0 and less than HB, HB is less than or equal to 1, and K, B, N, and X are positive integers; and perform polarization encoding on the to-be-decoded information based on the code rate of the outer component code, where parallel decoding is performed on outer component codes whose code rates are less than or equal to LB, and parallel decoding is performed on outer component codes whose code rates are greater than or equal to HB.

This application further provides a computer-readable storage medium. The computer-readable storage medium stores executable instructions. When at least one processor of an encoding apparatus executes the executable instructions, the encoding apparatus performs the encoding method provided in the various implementations described above.

This application further provides a program product. The program product includes executable instructions. The executable instructions are stored in a computer-readable storage medium. At least one processor of the encoding apparatus may read the executable instructions from the computer-readable storage medium. The at least one processor executes the executable instructions, to enable an encoding apparatus to perform the encoding method provided in the various implementations described above.

This application further provides a computer-readable storage medium. The computer-readable storage medium stores executable instructions. When at least one processor of a decoding apparatus executes the executable instructions, the decoding apparatus performs the decoding method provided in the various implementations described above.

This application further provides a program product. The program product includes executable instructions. The executable instructions are stored in a computer-readable storage medium. The at least one processor of the decoding apparatus may read the executable instructions from the computer-readable storage medium. The at least one processor executes the executable instructions, to enable the decoding apparatus to perform the decoding method provided in the various implementations described above.

Persons of ordinary skill in the art may understand that all or some of the steps of the method embodiments may be implemented by a program instructing related hardware. The program may be stored in a computer-readable storage medium. When the program is run, the steps of the method embodiments are performed. The foregoing storage medium includes any medium that can store program code, such as a ROM, a RAM, a magnetic disc, or an optical disc.

The invention claimed is:

1. An encoding method, comprising:
obtaining, by an encoding apparatus, to-be-encoded information and a mother code length N, wherein the to-be-encoded information comprises K information bits;
determining, by the encoding apparatus based on K and N, a set I corresponding to subchannels of the K information bits and a set F corresponding to subchannels of frozen bits, wherein information bits corresponding to subchannel sequence numbers in the set I are distributed in X outer component codes, a code length of each outer component code is B, and the X outer component codes comprise a first-type outer component code and a second-type outer component code or the X outer component codes comprise a first-type outer component code, a second-type outer component code, and one third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, wherein LB is greater than 0 and less than HB, HB is less than or equal to 1, and K, B, N, and X are positive integers;
performing, by the encoding apparatus, polarization encoding based on the set I and the set F to generate encoded information; and
outputting, by the encoding apparatus, the encoded information.

2. The encoding method according to claim 1, wherein
the set I is further based on a first reliability sequence Q1, and a second reliability sequence Q2;
a sum of lengths of Q1 and Q2 is a maximum mother code length supported by a system $N_{max}$, and Q1 comprises sequence numbers of subchannels having a reliability that is less than or equal to LB*B in $$\frac{N_{max}}{B}$$

outer component codes and sequence numbers of subchannels having a reliability that is greater than or equal to HB*B in the $$\frac{N_{max}}{B}$$

outer component codes;
Q2 comprises sequence numbers of subchannels having a reliability that is greater than LB B and less than HB*B in the $$\frac{N_{max}}{B}$$

outer component codes;
the subchannel sequence numbers in Q1 are arranged in a first order according to reliability of subchannels, wherein the first order is in descending order or ascending order; and
the subchannel sequence numbers in Q2 are arranged in the first order according to reliability of outer component codes, wherein subchannel sequence numbers belonging to one outer component code are consecutive in Q2 and are arranged in the first order according to reliability.

3. The encoding method according to claim 2, wherein
Q1 and Q2 are determined based on Q, B, LB, and HB, wherein Q is a reliability sequence of subchannels corresponding to $N_{max}$; or
Q1 and Q2 are preconfigured.

4. The encoding method according to claim 2, wherein
the subchannel sequence numbers in the set I include at least one subchannel sequence number in Q1;
the subchannel sequence numbers in the set I include at least one subchannel sequence number in Q1 and at least one subchannel sequence number in Q2; or
the subchannel sequence numbers in the set I include at least one subchannel sequence number in Q1 and at least one group of subchannel sequence numbers in Q2, and a quantity of subchannel sequence numbers included in one group of subchannel sequence numbers is BM, wherein BM is a quantity of subchannels with an intermediate code rate in one outer component code.

5. The encoding method according to claim 2, wherein
the set I is determined based on K and Q3, and Q3 is determined based on N, Q1, and Q2, or Q3 is preconfigured; or
Q2 comprises P subsequences $Q2_1, Q2_2, \ldots,$ and $Q2_p$, P is a positive integer, and the set I is determined based on K, Q1, $Q2_1, Q2_2, \ldots,$ and $Q2_p$.

6. The encoding method according to claim 2, wherein
a reliability of each outer component code is the reliability of a subchannel with a lowest reliability or a highest reliability in a corresponding outer component code;
the reliability of each outer component code is a reliability of a $j^{th}$ subchannel in a corresponding outer component code, $1 \leq j \leq m$, and m is a total quantity of sequence numbers of subchannels comprised in the corresponding outer component code; or
the reliability of each outer component code is an average reliability of all subchannels or a sum of the reliabilities of all subchannels in a corresponding outer component code.

7. The encoding method according to claim 1, wherein the set I and the set F are determined based on N, K, B, LB*B, and HB*B by using a code rate allocation method.

8. The encoding method according to claim 1, wherein the encoded information is output to a receiving device configured to receive and decode the encoded information.

9. An encoding apparatus, comprising:
a processor; and
a memory having instruction stored thereon that, when executed by the processor, cause the encoding apparatus to:
obtain to-be-encoded information and a mother code length N, wherein the to-be-encoded information comprises K information bits;
determine, based on K and N, a set I corresponding to subchannels of the K information bits and a set F corresponding to subchannels of frozen bits, wherein information bits corresponding to subchannel sequence numbers in the set I are distributed in X outer component codes, a code length of each outer component code is B, and the X outer component codes comprise a first-type outer component code and a second-type outer component code or the X outer component codes comprise a first-type outer component code, a second-type outer component code, and one third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, wherein LB is greater than 0 and less than HB, HB is less than or equal to 1, and K, B, N, and X are positive integers;
perform polarization encoding on the set I and the set F to generate encoded information; and
output the encoded information.

10. The encoding apparatus according to claim 9, wherein
the set I is further based on a first reliability sequence Q1, and a second reliability sequence Q2;
a sum of lengths of Q1 and Q2 is a maximum mother code length supported by a system $N_{max}$, and Q1 comprises sequence numbers of subchannels having a reliability that is less than or equal to LB*B in $$\frac{N_{max}}{B}$$

outer component codes and sequence numbers of subchannels having a reliability that is greater than or equal to HB*B in the $$\frac{N_{max}}{B}$$

outer component codes;
Q2 comprises sequence numbers of subchannels having a reliability that is greater than LB*B and less than HB*B in the $$\frac{N_{max}}{B}$$

outer component codes;
the subchannel sequence numbers in Q1 are arranged in a first order according to reliability of subchannels, wherein the first order is in descending order or ascending order; and
the subchannel sequence numbers in Q2 are arranged in the first order according to reliability of outer component codes, wherein subchannel sequence numbers belonging to one outer component code are consecutive in Q2 and are arranged in the first order according to reliability.

11. The encoding apparatus according to claim 10, wherein
Q1 and Q2 are determined based on Q, B, LB, and HB, wherein Q is a reliability sequence of subchannels corresponding to $N_{max}$; or
Q1 and Q2 are preconfigured.

12. The encoding apparatus according to claim 10, wherein
the subchannel sequence numbers in the set I include at least one subchannel sequence number in Q1;
the subchannel sequence numbers in the set I include at least one subchannel sequence number in Q1 and at least one subchannel sequence number in Q2; or
the subchannel sequence numbers in the set I include at least one subchannel sequence number in Q1 and at least one group of subchannel sequence numbers in Q2, and a quantity of subchannel sequence numbers included in one group of subchannel sequence numbers is BM, wherein BM is a quantity of subchannels with an intermediate code rate in one outer component code.

13. The encoding apparatus according to claim 10, wherein the set I is determined based on K and Q3, and Q3 is determined based on N, Q1, and Q2, or Q3 is preconfigured; or Q2 comprises P subsequences $Q2_1, Q2_2, \ldots,$ and $Q2_p$, P is a positive integer, and the set I is determined based on K, Q1, $Q2_1, Q2_2, \ldots,$ and $Q2_p$.

14. The encoding apparatus according to claim 10, wherein a reliability of each outer component code is the reliability of a subchannel with a lowest reliability or a highest reliability in a corresponding outer component code;

the reliability of each outer component code is a reliability of a $j^{th}$ subchannel in a corresponding outer component code, $1 \leq j \leq m$, and m is a total quantity of sequence numbers of subchannels comprised in the corresponding outer component code; or the reliability of each outer component code is an average reliability of all subchannels or a sum of the reliabilities of all subchannels in a corresponding outer component code.

15. The encoding apparatus according to claim 9, wherein the set I and the set F are determined based on N, K, B, LB*B, and HB*B by using a code rate allocation method.

16. A non-transitory computer-readable storage medium, having instructions stored thereon that, when run on a computer, the executable instructions cause the computer to:

obtain to-be-encoded information and a mother code length N, wherein the to-be-encoded information comprises K information bits;

determine, based on K and N, a set I corresponding to subchannels of the K information bits and a set F corresponding to subchannels of frozen bits, wherein information bits corresponding to subchannel sequence numbers in the set I are distributed in X outer component codes, a code length of each outer component code is B, and the X outer component codes comprise a first-type outer component code and a second-type outer component code or the X outer component codes comprise a first-type outer component code, a second-type outer component code, and one third-type outer component code; and a code rate of the first-type outer component code is less than or equal to a first threshold LB, a code rate of the second-type outer component code is greater than or equal to a second threshold HB, and a code rate of the third-type outer component code is greater than LB and less than HB, wherein LB is greater than 0 and less than HB, HB is less than or equal to 1, and K, B, N, and X are positive integers;

perform polarization encoding on the set I and the set F to generate encoded information; and output the encoded information.

17. The non-transitory computer-readable storage medium according to claim 16, wherein the set I is further based on a first reliability sequence Q1, and a second reliability sequence Q2;

a sum of lengths of Q1 and Q2 is a maximum mother code length supported by a system $N_{max}$, and Q1 comprises sequence numbers of subchannels having a reliability that is less than or equal to LB*B in $$\frac{N_{max}}{B}$$

outer component codes and sequence numbers of subchannels having a reliability that is greater than or equal to HB*B in the $$\frac{N_{max}}{B}$$

outer component codes;

Q2 comprises sequence numbers of subchannels having a reliability that is greater than LB*B and less than HB*B in the $$\frac{N_{max}}{B}$$

outer component codes;

the subchannel sequence numbers in Q1 are arranged in a first order according to reliability of subchannels, wherein the first order is in descending order or ascending order; and the subchannel sequence numbers in Q2 are arranged in the first order according to reliability of outer component codes, wherein subchannel sequence numbers belonging to one outer component code are consecutive in Q2 and are arranged in the first order according to reliability.

18. The non-transitory computer-readable storage medium according to claim 17, wherein Q1 and Q2 are determined based on Q, B, LB, and HB, wherein Q is a reliability sequence of subchannels corresponding to $N_{max}$; or Q1 and Q2 are preconfigured.

19. The non-transitory computer-readable storage medium according to claim 17, wherein the subchannel sequence numbers in the set I include at least one subchannel sequence number in Q1;

the subchannel sequence numbers in the set I include at least one subchannel sequence number in Q1 and at least one subchannel sequence number in Q2; or the subchannel sequence numbers in the set I include at least one subchannel sequence number in Q1 and at least one group of subchannel sequence numbers in Q2, and a quantity of subchannel sequence numbers included in one group of subchannel sequence numbers is BM, wherein BM is a quantity of subchannels with an intermediate code rate in one outer component code.

20. The non-transitory computer-readable storage medium according to claim 17, wherein the set I is determined based on K and Q3, and Q3 is determined based on N, Q1, and Q2, or Q3 is preconfigured; or Q2 comprises P subsequences $Q2_1, Q2_2, \ldots,$ and $Q2_p$, P is a positive integer, and the set I is determined based on K, Q1, $Q2_1, Q2_2, \ldots,$ and $Q2_p$.

* * * * *